(12) United States Patent
Shimizu et al.

(10) Patent No.: US 6,340,611 B1
(45) Date of Patent: Jan. 22, 2002

(54) NONVOLATILE SEMICONDUCTOR MEMORY DEVICE

(75) Inventors: Kazuhiro Shimizu; Seiichi Aritome; Toshiharu Watanabe, all of Yokohama; Kazuhito Narita, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/628,278

(22) Filed: Jul. 28, 2000

Related U.S. Application Data

(63) Continuation of application No. 09/097,258, filed on Jun. 15, 1998.

(30) Foreign Application Priority Data

Jun. 27, 1997 (JP) ............................ 9-187539
Nov. 28, 1997 (JP) ............................ 9-327980

(51) Int. Cl.$^7$ .................................. H01L 21/8238
(52) U.S. Cl. ................................. 438/201; 438/272
(58) Field of Search ............................. 438/201, 199, 438/197, 200, 211, 257, 272

(56) References Cited

U.S. PATENT DOCUMENTS

| 5,032,881 A | 7/1991 | Sardo et al. ............... 257/316 |
| 5,316,965 A | 5/1994 | Philipossian et al. ....... 438/424 |
| 5,559,048 A | 9/1996 | Inoue ....................... 257/316 |
| 5,666,311 A | * 9/1997 | Mori ........................ 438/257 |
| 5,740,105 A | 4/1998 | Gill .......................... 257/321 |
| 5,773,861 A | 6/1998 | Chen et al. ................ 257/316 |

FOREIGN PATENT DOCUMENTS

| JP | 4-75390 | 3/1992 |
| JP | 8-17948 | 1/1996 |
| JP | 8-298314 | 11/1996 |
| JP | 9-8156 | 1/1997 |
| JP | 2618946 | 9/1997 |

OTHER PUBLICATIONS

S. Ariotme et al., "A /.67 um$^2$ Self–Aligned Shallow Trench Isolation Cell (SA–STI Cell) For 3V–only 256 Mbit NAND EEPROMs", IEDM 94, pp. 61–64 (1994).

* cited by examiner

Primary Examiner—Richard Elms
Assistant Examiner—Bradley Smith
(74) Attorney, Agent, or Firm—Banner & Witcoff, Ltd.

(57) ABSTRACT

A nonvolatile semiconductor memory device comprises a semiconductor substrate, element isolating regions provided in the semiconductor substrate, first element regions, each of which is defined by two adjacent ones of the element isolating regions, and memory cell transistors formed in the element regions, wherein each of the memory cell transistors comprises a first gate insulating film formed on a corresponding one of the element isolating regions, a floating gate electrode formed on the gate insulating film, a second gate insulating film formed on the floating gate electrode, and a control electrode formed on the second gate insulating film and connected in common to a specific number of ones of the memory cell transistors to serve as a word line, and the floating gate includes a first conductive member with side faces in contact with side ends of the two adjacent ones of the element isolating regions and a second conductive member electrically connected to the first conductive member and formed so as to bridge a gap between the two adjacent ones of element isolating regions.

21 Claims, 43 Drawing Sheets

NONVOLATILE SEMICONDUCTOR MEMORY DEVICE

This application is a continuation of U.S. application Ser. No. 09/097,258, filed Jun. 15, 1998.

BACKGROUND OF THE INVENTION

This invention relates a nonvolatile semiconductor memory device, and more particularly to a stacked gate structure of a memory cell transistor.

EEPROM is a type of nonvolatile semiconductor memory device capable of rewriting data electrically. Each memory cell in EEPROM is generally composed of an FETMOS transistor which has a floating gate between a control gate and a channel region and whose threshold voltage can be varied. EEPROMs are available in several types, depending on the way of connecting memory cell transistors. They include the NOR type, NAND type, AND type, and DINOR type.

FIG. 1A is a plan view of a memory cell array of a conventional NAND EEPROM memory cell array. FIG. 1B is a sectional view taken along a line 1B—1B of FIG. 1A.

As shown in FIGS. 1A and 1B, element isolating regions 102 are formed in a p-type silicon substrate 101. The element isolating regions 102 mark off one semiconductor active region 103 (element region) from another. The active regions 103 in the memory cell array have a parallel line pattern. The element isolating regions 102 are made of silicon dioxide. Although a high-concentration $p^+$-type region called a channel stopper is usually formed below each element isolating region 102 in the substrate 101 to prevent the conductivity type directly under the element isolating region from being inverted, the channel stopper will be omitted in the present specification.

On the active regions 103, first gate insulating films 104 are formed thin enough to allow tunnel current to flow. The gate insulating films 104 are made of silicon dioxide (in the present specification, for the sake of convenience, the first gate insulating films 104 are referred to as tunnel oxide films).

On the tunnel oxide films 104, floating gates 105 are formed. The floating gates 105 are made of conductive polysilicon and function as charge storage layers that store charges. Each memory cell transistor is provided with one floating gate 105, which is isolated from the others. The threshold voltage of each memory cell transistor is adjusted according to the amount of electrons stored in the corresponding floating gate 105. Data is converted into the level of the threshold voltage and stored.

On the floating gates 105, a second gate insulating film 106 is formed. The second gate insulating film 106 is generally made of a stacked layer film called an ONO film (in the present specification, for convenience's sake, the second gate insulating film 106 is referred to as the ONO film). In the stacked layer film, silicon dioxide, silicon nitride, and silicon dioxide are stacked in that order.

On the ONO film 106, control gates 107 are formed. The control gates 107 are made of conductive polysilicon and formed into continuous lines in the direction of the row in the memory cell array and function as word lines (in the specification, for convenience's sake, the control gates 107 are referred to as the word lines).

The floating gates 105 and word lines 107 are formed by achieving consecutive etching using the same mask. As a result, the edges of the floating gates 105 align with those of the word lines 107 in the direction of the channel width (i.e., in the direction of the row in the figure). Hereinafter, the gate structure where the floating gate 105 and word line 107 are stacked is referred to as a stacked gate 108. With the stacked gates 108 and element isolating regions 102 as a mask, n-type source/drain regions 109 are formed by ion-implanting n-type impurities into the active regions 103.

In the memory cell array, the element isolating regions 102 are formed by local thermal oxidation of the silicon substrate 101. A typical example of this formation method is the LOCOS method.

FIGS. 2A and 2B are sectional views to help explain the procedure of the LOCOS method.

As shown in FIG. 2A, a buffer oxide film (silicon dioxide) 110 is formed on a silicon substrate 101. Then, the buffer oxide film excluding the regions in which the element isolating regions 102 are to be formed is covered with a silicon nitride film 111. In this state, using the nitride film 111 as a barrier to oxidation, the surface of the silicon substrate 101 is subjected heavily to thermal oxidation as shown in FIG. 2B. As a result, the element isolating regions 102 are formed.

In the LOCOS method, however, during oxidation, a wedge-shaped oxide film 112 called a bird's beak develops along the interface between the silicon substrate 101 and the nitride film 111. This results in the conversion difference "Δ" between the dimension "Wactual" of the actually formed element isolating region 102 and the dimension "Wdesign" of the element isolating region 102 in design.

As described above, because in the LOCOS method, the actual dimension "Wactual" is larger than the design dimension "Wdesign," it is very difficult to form such microscopic element isolating regions 102 that, for example, the actual dimension "Wactual" is equal to or less than 0.5 µm.

Moreover, in the LOCOS method, it is difficult to form the element isolating regions 102 deep or thick in the silicon substrate 101. As the dimension "W" will be made smaller in the future, it will be much more difficult to form the element isolating regions 102 deep. The element isolating regions 102 formed in the memory cell array are exposed to an etching environment, especially when the stacked gates are processed. As a result, the thicknesses of the regions excluding the portions covered with the stacked gates decrease during the processing. The element isolating regions whose film thickness has been reduced have poorer insulation capabilities.

One of element isolating techniques to solve the above problem is a trench element isolating method of forming trenches in a silicon substrate and filling the trenches with insulating material.

FIG. 3A is a plan view of a conventional NAND EEPROM memory cell array using the trench element isolating method. FIG. 3B is a sectional view taken along a line 3B—3B of FIG. 3A. In these figures, the same parts as those in FIGS. 1A and 1B are indicated by the same reference symbols.

As shown in FIGS. 3A and 3B, trenches 121 are made in the substrate 101. The trenches 121 are filled with an insulating materiel 122. The insulating material 122 is made of silicon dioxide and functions as an element isolating region. Hereinafter, the insulating material is referred to as the trench element isolating region 122.

FIGS. 4A and 4B are sectional views to help explain the procedure of the trench element isolating method. As shown in FIG. 4A, the regions excluding the regions in which trench element isolating regions 122 are to form on the silicon substrate 101 are covered with a silicon nitride 123. In this state, with the nitride film 123 as a barrier to etching, the silicon substrate 101 is subjected to etching to form trenches 121.

Then, after silicon dioxide has been deposited on the entire surface of the silicon substrate 101, the deposited silicon dioxide is etched back by RIE techniques or CMP techniques and the trenches 121 are filled with silicon dioxide as shown in FIG. 4B. As a result, the trench element isolating regions 122 have been formed.

With such a trench element isolating method, the aforementioned conversion difference "Δ" will not take place. Consequently, in the trench element isolating regions 122, the actual dimension "Wactual" can be made 0.5 μm or less.

Since the trenches 121 are formed inside the silicon substrate 101, the trench element isolating regions 122 can be formed deep in the substrate 101. This enables the trench element isolating regions to be made thicker than the LOCOS element isolating regions 102.

The trench element isolating method has realized thick element isolating regions 122 even in a memory cell array where microscopic line patterns are repeated. This widens a margin for a decrease in the film thickness caused during the processing of stacked gates, as compared with the LOCOS element isolating regions 102.

It is desirable, however, that a decrease in the thicknesses of the element isolating regions in the memory cell array should be suppressed as much as possible, regardless of whether they are of the LOCOS type or the trench type.

A decrease in the film thickness of the element isolating region in the memory cell array occurs not only during the processing of stacked gates but also the formation of high-withstand-voltage MOSFETs on the same substrate 101. In EEPROMs, a voltage higher than the power supply voltage is used to write or erase the data. In a transistor that generates or switches such a voltage, the gate oxide film has to be thicker than the tunnel oxide film 104 of the memory cell transistor from the viewpoint of securing the withstand voltage. A MOSFET that has a thick gate oxide film and is formed on the same substrate 101 is called a high-withstand-voltage MOSFET in the present specification.

In both the LOCOS method and the trench element isolating method, the tunnel oxide film 104 and thick gate oxide film have been formed after the formation of element isolating regions.

FIGS. 5A to 5C are sectional views to help explain the procedure for forming a conventional tunnel oxide film and thick gate oxide film, taking the trench element isolating method as an example.

As shown in FIG. 5A, after trench element isolating regions 122 have been formed, a silicon substrate 101 exposed at the surface of semiconductor active regions 103 are oxidized to form thick gate oxide films 131. The thick gate oxide films 131 are formed in a peripheral circuit region 132 in which a high-withstand-voltage MOSFET is to be formed in addition to the area of a memory cell array 133.

Then, as shown in FIG. 5B, the peripheral circuit region 132 is covered with, for example, photoresist 134. With the photoresist 134 as a mask, the thick gate oxide films 131 formed in the semiconductor active regions 103 in the memory cell array 133 are removed by wet etching. During the wet etching, because the element isolating regions 102 in the array 133 is made of silicon dioxide, they are etched at the same time. As a result, the surface of them are recessed more than the element isolating region 122 in the peripheral circuit region 132.

Thereafter, as shown in FIG. 5C, after the photoresist 134 has been removed, the silicon substrate 101 exposed at the active regions 103 in the array 133 is oxidized to form thin gate oxide films, or tunnel oxide films 104.

As described above, the conventional basic procedure is to form a MOSFET gate oxide film after the formation of the element isolating regions 122. According to the basic procedure, in an EEPROM where a thin gate oxide film is needed in the array 133 and a thick gate oxide film is needed in the peripheral circuit region 132, the surfaces of the element isolating regions 122 in the array 133 are recessed. As a result, their film thickness t133 is smaller than the film thickness t132 of the element isolating region 122 in the peripheral circuit region 132. Specifically, in the array 133, as the film thickness of the element isolating region 122 decreases from the thickness at the time when they were first formed, the margin gets narrower to another decrease in the film thickness during the processing of stacked gates.

An EEPROM to solve such a problem has been reported by, for example, Aridome et al. in IEDM, 1994. They have described what is called a self-alignment trench element isolating method, (IEDM Technical Digest 1994, pp. 61–64).

FIG. 6A is a plan view of a conventional NAND EEPROM memory cell array using the self-alignment trench element isolating method. FIG. 6B is a sectional view taken along a line 6B—6B of FIG. 6A. In these figure, the same parts as those in FIGS. 1A and 1B are indicated by the same reference symbols.

As shown in FIGS. 6A and 6B, trenches 141 are formed deep in a substrate 101, extending from the sidewalls of floating gates 105 inward. The trenches 141 are filled with insulating material. The insulating material is made of silicon dioxide and constitutes element isolating regions 142.

In a memory cell array using the self-alignment element isolating method, the element isolating regions 142 project from the surface of the semiconductor active regions 103 and their sidewalls are in contact with the sidewalls of the floating gates 105. Specifically, the element isolating regions 142 are formed after the formation of the tunnel oxide film 104 and floating gates 105.

FIGS. 7A to 7C are sectional views to help explain the self-alignment trench element isolating method and the procedure for forming a tunnel oxide film by this method.

As shown in FIG. 7A, a tunnel oxide film 104 and a conductive polysilicon film 143 from which floating gates 105 are to be made are formed in that order on a silicon substrate 101. Then, the area excluding the area in which element isolating regions 142 are to be formed is covered with a silicon nitride film 144.

Then, as shown in FIG. 7B, with the nitride film 144 as a barrier to etching, the conductive polysilicon film 143, tunnel oxide film 104, and silicon substrate 101 are etched in that order to form trenches 141.

Next, after silicon dioxide has been deposited on the entire surface of the silicon substrate 101, the deposited silicon dioxide is etched back by RIE or CMP techniques as shown in FIG. 7C to fill the trenches 141 with silicon dioxide. Thereafter, the nitride film 144 is removed to form self-alignment trench element isolating regions 142.

Unlike the conventional basic procedure, the basic procedure in the self-alignment trench element isolating method is to form a MOSFET gate oxide film before the formation of element isolating regions 142. Specifically, because the element isolating regions 102 are formed after the formation of the tunnel oxide film 104, a wet etching process in which the surfaces of the element isolating regions in the memory cell array are recessed during the formation of the tunnel oxide film 104 is basically absent.

Therefore, in the self-alignment trench element isolating regions 142, a stacked gate processing step can be started with the original film thickness in the memory cell array remaining almost unchanged. This increases a processing margin for a decrease in the film thickness caused during the processing of stacked gates, as compared with a memory cell array where elements are isolated by the conventional LOCOS method or trench element isolating method.

In a memory cell array where elements are isolated by the self-alignment trench element isolating method, however, the face of the floating gate 105 facing the word line 107 is basically the top surface of the floating gate 105 only. As a result, the capacitance C1 of the capacitor composed of a floating gate 105, a tunnel oxide film 104, and a channel (substrate 101) is almost the same as the capacitance C2 of the capacitor composed of a floating gate 105, an ONO film 106, and word line 107, except for the permittivity of the dielectric.

In EEPROMs, a write voltage VPP higher than the power supply is applied to a word line 107 in a data write operation or a data erase operation. Presently, the write voltage VPP tends to be lower. To make the write voltage VPP lower, it is better to make capacitance C2 larger than capacitance C1.

To realize this, the increase of the capacitance C2 has been considered by projecting the sidewalls of the floating gate 105 from the element isolating region 142. With this consideration, however, the exposure of the floating gate 105 results in a decrease in the film thickness of the element isolating region 142 in the memory cell array. This narrows the processing margin for the formation of stacked gates.

BRIEF SUMMARY OF THE INVENTION

A first object of the present invention is to provide a nonvolatile semiconductor memory device having a structure which suppresses the decrease of the film thickness of element isolating regions in a memory cell array and is capable of increasing the capacitance between a floating gate and a word line with a high processing margin for the memory cell array.

A second object of the present invention is not only to achieve the first object but also to form memory cell transistors and select gate transistors while giving a sufficient processing margin to the STI regions in a memory cell array.

A third object of the present invention is to provide a nonvolatile semiconductor memory device capable of suppressing the decrease of the film thickness of element isolating regions in a portion in which select gate transistors are to be formed in a memory cell array where elements are isolated by self-alignment trench element separation.

To achieve the foregoing objects, a nonvolatile semiconductor memory device according to a first aspect of the present invention comprises: a semiconductor substrate; a plurality of element isolating regions provided in the semiconductor substrate; a plurality of first element regions, each of which is defined by two adjacent ones of the plurality of element isolating regions; and a plurality of memory cell transistors formed in the plurality of element regions, respectively, each of the plurality of memory cell transistors comprising: a first gate insulating film formed on the corresponding one of the plurality of first element regions, a floating gate electrode formed on the gate insulating film, a second gate insulating film formed on the floating gate electrode, and a control gate electrode formed on the second gate insulating film and connected in common to a specific number of ones of the plurality of memory cell transistors to serve as a word line, wherein the floating gate includes a first conductive member with side faces in contact with the side ends of the two adjacent one of the plurality of element isolating regions and a second conductive member electrically connected to the first conductive member and formed so as to bridge a gap between the two adjacent ones of the plurality of element isolating regions.

It is desirable that a top surface of the first conductive member is substantially flush with top surfaces of the two adjacent ones of the plurality of element isolating regions.

A position of a top surface of the first conductive member may be lower than top surfaces of the two adjacent ones of the plurality of element isolating regions, and the second conductive member may have a portion that contacts not only side faces of the two adjacent ones of the plurality of element isolating regions above the top surface of the first conductive member but also the top surfaces of the two adjacent ones of the plurality of element isolating regions.

The nonvolatile semiconductor memory device may further comprise a plurality of select transistors which are formed in the plurality of first element regions and select a specific one from the plurality of memory cell transistors, wherein each of the select transistors includes a third gate insulating film formed on the corresponding one of the plurality of first element regions, a first gate member formed on the third gate insulating film and in contact with side ends of the two adjacent ones of the plurality of element isolating regions, and a select gate electrode electrically connected to the first gate member and made of the same layer as that of the control gate electrode.

The first gate member may include a third conductive member made of the same layer as that of the first conductive member of each of the plurality of memory cell transistors, and a fourth conductive member electrically connected to the third conductive member and made of the same layer as that of the second conductive member of each of the plurality of memory cell transistors.

It is desirable that the same layer as that of the second gate insulating film is formed on the two adjacent ones of the plurality of element isolating regions that isolate each of the plurality of select transistors from each other.

It is desirable that each of the control gate electrode and the select gate electrode includes a first conductive layer that contacts the second gate insulating film and a second conductive layer that contacts the first conductive layer, the first conductive layer of the select gate electrode being formed on the same layer of the second gate insulating film above a corresponding one of the plurality of element isolating regions, and the second conductive layer of the select gate electrode being connected to the first gate member above a corresponding one of the plurality of first element regions.

The nonvolatile semiconductor memory device may further comprise: a second element region formed apart from the plurality of first element regions, and a peripheral circuit transistor formed in the second element region to drive the plurality of memory cell transistors, the peripheral circuit transistor including a fourth gate insulating film formed on the second element region and a gate electrode formed on the fourth gate insulating film, wherein the gate electrode of the peripheral circuit transistor includes a fifth conductive member made of the same layer as that of the first conductive member of each of the plurality of memory cell transistors, and a sixth conductive member electrically connected to the fifth conductive member and made of the same layer as that of the second conductive member of each of the plurality of memory cell transistors.

It is desirable that a difference in height between a surface of the first conductive member of the floating gate electrode and top surfaces of the two adjacent ones of the plurality of element isolating regions is substantially same throughout the plurality of memory cell transistors.

A thickness of the first conductive member may vary among the plurality of memory cell transistors.

Both of side faces of the second conductive member on the two adjacent ones of the plurality of element isolating regions may be tapered.

Each of the plurality of first element regions is formed in a line-form and plural of the plurality of memory cell transistors are formed in one of the plurality of first element regions, each of the plurality of memory cell transistors having a source and a drain region formed so as to sandwich the floating gate electrode in one of the plurality of first element regions and sharing one of the source and the drain region with adjacent one of the plurality of memory cell transistors.

A nonvolatile semiconductor memory device according to a second aspect of the present invention comprises: a semiconductor substrate; a plurality of element isolating regions provided in the semiconductor substrate; a plurality of element regions, each being sandwiched between two adjacent ones of the plurality of element isolating regions; and a plurality of memory cell transistors and a plurality of select transistors formed in the plurality of element regions, wherein each of the plurality of memory cell transistors includes a first gate insulating film formed on a corresponding one of the plurality of element regions, a floating gate electrode formed on the first gate insulating film, correspondingly to the plurality of element regions, a second gate insulating film formed on the floating gate electrode, and a control gate electrode formed on the second gate insulating film, and each of the plurality of select transistors includes a third gate insulating film formed on a corresponding one of the plurality of element regions, a gate member formed on the third gate insulating film, correspondingly to one of the plurality of element regions, and a select gate electrode formed on the gate member and electrically connected to the gate member.

It is desirable that each of the control gate electrode and the select gate electrode includes a first conductive layer that contacts the second gate insulating film and a second conductive layer that contacts the first conductive layer, the first conductive layer of the select gate electrode being formed on the same layer as that of the second gate insulating film above the plurality of element isolating regions, and the second conductive layer of the select gate electrode being connected to the gate member above the plurality of element regions.

A nonvolatile semiconductor memory device according to a third aspect of the present invention comprises: a semiconductor substrate; a plurality of element isolating regions provided in the semiconductor substrate; a plurality of element regions, each being sandwiched between two adjacent ones of the plurality of element isolating regions; and a plurality of memory cell transistors and a plurality of select transistors formed in the plurality of element regions, wherein each of the plurality of memory cell transistors includes a first gate insulating film formed on a corresponding one of the plurality of element regions, a floating gate electrode which is formed on the first gate insulating film and whose side ends contact two adjacent ones of the plurality of element isolating regions, a second gate insulating film formed on the floating gate electrode, and a control gate electrode which is formed on the second gate insulating film and extends over the two adjacent ones of the plurality of element isolating regions, and each of the plurality of select transistors includes a third gate insulating film formed on a corresponding one of the plurality of element regions, a gate member which is formed on the third gate insulating film and whose side ends contact the two adjacent ones of the plurality of element isolating regions, and a select gate electrode which is formed on the gate member and electrically connected to the gate member and extends over the two adjacent ones of the plurality of element isolating regions, and a thickness of a corresponding one of the plurality of element isolating regions under the select gate electrode is essentially larger than a thickness of the corresponding one of the plurality of element isolating regions under the control gate electrode.

It is desirable that the nonvolatile semiconductor memory device further comprises a first region that is formed in each of the plurality of element regions and functions as one of a source and a drain region of each of the plurality of select transistors, a second region that is formed in each of the plurality of element regions and functions as one of the source and the drain region of each of the plurality of memory cell transistors, and a third region that is formed in each of the plurality of element regions and functions as the other of the source and the drain region for one of the plurality of select transistors and one of the plurality of memory cell transistors adjacent to the one of the plurality of select transistors and is shared by the one of the plurality of select transistors and the one of the plurality of memory cell transistors, wherein a distance from a top surface of the gate member of each of the plurality of select transistors to a top surface of a portion isolating the first region in the plurality of element isolating regions is equal to or smaller than a distance from a top surface of the floating gate electrode of each of the plurality of memory cell transistors to a top surface of a portion isolating the second region in the plurality of element isolating regions.

It is desirable that a film thickness of a portion isolating the first region in the plurality of element isolating regions is equal to or larger than a film thickness of a portion isolating the second region in the element isolating regions.

It is desirable that a film thickness of a portion corresponding to each of the plurality of element isolating regions under the select gate electrode is equal to or larger than a film thickness of a portion isolating the first region in the plurality of element isolating regions.

It is desirable that a film thickness of a part of a portion corresponding to each of the plurality of element isolating regions under the select gate electrode is substantially equal to a film thickness of a portion isolating the first region in the plurality of element isolating regions and smaller than a film thickness of a remaining part of the portion corresponding to each of the element isolating regions under the select gate electrode.

It is desirable that a portion isolating the third region in the plurality of element isolating regions has a step.

With the present invention, it is possible to provide a nonvolatile semiconductor memory device which is capable of suppressing a decrease in the film thickness of the element isolating regions in a memory cell array while securing a substantial processing margin for the memory cell array and which has a structure capable of increasing the capacitance between the floating gate and the word line. It is also possible to provide a method of manufacturing such nonvolatile semiconductor memory devices.

Furthermore, with the present invention, it is possible to provide a nonvolatile semiconductor memory device which not only produces the above effect but also is capable of forming memory cell transistors and select gate transistors while giving a sufficient processing margin to the STI regions in a memory cell array.

Still furthermore, with the present invention, it is possible to provide a nonvolatile semiconductor memory device which is capable of suppressing a decrease in the film thickness of the element isolating regions in the portion where select gate transistors are formed in a memory cell array whose elements are isolated by self-alignment trench element isolation. It is also possible to provide a method of manufacturing such nonvolatile semiconductor memory devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 45A and 45B are sectional views to help explain the step of removing the ONO film of the NAND EEPROM according to the basic structure of the sixth embodiment, wherein FIG. 45A is a sectional view taken along line A—A of FIG. 44 and FIG. 45B is a sectional view taken along line B—B of FIG. 44;

FIGS. 46A and 46B are sectional views to help explain the step of processing the stacked gates of the NAND EEPROM according to the basic structure of the sixth embodiment, wherein FIG. 46A is a sectional view taken along a line A—A of FIG. 44 and FIG. 46B is a sectional view taken along a line B—B of FIG. 44;

DETAILED DESCRIPTION OF THE INVENTION

Hereinafter, embodiments of the present invention will be explained, taking NAND EEPROMs as examples.

(First Embodiment)

Figure 1A:
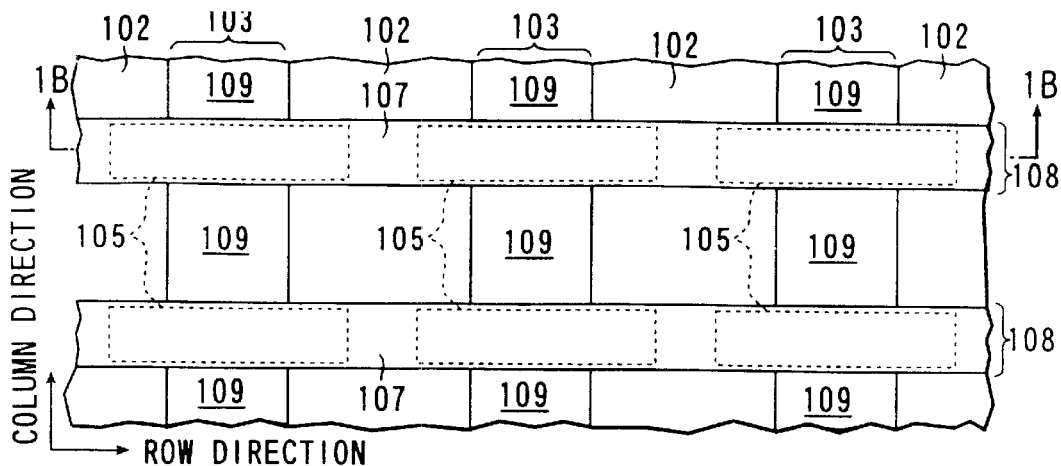
FIG. 1A is a schematic plan view of a conventional NAND EEPROM memory cell array.
Figure 1B:
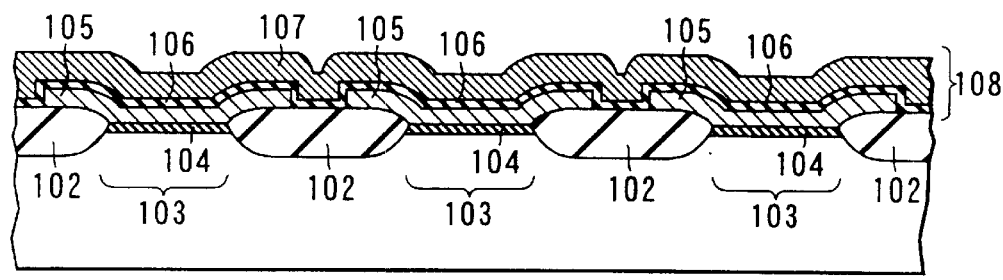
FIG. 1B is a sectional view taken along a line 1B—1B of FIG. 1B.
Figure 2A:
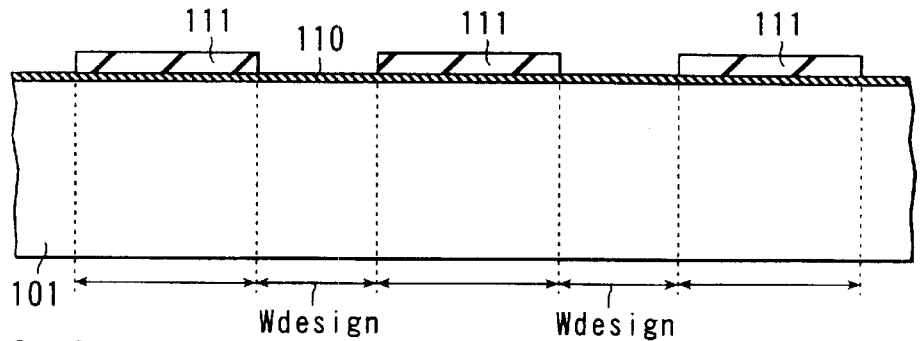
FIGS. 2A and 2B are sectional views to help explain the design values and the actual values of active regions in the LOCOS method.
Figure 2B:
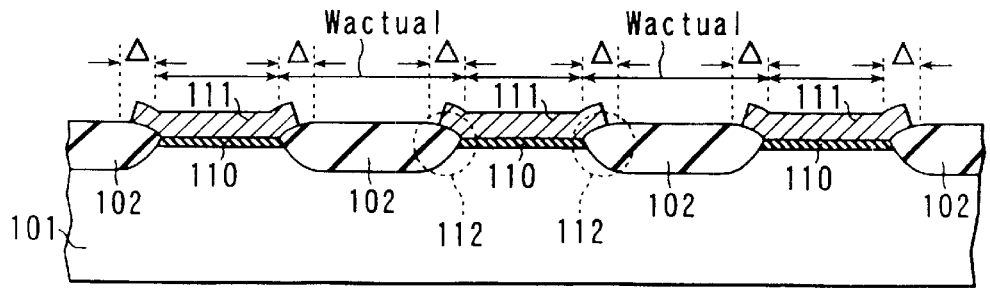
Figure 3A:
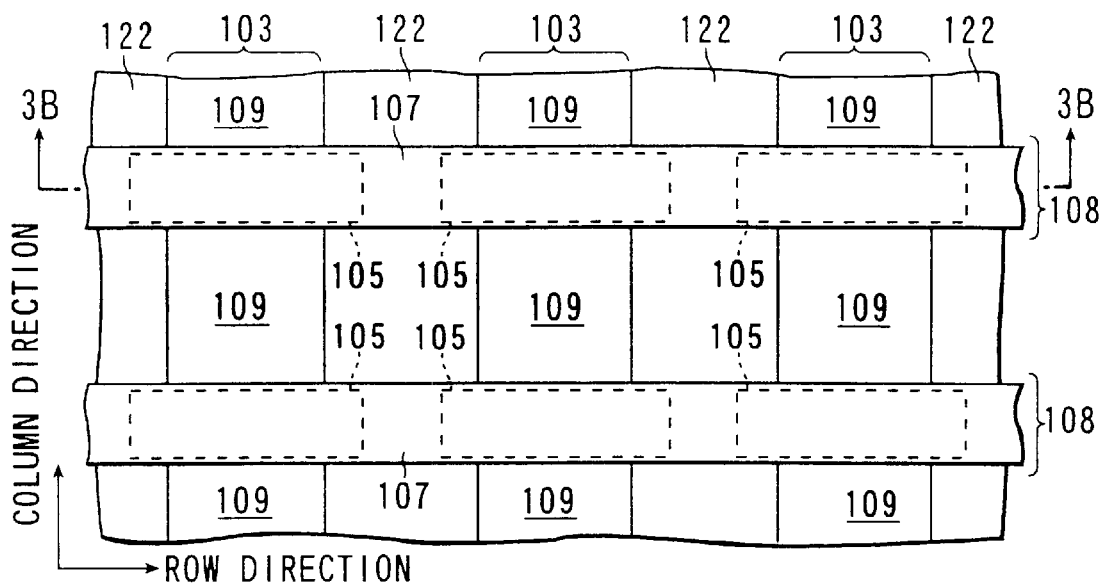
FIG. 3A is a schematic plan view of another conventional NAND EEPROM memory cell array.
Figure 3B:
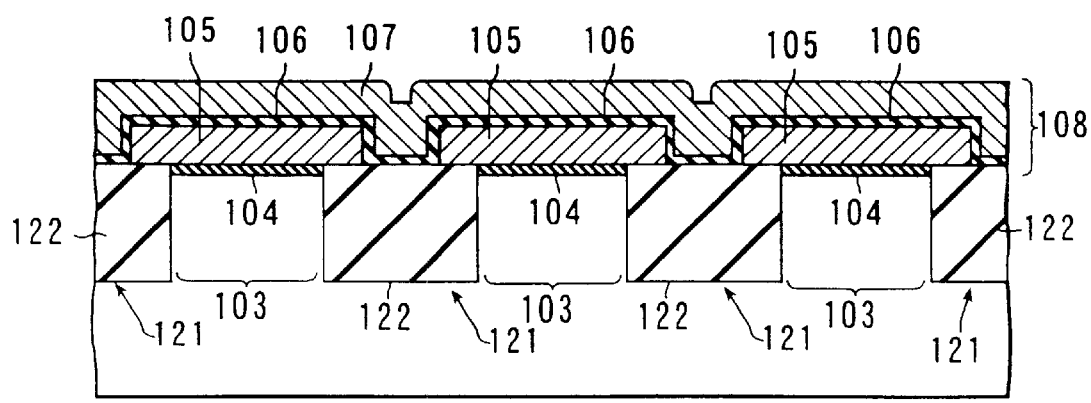
FIG. 3B is a sectional view taken along a line 3B—3B of FIG. 3A.
Figure 4A:
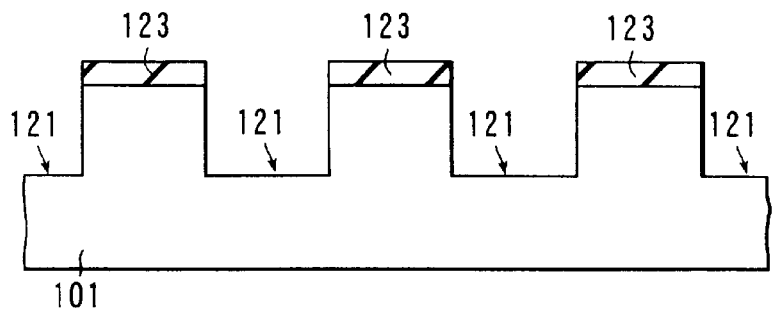
FIGS. 4A and 4B are sectional views for the procedure for forming trench element isolating regions.
Figure 4B:
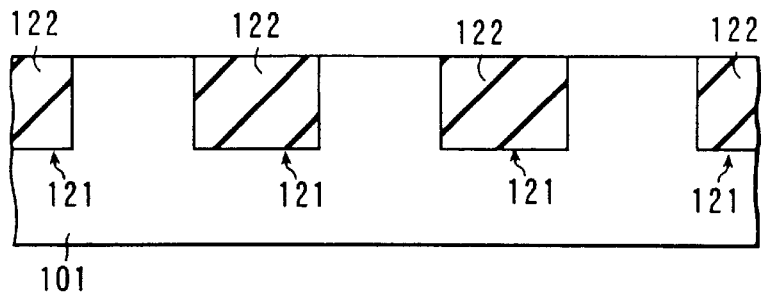
Figure 5A:
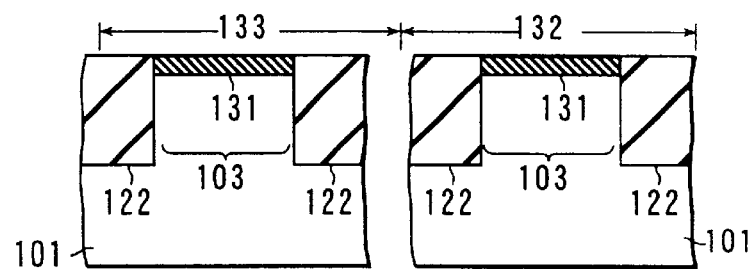
FIGS. 5A to 5C are sectional views showing gate oxide film manufacturing steps in sequence to help explain problems encountered in forming transistors whose gate oxide films differ in thickness.
Figure 5B:
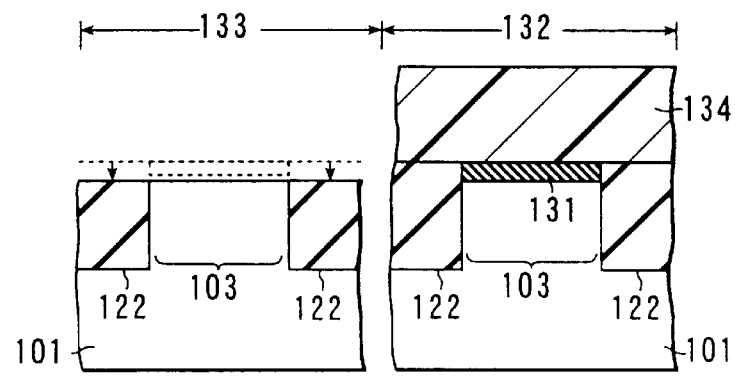
Figure 5C:
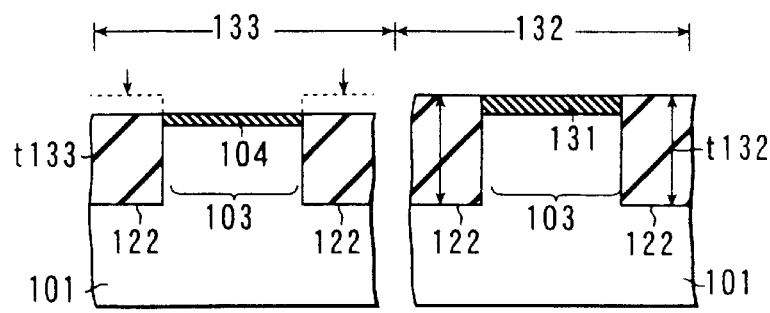
Figure 6A:
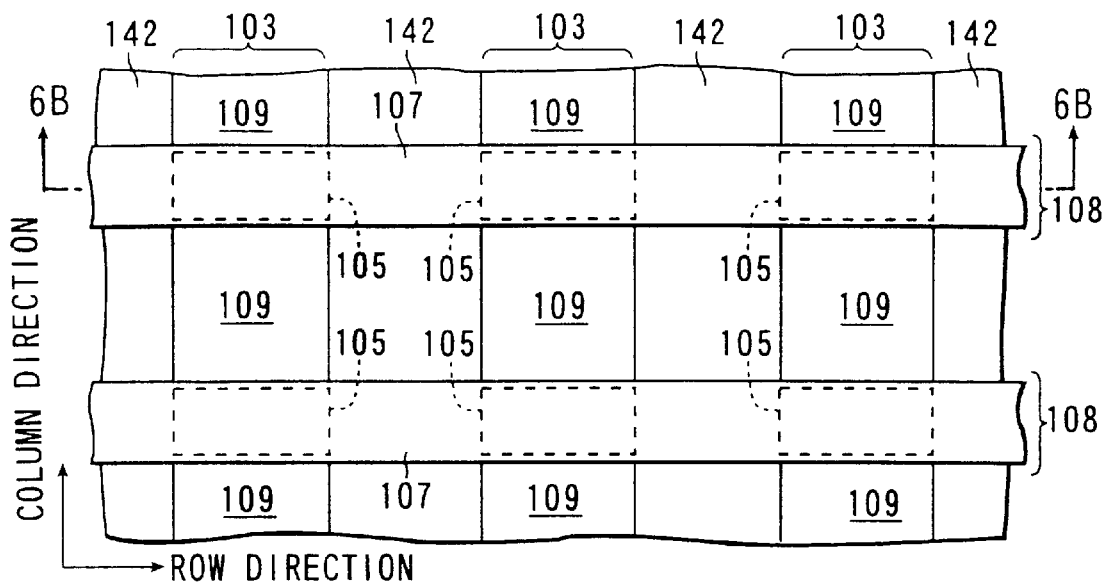
FIG. 6A is a schematic plan view of another conventional NAND EEPROM memory cell array.
Figure 6B:
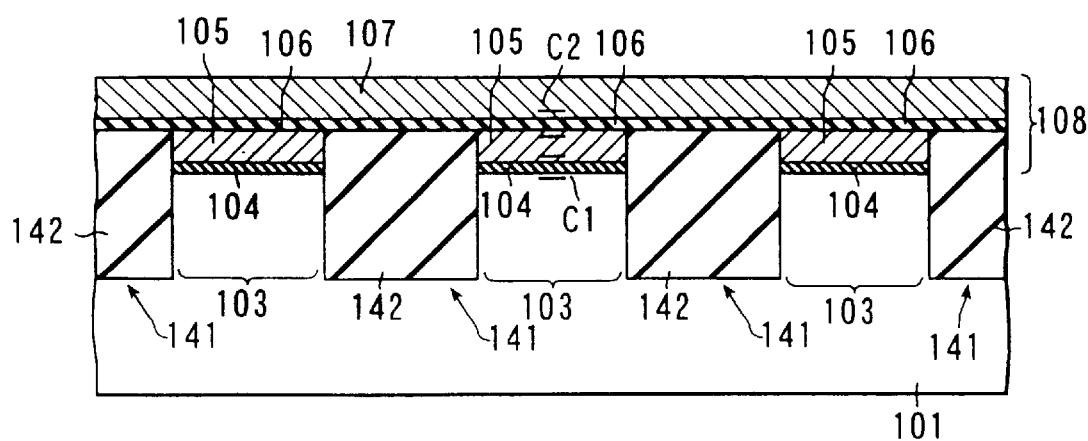
FIG. 6B is a sectional view taken along a line 6B—6B of FIG. 6A.
Figure 7A:
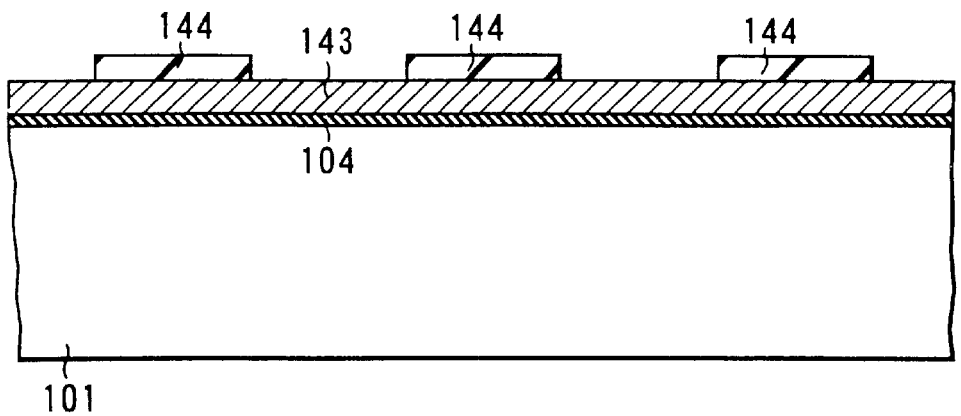
FIGS. 7A to 7C are sectional views for another procedure for forming trench element isolating regions.
Figure 7B:
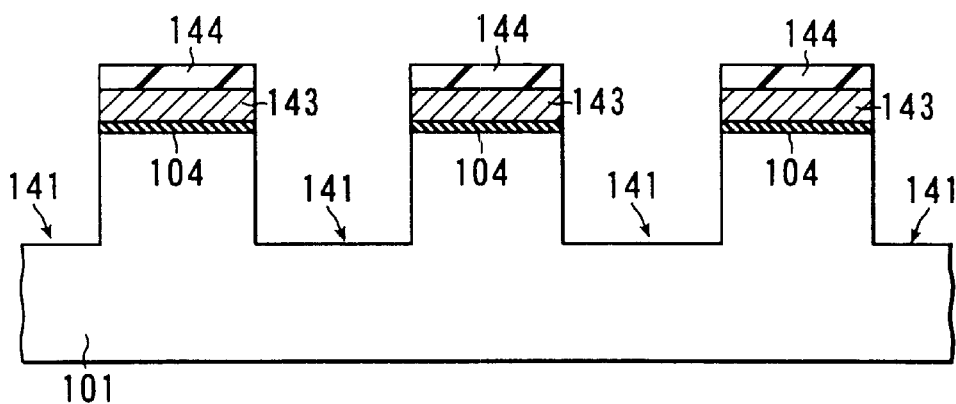
Figure 7C:
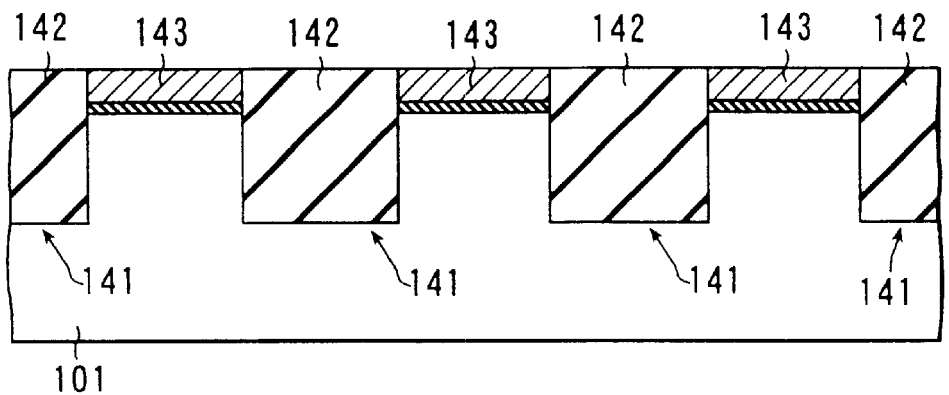
Figure 8A:
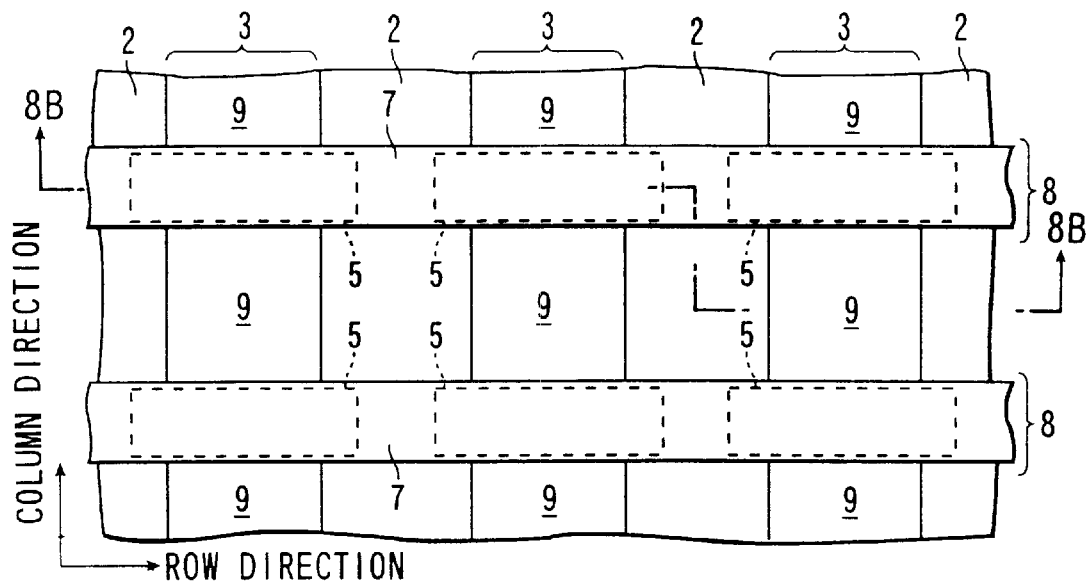
FIG. 8A is a schematic plan view of a NAND EEPROM memory cell array according to a first embodiment of the present invention.
Figure 8B:
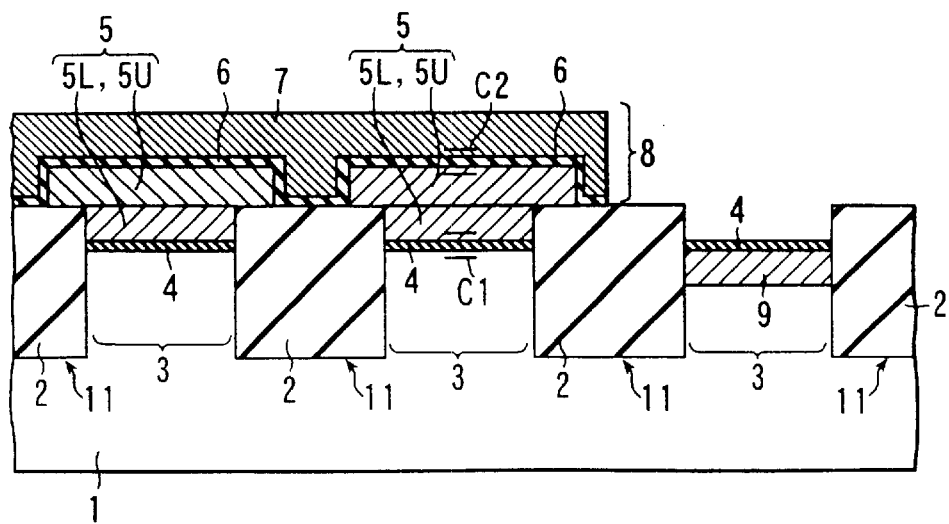
FIG. 8B is a sectional view taken along a line 8B—8B of FIG. 8A.

FIG. 8A is a schematic plan view of a NAND EEPROM memory cell array according to a first embodiment of the present invention. FIG. 8B is a sectional view taken along a line 8B—8B of FIG. 8A.

As shown in FIGS. 8A and 8B, element isolating regions 2 are formed in a p-type silicon substrate 1. The element isolating regions 2 mark off semiconductor active regions (element regions) 3 at the surface of the substrate 1. The active regions 3 in a memory cell array have a parallel line pattern. To produce the line pattern, the element isolating regions 2 also have a repeated line pattern. FIG. 8A illustrates the repetition of the line patterns. The element isolating regions 2 are made of silicon dioxide.

The element isolating regions 2 are self-alignment trench isolating regions, which are formed by forming trenches 11 using a mask pattern with an isolated gate electrode pattern as a mask and filling the trenches 11 with silicon dioxide. The isolating regions of this type are sometimes called STI (Shallow Trench Isolation) in these days, so they are referred to as the STI regions 2 in the explanation which follows. The STI regions 2 may or may not have high-concentration $p^+$-type regions, called channel stoppers, formed directly under the regions in the substrate 1. In this embodiment, it is assumed that channel stoppers are not be formed.

On the active regions 3, first gate insulating films 4 are formed thin enough to allow tunnel current to flow. The gate insulating films 4 are made of silicon dioxide. Because the embodiment is of the NAND type, the first gate insulating films 4 are hereinafter referred to as the tunnel oxide films 4.

On each tunnel oxide film 4, an isolated gate electrode 5 is formed. One isolated gate electrode is provided for one memory cell transistor. In FIG. 8A, the isolated gate electrodes 5 constitute floating gates. In the embodiment, the isolated gate electrodes are referred to as the floating gates. The floating gates 5 are made from conductive polysilicon and function as charge storage layers.

On the floating gates 5, a second gate insulating film 6 is formed. The second gate insulating film 6 is generally made of a stacked film called an ONO film. In the ONO film, silicon dioxide, silicon nitride, and silicon dioxide are stacked in that order. Hereinafter, the second insulating film is referred to as the ONO film 6.

On the ONO film 6, control gates 7 are formed. The control gates 7 are made of conductive polysilicon. They are formed into lines extending continuously in the direction of the row in the memory cell array and function as word lines. Hereinafter, they are referred to as the word lines 7.

The floating gates 5 and word lines 7 are formed by achieving consecutive etching using the same mask. As a result, the edges of the floating gates 5 align with those of the word lines 7 in the direction of the channel width (i.e., in the direction of the row in the figure). Hereinafter, the gate structure where the floating gates 5 and word lines 7 are stacked is referred to as the stacked gate 8.

With the stacked gates 8 and STI regions 2 as a mask, n-type source/drain regions 9 are formed by ion-implanting n-type impurities into the active regions 3.

In the embodiment, each floating gate 5 is composed of a lower layer section 5L and an upper layer section 5U. The lower layer section 5L have its sides self-aligned with the side ends of the line pattern section of each STI region 2. The upper layer section 5U covers the sides of the lower layer section 5L when viewed from above and has its sides extended over the top surface of the line pattern of each STI region 2.

The width of the upper layer section 5U in the direction of the row is greater than the width of the active region 3 in the direction of the row and the sides of the upper layer section 5U in the direction of the column are positioned on the top surface of the STI region 2. As a result, the area of the top surface of the upper layer section 5U is larger than that of the top surface of the lower layer section 5L. This makes the facing area between the floating gate 5 and the word line 7 larger than that between those of the conventional self-alignment trench type. Because of the structure, the capacitance C2 of a capacitor composed of a floating gate 5, an ONO film 6, and a word line 7 can be made sufficiently larger than the capacitance C1 of a capacitor composed of a floating gate 5, a tunnel oxide film 4, and a channel (substrate 1).

Because capacitance C2 is made greater than capacitance C1, for example, a write voltage VPP higher than the power supply voltage applied to a word line 7 in erasing the data can be made lower than that in a conventional self-alignment trench EEPROM.

In a conventional self-alignment trench element isolating type EEPROM, capacitance C2 can be increased by projecting the sides of the floating gate 5 from the top surface of the STI region 2. With this structure, as the floating gate 5 is projected from the top surface of the STI region 2 more, a larger capacitance C2 is obtained.

To increase the amount of projection of the floating gate 5, the floating gate 5 may be made thicker or the top surface of the STI region 2 may be recessed more. A thicker floating gate 5, however, requires the etching of a thicker stacked structure in processing a stacked gate 8, leading to a stronger possibility that, for example, the film thickness of the STI region 2 will decrease substantially. When the top surface of the STI region 2 is recessed considerably, the film thickness of the STI region 2 naturally decreases significantly. Furthermore, since the floating gate 5 projects substantially from the top surface of the STI region 2, the flatness deteriorates, especially at the layers above the floating gate 5, resulting in a decrease in the microscopic workability.

In contrast, with the embodiment, although the height of the floating gate 5 (5U, 5L) is not made greater, an increase in the area of the upper layer section 5U viewed from above makes capacitance "C2" larger. This thins the stacked structure etched during the processing of the stacked gate 8, reducing the possibility that the film thickness of the STI region 2 will decrease significantly. Of course, the top surface of the STI region 2 need not be recessed. Furthermore, the upper layer section 5U does not project from the top surface of the STI region 2, resulting in a good flatness of the layers on the floating gate 5, which provides a structure excellent in microscopic workability.

Next, a method of manufacturing NAND EEPROM memory cell arrays will be explained.

FIGS. 9A to 9H are sectional views of a NAND EEPROM memory cell array according to a first embodiment of the present invention, each corresponding to each of the principal manufacturing steps. The sectional views correspond to the sectional view of FIG. 8B.

Figure 9A:
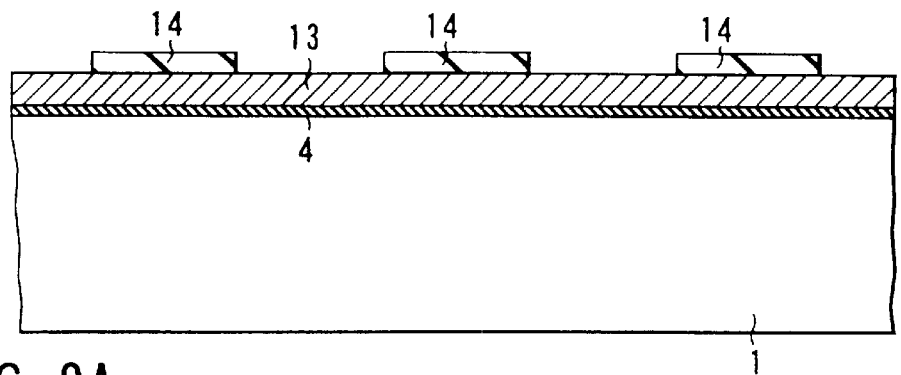
FIGS. 9A to 9H are sectional views showing the steps of manufacturing NAND EEPROM memory cell arrays according to the first embodiment of the present invention.

As shown in FIG. 9A, on a silicon substrate 1, a tunnel oxide film 4 and a conductive polysilicon film 13 are formed in that order. The conductive polysilicon film serves as the lower layer section 5L of the floating gate 5. Then, the regions excluding the regions in which STI regions 2 are to be formed are covered with a silicon nitride film 14. The silicon nitride film 14 is a mask member for forming trenches and may be eliminated, if not necessary.

Figure 9B:
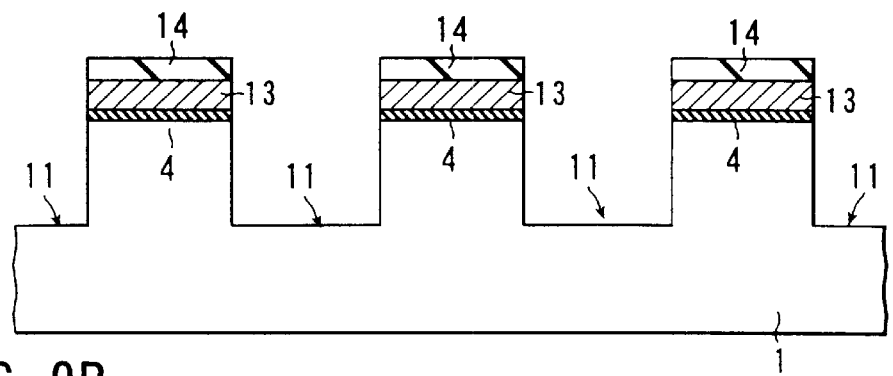

Next, as shown in FIG. 9B, using the nitride film 14 as a barrier to etching, the conductive polysilicon film 13, tunnel oxide film 4, and silicon substrate 1 are etched in that order to form trenches 11. The trenches 11 are formed by RIE techniques. The depth of the trench 11 may be set at the optimum value, taking into account the threshold value of a parasitic MOSFET formed below the trench 11 in the substrate and the punch through voltage between semiconductor active regions 3 isolated by the STI regions 2.

After the trenches 11 have been formed, if necessary, the inside of the trenches may be cleaned or a sidewall treatment film may be formed on the surface of the substrate 1 exposed to the trenches 11. A thermal oxide film obtained by thermal oxidation of the substrate 1 or silicon dioxide deposited by CVD techniques is used as the sidewall treatment film.

Furthermore, impurities of the same conductivity type as that of the substrate 1 may be ion-implanted under the trenches 11 to form channel stoppers, thereby improving the threshold values of the parasitic MOSFETs or the punch through voltage.

Figure 9C:
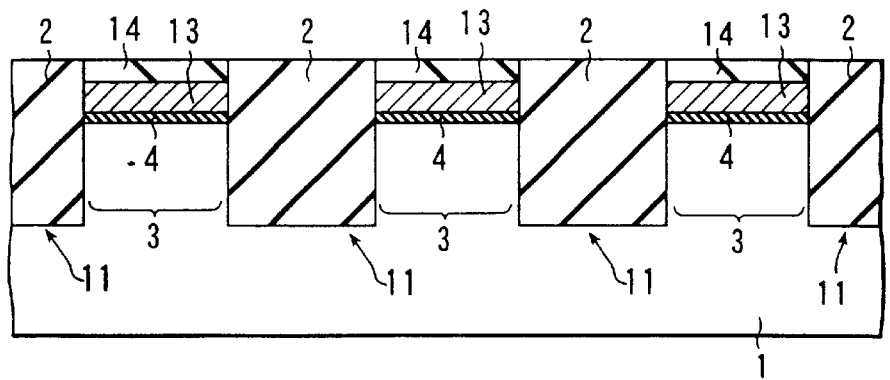

Then, after silicon dioxide has been deposited on the entire surface of the silicon substrate 1, the deposited silicon dioxide is etched back by RIE or CMP techniques as shown in FIG. 9C to fill the trenches 11 with silicon dioxide. This completes the STI regions 2, which mark off the active regions 3 with a repeated line pattern on the substrate 1. Silicon dioxide filling the trenches 11 should have an excellent step coverage and preferably is, for example, TEOS or BPSG.

Figure 9D:
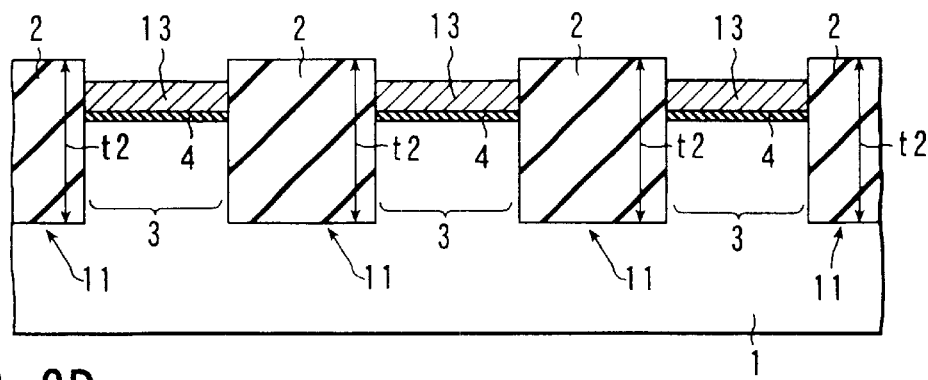

Next, as shown in FIG. 9D, the nitride films 14 are removed. At this time, the top surface of the STI region 2 may be etched so that they may align with the top surface of the conductive polysilicon film 13. In the present embodiment, the top surfaces of the STI regions 2 are not etched and only the nitride films 14 are removed. The present method has the advantage that the film thickness t2 of the STI region remains almost the same as the original film thickness and therefore a margin for subsequent stacked gate processing can be made greater.

A thick gate oxide film (not shown) to be used as a high-withstand-voltage MOSFET is formed before or after the formation of the STI regions 2, with the memory cell array covered with a mask. Consequently, when the thick gate oxide film is formed on the active regions 3, the STI regions 2 will not be etched.

Figure 9E:
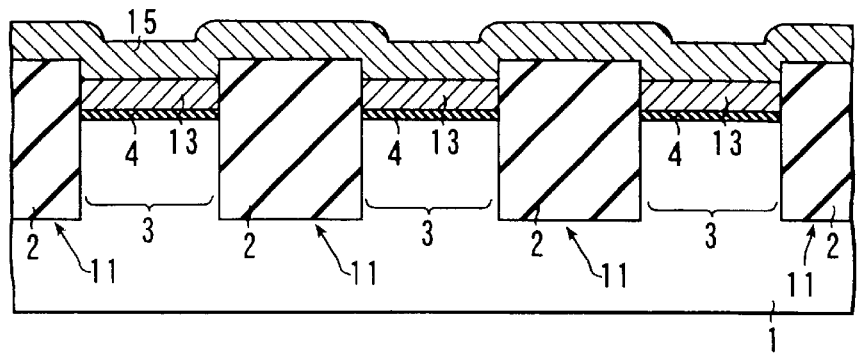

Next, as shown FIG. 9E, a conductive polysilicon film 15 serving as the upper layer section 5U is formed.

Figure 9F:
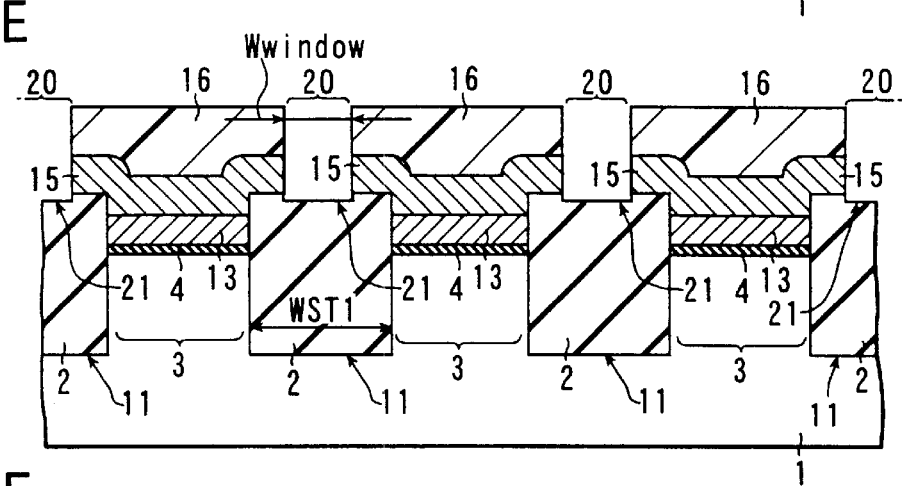

Then, as shown in FIG. 9F, a photoresist film 16 is formed on the conductive polysilicon film 15. The photoresist film 16 has windows 20 corresponding to slits that isolate the floating gates 5 for the individual memory cell transistors. The width "Wwindow" of each window 20 is smaller than the width "WSTI" of the strip of each STI region 2. A lithographic mask for forming the windows 20 is aligned so that each window 20 may be positioned on the strip of each STI region 2 reliably. The reason for this is that capacitance C2 of each memory cell transistor is prevented from varying from chip to chip.

Next, using the photoresist film 16 as a mask, the conductive polysilicon film 15 is etched to form slits 21 in the conductive polysilicon film 15. During the formation of the slits 21, the STI regions 2 are etched a little. The STI regions 2, however, have a sufficient film thickness t2 as shown in FIG. 9D, which provides a more margin than conventional LOCOS or trench element isolating regions.

Then, after the photoresist film 16 has been removed from the structure of FIG. 9F, an ONO film 6 is formed on the entire surface of the structure. Thereafter, on the ONO film 6, a conductive polysilicon film 17 serving as word lines 7 is formed. Because the conductive polysilicon film 17 acts as word lines 17, it should have a lower sheet resistance than that of, for example, the conductive polysilicon film 13 or 15, that is, have a low resistance. The conductive polysilicon film may be replaced with a refractory metal whose resistance is lower than that of the conductive polysilicon film, a refractory metal silicide obtained by combining a refractory metal with silicon, or a stacked layer film of these.

Figure 9G:
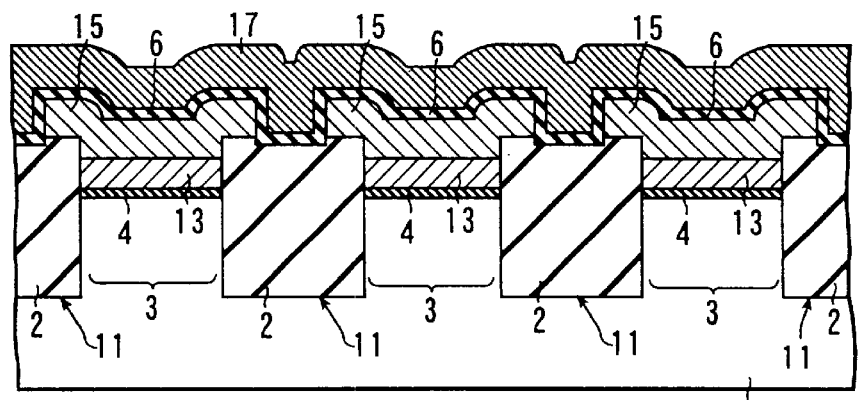
Figure 9H:
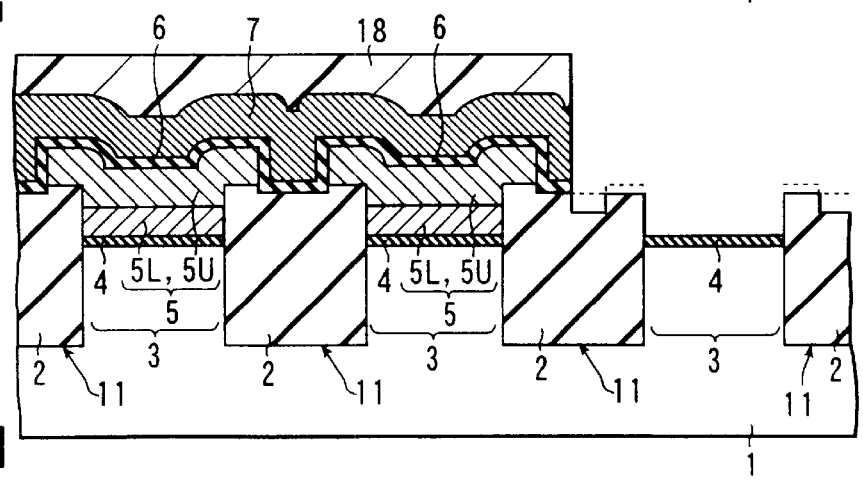

Next, as shown in FIG. 9H, a photoresist film 18 having a pattern corresponding to a pattern for forming the word lines 7 is formed. Then, using the photo-resist film 18 as a mask, the conductive polysilicon film 17, ONO film 6, conductive polysilicon film 15, and conductive polysilicon film 13 are etched to form stacked gates 8, each including a word line 7 and a floating gate 5 with a two-layer structure of the upper layer section 5U and lower layer section 5L.

In processing the stacked gates 8, the STI regions 2 excluding the portions under the stacked gates 8 are etched. As in the processing of the slits of FIG. 9F, the stacked gates 8 are processed with the STI regions 2 being sufficiently thick. Accordingly, the stacked gates 8 are processed with a larger processing margin than that of conventional LOCOS or trench element isolating regions.

Thereafter, with a known method, source/drain regions 9, interlayer insulating film, contact holes such as bit-line contact holes, and wiring layers such as bit lines are formed, which completes a NAND EEPROM according to the first embodiment.

With the NAND EEPROM according to the first embodiment, capacitance C2 of a capacitor composed of a floating gate 5, ONO film 6, and word line 7 is larger than that of a conventional self-alignment trench element isolation NAND EEPROM, which helps to make, for example, the write voltage VPP still lower.

Furthermore, the processing of the slits 21 and stacked gates 8 is effected on the STI regions 2 with a sufficient film thickness, providing the memory cell array with a larger processing margin than that of a conventional LOCOS element isolation or trench element isolation NAND EEPROM, which helps to miniaturize the memory cell transistors further.

In a structure where the top surface of the STI region 2 is higher than that of the lower layer section 5L as shown in FIGS. 9D to 9H, the above effect is particularly noticeable. Because the structure is obtained by filling the trenches 11, flattening them, and then removing the nitride film 14, the top surfaces of the STI regions are not etched. The absence of the etching allows the STI regions 2 to have a sufficient film thickness.

Furthermore, in the NAND EEPROM according to the first embodiment, the covering of the lower layer section 5L with the upper layer section 5U enables variations in capacitance C2 due to the misalignment of the mask to be absorbed in the self-alignment trench element isolation type. As a result, it is easy to equalize the values of capacitance C2 for each wafer. Hereinafter, this will be explained using a first comparable example.

Figure 10A:
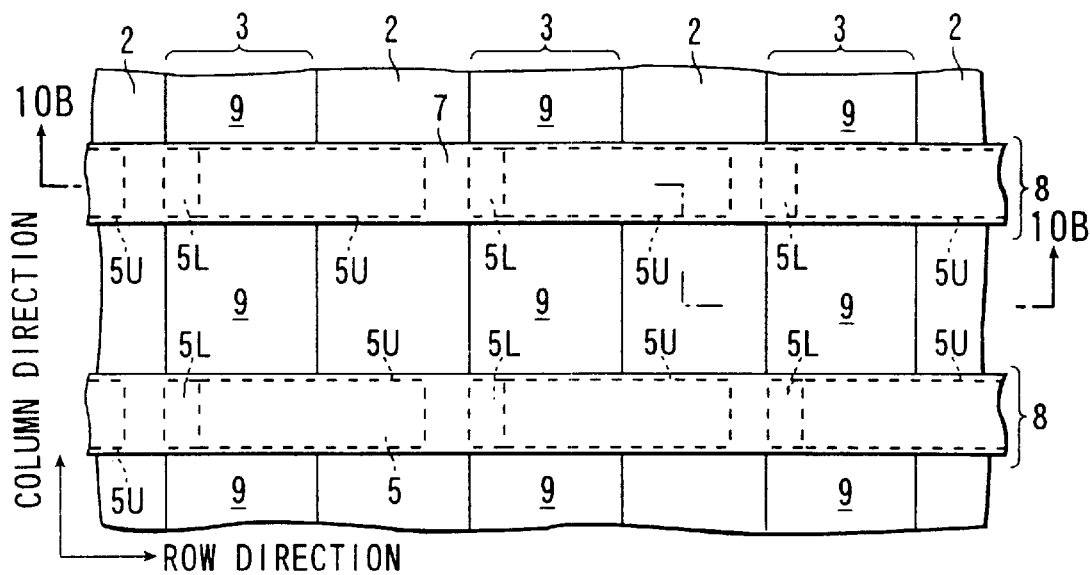
FIG. 10A is a schematic plan view of a NAND EEPROM memory cell array according to a first comparable example of the present invention.
Figure 10B:
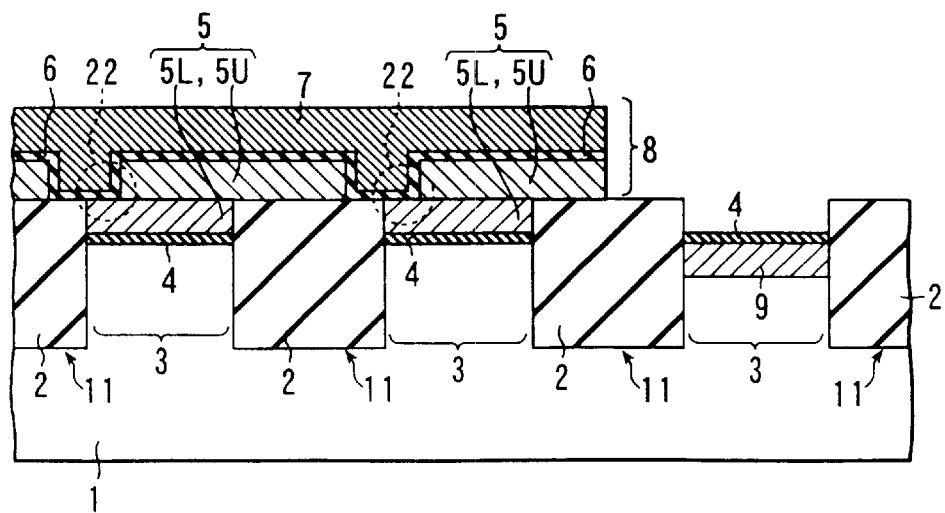
FIG. 10B is a sectional view taken along line 10B—10B of FIG. 10A.
Figure 11A:
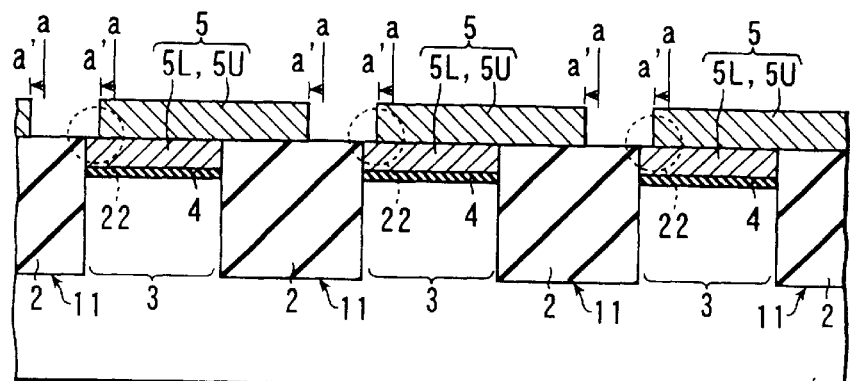
FIGS. 11A and 11B are sectional views of a NAND EEPROM having defects due to a mask shift according to the first comparable example.
Figure 11B:
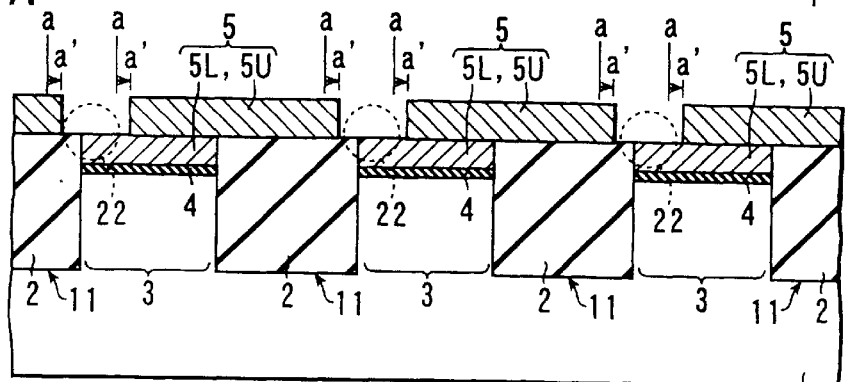

FIG. 10A is a schematic plan view of a NAND EEPROM memory cell array according to a first comparable example of the present invention. FIG. 10B is a sectional view taken along a line 10B—10B of FIG. 10A. FIGS. 11A and 11B illustrate the slippage of a mask occurred in a NAND EEPROM memory cell array related to the comparable example.

As shown in FIGS. 10A and 10B, in the first comparable example, the upper layer section 5U is shifted so that the top surface of the lower layer section may be exposed. A region 22 in which the top surface of the lower layer section 5L is exposed increases the facing area between the word line 7 and the floating gate 5, which improves capacitance C2 more than in the first embodiment.

In the first comparable example, when a mask for forming slits has been shifted from a specific alignment position "a" to position "a'" as shown in FIGS. 11A and 11B, the exposed area of the lower layer section 5L appearing in the region 22 varies with the shift. A variation in the exposed area changes capacitance C2. Therefore, it is difficult to equalize the values of capacitance C2 for each wafer, with the result that capacitance C2 is liable to vary from one NAND EEPROM product to another. Since actual products are manufactured in anticipation of a margin for variations in capacitor C2, the variations have no adverse effect on the products. The variations, however, increase variations in the characteristics between products a little. Smaller variations in the characteristics between products are one of the chief factors that provide high-performance, high-quality products.

Figure 12A:
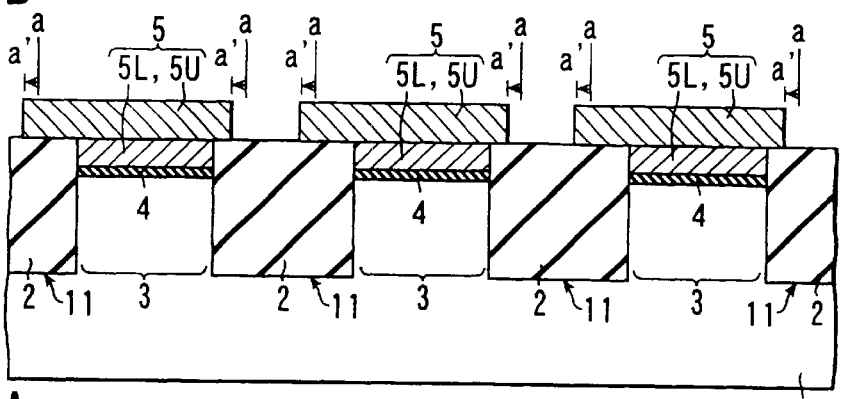
FIGS. 12A and 12B are sectional views of a NAND EEPROM having defects due to a mask shift according to the first embodiment.
Figure 12B:
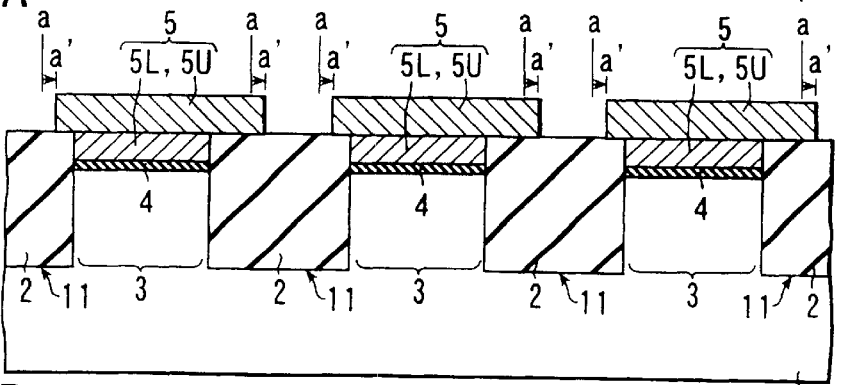

FIGS. 12A and 12B illustrate the slippage of a mask occurred in a NAND EEPROM memory cell array related to the first embodiment of the present invention.

In the first embodiment, even when a mask for forming slits has been shifted from a specific alignment position "a" to position "a'" as shown in FIGS. 12A and 12B, the facing area between the word line 7 and the floating gate 5 remains unchanged by forcing the lower layer section 5L to be covered with the upper layer section 5U. This prevents the slippage of the mask from changing capacitance C2, which makes it easy to equalize the values of capacitance C2 for each wafer.

As a result, variations in capacitance C2 of NAND EEPROM products become small. The small variations in capacitance C2 enables the threshold voltages corresponding to the data items stored in the memory cell transistors to be distributed more easily in a narrow range in the first embodiment than in the first comparable example.

Generally, in a data write operation in an EEPROM, data writing and verify reading are repeated a certain number of times until the threshold voltage is brought in a desired range. In the case of an EEPROM whose capacitance C2 varies greatly, the number of repetitions is large and it takes a long time to write the data. In the first embodiment, however, because variations in capacitance C2 are small, the number of repetitions decreases. As a result, the time required to write the data is shortened, achieving a faster write operation than, for example, in the first comparable example.

Moreover, the first embodiment that enables the threshold voltages to be distributed easily in a narrow range can be applied suitably to not only to a memory for storing binary data "0" or "1" but also to a multivalued memory for storing more than binary data, for example, four-valued data 00, 01, 10, or 11.

When the first embodiment is applied to a multivalued memory, the effect of shortening the data write time is very large. This is because, in the first write operation, the threshold voltage approaches the desired threshold voltage range at a high accuracy.

In the first embodiment, the following modification is particularly effective.

The tunnel oxide film 4 is made of an insulating film with a thickness that enables the exchange of charges between the floating gate 5 and substrate 1, depending on the voltage applied between the word line 7 and substrate 1. For example, the film thickness is 10 nm or less. The material for the tunnel oxide film may be silicon nitride ($Si_3N_4$) or silicon oxynitride (SiON), in addition to silicon dioxide ($SiO_2$).

The conductive material for the word lines 7 is preferably, for example, polysilicon whose conductivity is increased by doping impurities or amorphous silicon.

The ONO film 6 has a thickness that electrically isolates the floating gates 5 from the word lines 7. The material for the ONO film 6 may be a single layer film of silicon dioxide, silicon nitride, or silicon oxynitride, or a stacked layer of these.

The insulating material filled in the trenches may be silicon dioxide, preferably TEOS or BPSG.

These modifications are also applicable in the embodiments explained below.

(Second Embodiment)

Figure 13A:
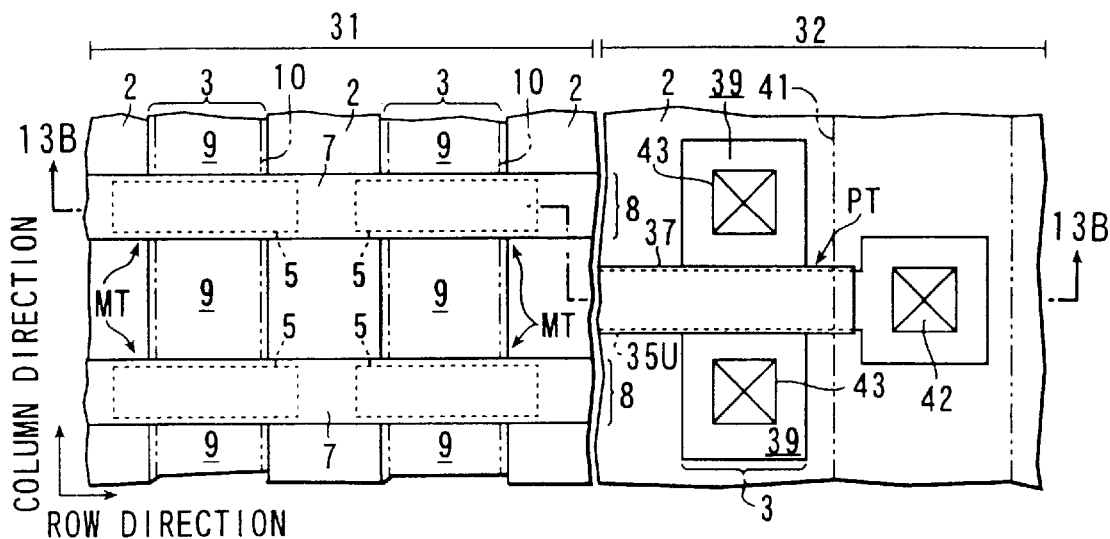
FIG. 13A is a schematic plan view of a NAND EEPROM memory cell array and peripheral circuit region according to a second embodiment of the present invention.
Figure 13B:
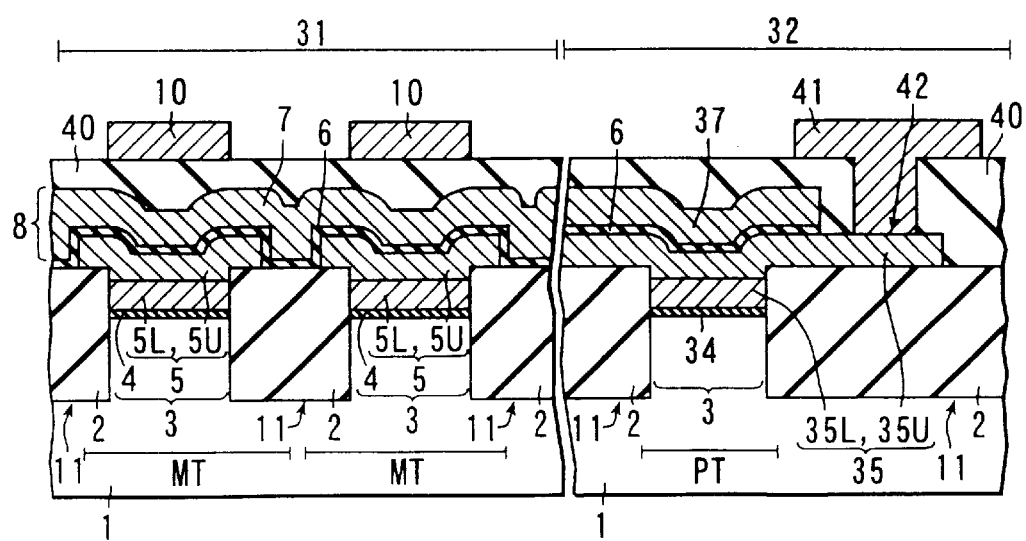
FIG. 13B is a sectional view taken along a line 13B—13B of FIG. 13A.

FIG. 13A is a schematic plan view of a NAND EEPROM memory cell array and memory peripheral circuit according to a second embodiment of the present invention. FIG. 13B is a sectional view taken along a line 13B—13B of FIG. 13A.

The objective of the second embodiment is not only to provide the STI regions 2 in a memory cell array with a sufficient processing margin but also to give a sufficient processing margin to a peripheral circuit region in which a memory peripheral circuit for operating the memory is formed.

As shown in FIGS. 13A and 13B, the structure of a memory cell array 31 is the same as that of the first embodiment and the structure of a transistor (MOSFET) "PT" formed in a peripheral circuit region 32 characterizes the second embodiment. Specifically, the structure of the transistor PT is similar to the structure of the memory cell transistor MT.

The transistor MT differs from the transistor PT as follows. In the transistor MT, a two-layer conductive material constitutes the lower layer section 5L and upper layer section 5U of the floating gate 5 and is isolated for each transistor MT. In the MOSFET "PT," the gate 35 of the MOSFET PT is made of a two-layer conductive material constituting a lower layer section 35L and an upper layer section 35U on an active region 3. In the second embodiment, the lower layer section 35L is formed above an active region 3 via a gate oxide film 34 and remains between the side ends of STI regions 2. The upper layer section 35U constitutes an internal wiring layer for directing to the gate a signal that drives or controls the transistor PT.

In FIGS. 13A and 13B, a signal that drives or controls the transistor PT is supplied from an internal wiring layer 41 made of a low-resistance metal formed on an interlayer insulating film 40 via a contact hole 42 to the upper layer section 35U. The contact hole 42 is formed on an STI region 2 in, for example, the peripheral circuit region 32.

The conductive material 37 constituting the word lines 7 of the transistors MT is allowed to remain above the upper layer section 35U of the transistor PT via an ONO film 6 above the active region 3 in the peripheral circuit region 32. The conductive material 37 is removed only near the contact hole 42 above the STI region 2.

In the transistor PT that drives or controls a low-voltage signal, one example of a gate oxide film 34 is the same as the tunnel oxide film 4. Another example of the gate oxide film is a relatively thin thermal oxide film whose thickness is almost the same as that of the tunnel oxide film 4. Moreover, in the transistor PT that drives or controls a high-voltage signal, an example of the gate oxide film 34 is a thermal oxide film sufficiently thicker than the tunnel oxide film 4.

It is particularly desirable that such a gate oxide film 34 should have been formed between a substrate 1 and a conductive polysilicon film 13 already at the time of, for example, FIG. 9A. The reason for this is that the formation of the gate oxide film 34 between the lower layer section 35L and the substrate before the formation of the STI region 2 eliminates the need of etching the STI region 2 in the peripheral circuit region 32 to form the gate oxide film 34.

In FIGS. 13A and 13B, numeral 10 indicates a bit line formed in the memory cell array 31 and numeral 39 denotes the source/drain region of the transistor PT. Numeral 43 indicates a contact that connects the source/drain regions 39 to an internal wiring layer. The internal wiring layer is not shown here.

With the NAND EEPROM according to the second embodiment, the gate 35 of the transistor PT constituting the peripheral circuit is constructed of a two-layer structure of the upper layer section 35U and lower layer section 35L similarly with the floating gate 5 of the memory cell transistor MT. This enables the transistor PT constituting the peripheral circuit to be formed in manufacturing processes similar to those of memory cell transistors MT in the first embodiment.

Furthermore, the STI region 2 is formed after the gate oxide film 34 with a desired thickness has been formed between the lower layer section 35L of the gate 35 of the memory cell transistor MT and the substrate 1. This suppresses a decrease in the film thickness of the STI region 2 not only in the memory cell array 31 but also in the peripheral circuit region 32.

In a transistor that drives or controls a low voltage signal, the gate oxide film 34 with the desired thickness is as same or thin as the tunnel oxide film 4. In a transistor that drives or controls a high voltage signal, the gate oxide film 34 is sufficiently thicker than the tunnel oxide film 4. Of course, a thin gate oxide film and a thick gate oxide film may be formed between the lower layer section 35L and the substrate 1.

Hereinafter, several applications will be explained in connection with the present invention.

(Third Embodiment)

Figure 14:
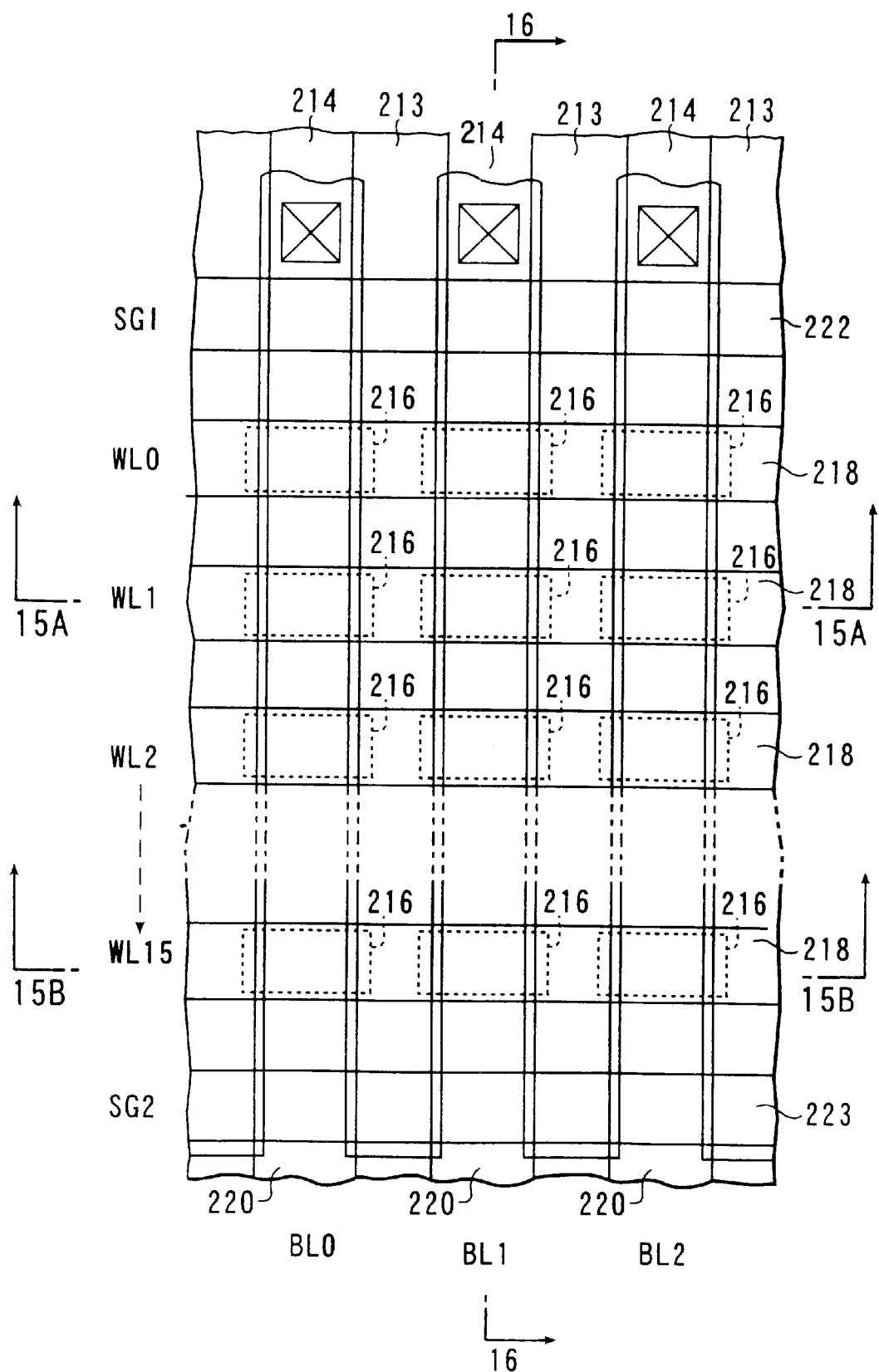
FIG. 14 is a schematic plan view of a NAND EEPROM memory cell array region according to a third embodiment of the present invention.
Figure 15A:
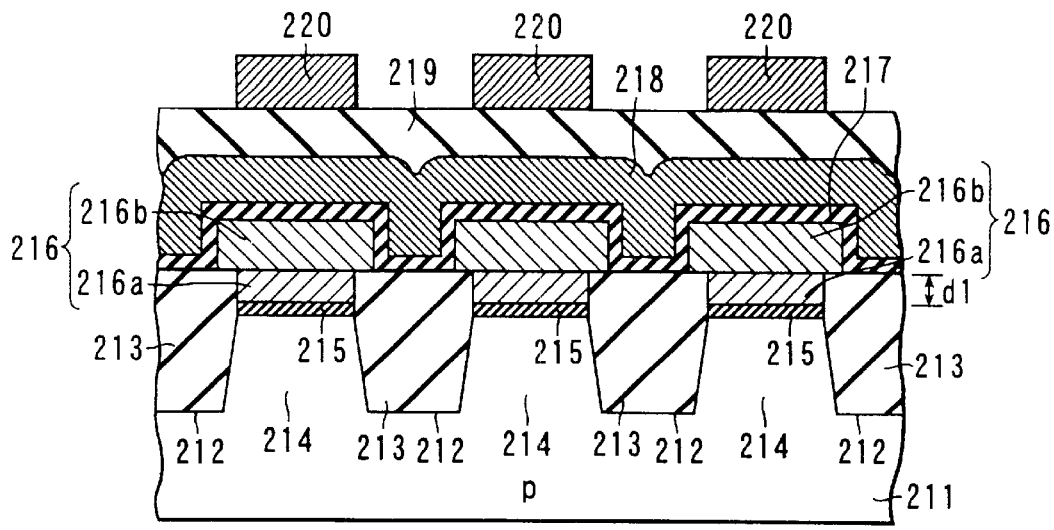
FIGS. 15A and 15B are sectional views taken along different word lines (along a line 15A—15A and a line 15B—15B, respectively) of FIG. 14.
Figure 15B:
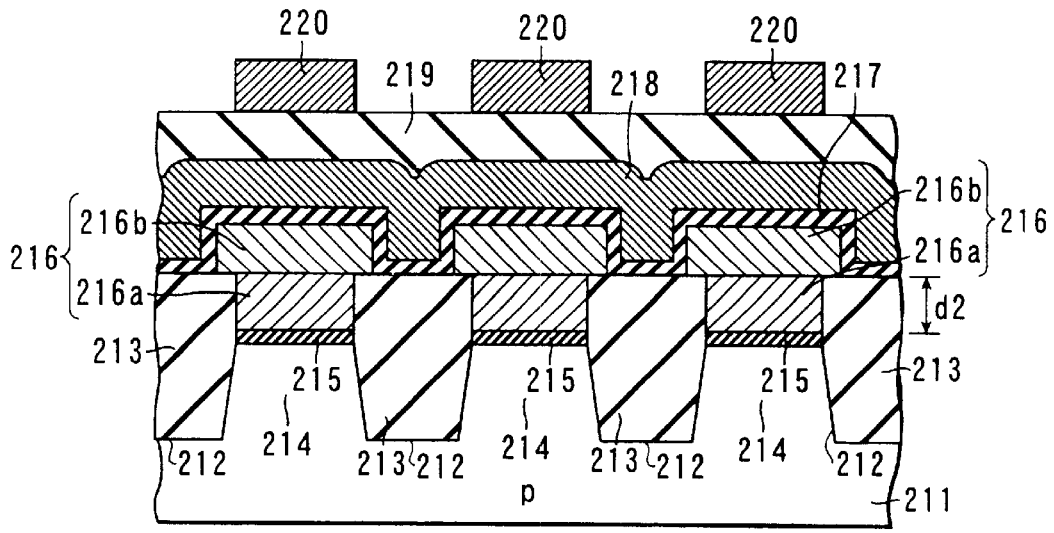
Figure 16:
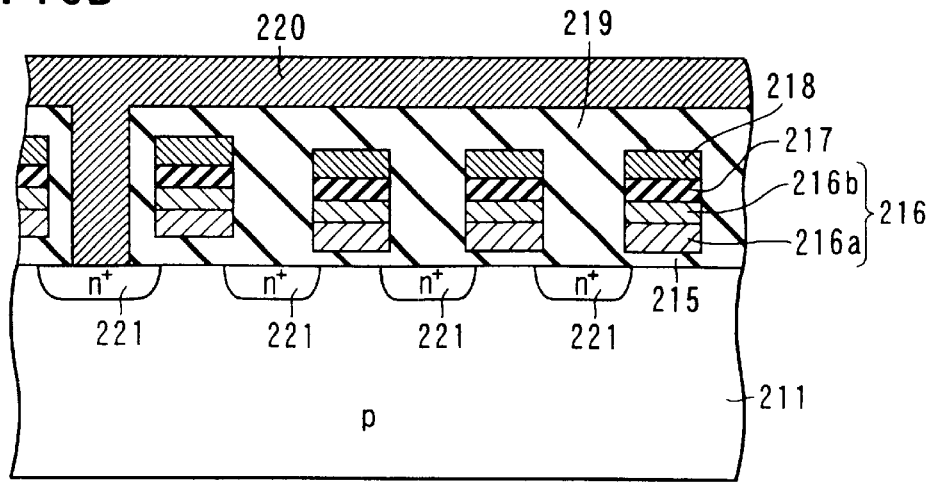
FIG. 16 is a sectional view taken along a bit line (along a line 16—16) of FIG. 14.

FIG. 14 is a plan view of a NAND EEPROM memory cell array section according to a third embodiment of the present invention. FIGS. 15A and 15B are sectional views taken along two different word lines (e.g., line 15A—15A and line 15B—15B of FIG. 14) to examine the effect of in-surface variations of the film thickness. FIG. 16 is a sectional view taken along a bit line (e.g., line 16—16 of FIG. 14).

As shown in FIGS. 14 to 16, long, narrow, rectangular (or strips of) element regions 214 are marked off by element isolating grooves 212 in a p-type silicon substrate (or a p-type well) 211. Each element isolating grooves 212 is filled with an insulating film 213 to form an STI structure.

In each element region 214, a tunnel oxide film 215 serving as a first gate insulating film is formed. On the tunnel oxide film 215, a floating gate 216 is formed in such a manner that it is isolated memory cell by memory cell. On each floating gate 216, a control gate 218 is made of a third conductive layer via a stacked insulating film (hereinafter, referred to as an ONO film) of a silicon oxide film/silicon nitride film/silicon oxide film acting as a second gate insulating film.

As shown in FIG. 14, control gates 218 are provided consecutively for memory cells formed in element regions 214 to act as word lines WL. Using the control gates 218 as a mask, ions are implanted to form source and drain diffused layers 221.

In the second embodiment, a plurality of memory cells, for example, four, eight, or sixteen memory cells, are connected in series in such a manner that adjacent memory cells share the diffused layers 221 in the individual element regions 214, thereby forming a NAND cell.

On both ends of the NAND cell, select gates 222 and 223 are located which have no floating gate and connect the NAND cell to bit lines or common source lines. Those select gate lines are arranged consecutively similarly with the word lines WL and function as select gate lines SG1 and SG2.

On the word lines WL and select gate lines SG1 and SG2, an interlayer insulating layer 219 is formed. Bit lines 220 are arranged so as to cross at right angles with word lines WL on the interlayer insulating layer.

In FIG. 16, a select gate transistor (select gate line) has the same structure as that of a memory cell except that the layer corresponding to the floating gate 216 in the memory cell is electrically connected to the layer corresponding to the control gate 218.

The floating gate 216 of each memory cell has a stacked structure of a first conductive layer 216a and a second conductive layer 216b. In the second embodiment, the first conductive layer 216a and second conductive layer 216b are both made of impurity-doped polysilicon layers. The first conductive layer 216a is formed in a self-alignment manner, with its side ends being in contact with the side ends of the element isolation insulating layer 213.

As seen from FIGS. 15A and 15B showing different word line locations, the film thickness d1 and d2 of the first conductive layer 216a are different to each other in a same surface. The difference in the film thickness results from variations in the surface finish in the process of filling the element isolation insulating film 213, which will be described later.

In any cross-section position of FIGS. 15A and 15B, the first conductive layer 216a is formed so that its surface position may coincide with that of the element isolation insulating film 213. As a result, the surface of the second conductive layer 216b formed on the top of the first conductive layer 216a is flat, regardless of the position.

The first conductive layer 216a is self-aligned with the element isolating region, whereas the second conductive layer 216b is pattered in such a manner that both ends of the layer 216b extend over the element isolation insulating film 213.

The manufacturing processes of EEPROMs according to the third embodiment will be described by reference to FIGS. 17 to 22 that are sectional views corresponding to the sectional view of FIGS. 15A or 15B.

Figure 17:
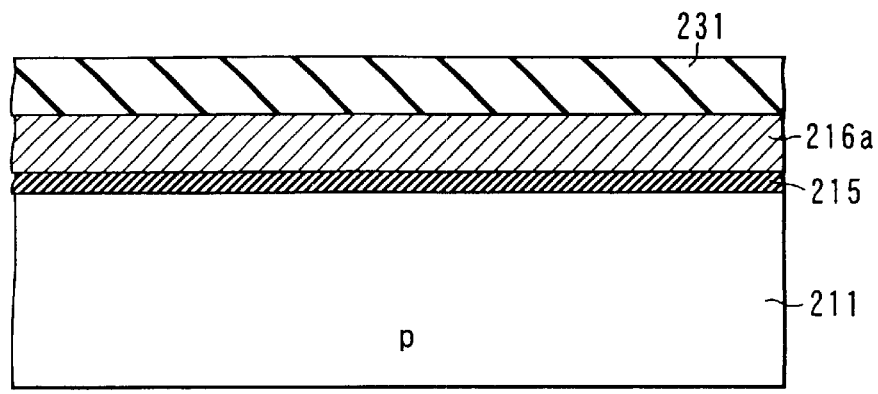
FIG. 17 is a sectional view showing the deposition of a silicon nitride film in the manufacturing steps according to the third embodiment.

As shown in FIG. 17, a tunnel oxide film 215 is formed on the surface of a p-type silicon substrate 211 by thermal oxidation. Then, on the tunnel oxide film, a first conductive layer 216a to be part of a floating gate is formed by deposition. Furthermore, on the first conductive layer 216a, for example, a silicon nitride film ($Si_3N_4$) is formed as a mask member 231 for marking off element regions.

Figure 18:
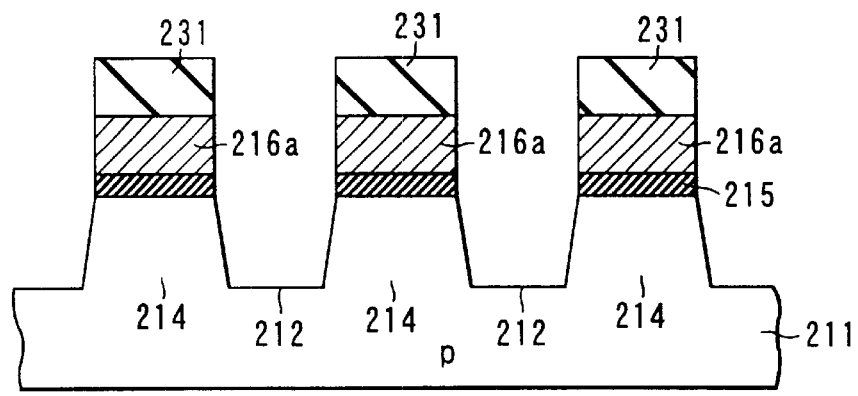
FIG. 18 is a sectional view showing the formation of element isolating grooves in the manufacturing steps according the third embodiment.

Next, as shown in FIG. 18, the mask member 231 is patterned in such a manner that the mask member is left on the element regions 214. Using the mask material 231, the first conductive layer 216a and tunnel oxide film 215 are subjected to selective etching by anisotropic etching, such as RIE. Furthermore, the substrate 211 is etched by anisotropic etching, such as RIE, thereby forming element isolating grooves 212.

Figure 19:
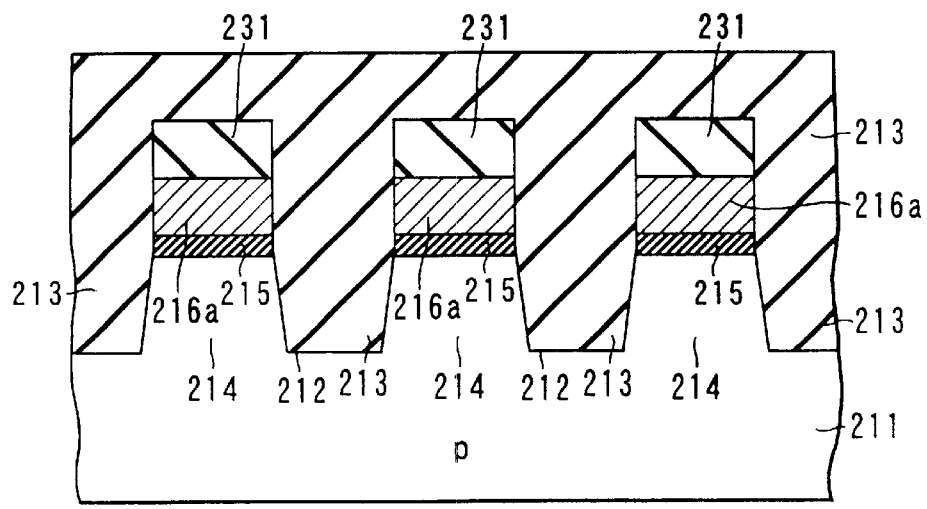
FIG. 19 is a sectional view showing the deposition of an element isolation insulating film in the manufacturing steps according the third embodiment.

Then, after the sidewalls of the element isolating grooves 212 have been cleaned, a thin insulating film (not shown), such as a silicon oxide film, is formed on the sidewalls. Then, as shown in FIG. 19, a filling insulating film 213 is formed thick on the entire surface by deposition so that it may fill the grooves 212 and cover even the mask member 31. The insulating film 213 is, for example, TEOS or BPSG.

Next, the deposited insulating film 213 and the underlining mask member 231 are etched back by CMP techniques, thereby flattening the surface. The point of the second embodiment is to perform the etching-back step in the CMP process in such a manner that the mask member 231 is removed completely and the first conductive layer 216a is left behind positively.

Figure 20A:
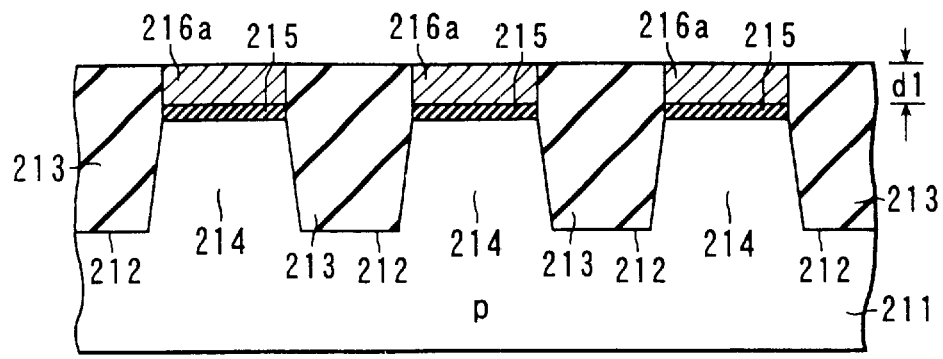
FIGS. 20A and 20B are sectional views showing the filling of the element isolation insulating film in the manufacturing steps according to the third embodiment, so as to respectively correspond to the two word lines of FIGS. 15A and 15B.
Figure 20B:
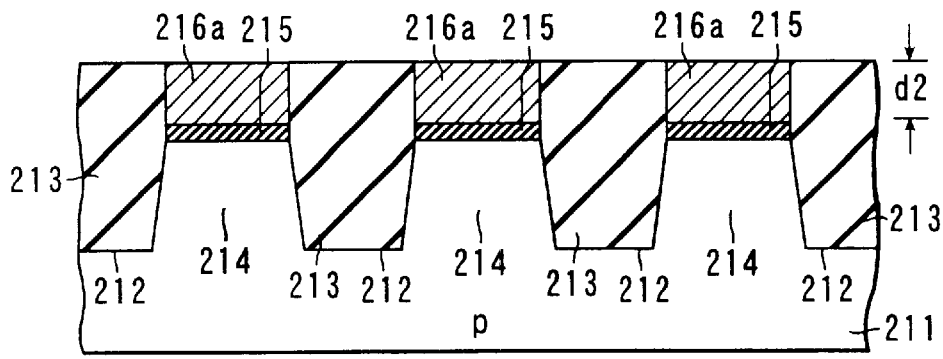

FIGS. 20A and 20B are sectional views after the etching-back step, which respectively correspond to FIGS. 15A and 15B. As shown in FIGS. 20A and 20B, the film thickness of the remaining first conductive layer 216a varies in a manner that meets d1<d2 because of variations in the filling insulating film 213, the density of the pattern, the difference in the CMP rate between materials, or variations in the surface caused by the CMP step.

In the third embodiment, the etching-back step is continued until the mask member 231 has been removed completely. As a result, as shown FIGS. 20A and 20B, the first conductive layer 216a has the surface in the same plane in which that of the filling insulating film 213 is.

Figure 21:
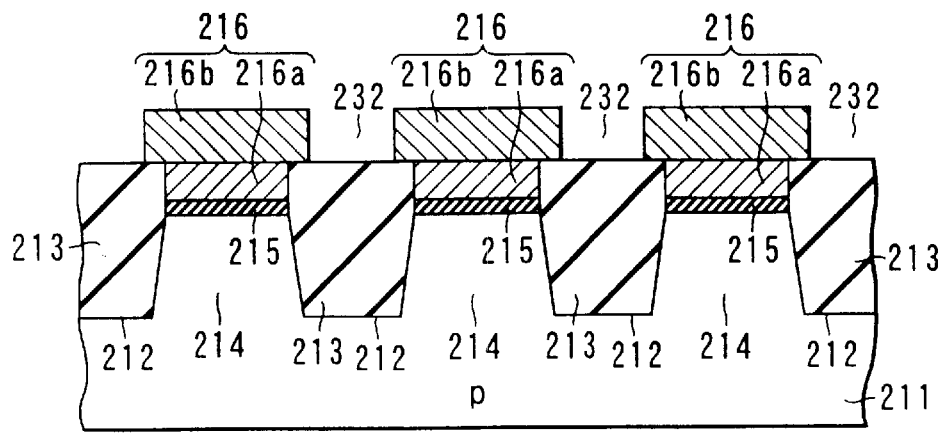
FIG. 21 is a sectional view showing the slit processing of floating gates in the manufacturing steps according to the third embodiment.

In this way, the first conductive layer 216a to be part of the floating gate and the element isolation insulating film 213 are formed in a self-alignment manner. Thereafter, as shown in FIG. 21, a second conductive layer 216b is deposited. Then, slits 232 for isolating floating gates in the direction of the word line are formed by anisotropic etching. The slits 232 are located on the element isolation insulating films 213.

Both ends of the second conductive layer 216b extend over the element isolation insulating film 213. At this stage, the first conductive layer 216a and second conductive layer 216b have not been isolated yet in the direction perpendicular to the cross section in the NAND cell.

Figure 22:
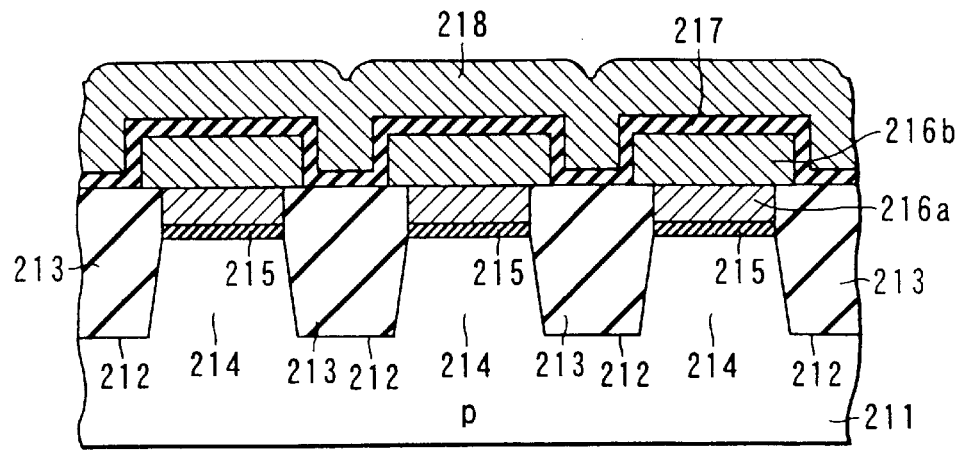
FIG. 22 is a sectional view showing the formation of control gates in the manufacturing steps according to the third embodiment.

Thereafter, as shown in FIG. 22, an ONO film 217 is formed. On the ONO film, a stacked film of an impurity-doped polysilicon film or an impurity-doped polysilicon film and a refractory metal or a refractory metal silicide is formed by deposition as a third conductive layer to serve as control gates 218 and select gates.

Then, a lithographic process (not shown) is performed. After this process, the third conductive layer, ONO film 217, second conductive layer 216b, and first conductive layer 216a are etched anisotropically, thereby patterning the control gates 218 and select gates to function as word lines and select gate lines. At the same time, the isolation of the floating gates 216 is achieved in the NAND cell.

Finally, as shown in FIGS. 15A and 15B, an interlayer insulating layer 219 is formed, contact holes are made, and bit lines 220 are formed by patterning, which completes a memory cell array.

As described above, with the third embodiment, the floating gates 216 are constructed by laying the second conductive layers 216b extending over the element isolating regions on the top of the first conductive layers 216a formed in a self-alignment manner with the element isolating regions. As a result, the top and sides of the second conductive layer 216b face a control gate 218 formed on the second conductive layer. This increases the coupling capacitance between the floating gate and control gate, as compared with the case where the floating gate is formed using only the first conductive layer 216a.

In the third embodiment, the first conductive layer 216a is formed in the same plane as that of the element isolation insulating film 213. This flattens the surface of the second conductive layer 216b stacked on the first conductive layer 216a, regardless of the position in the memory cell array. Consequently, the facing area between the floating gate 16 and control gate 218 will not vary, providing a uniform memory cell characteristic within the memory cell array.

Figure 23A:
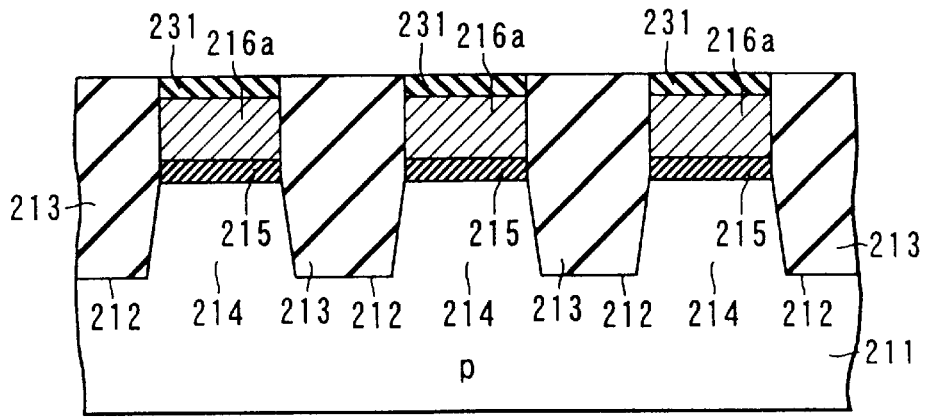
FIGS. 23A and 23B are sectional views, respectively corresponding to FIGS. 20A and 20B, in the manufacturing steps of the comparable example.
Figure 23B:
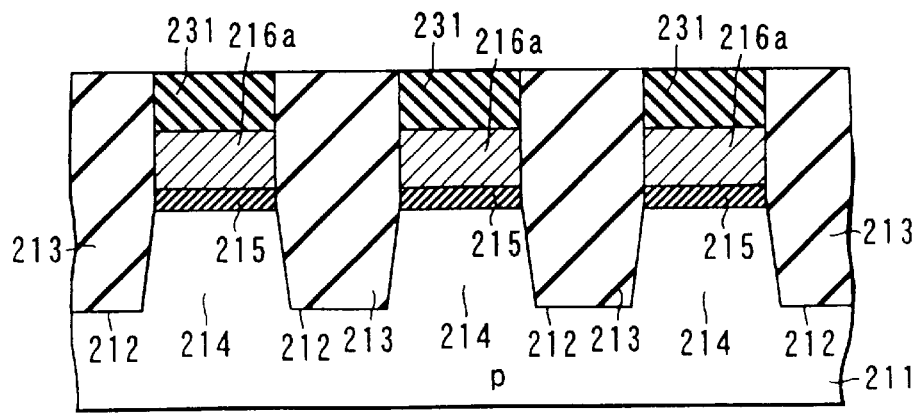

For comparison, it is assumed that the mask member 231 is used as an etching-back stopper in the etching-back step by CMP techniques and the etching-back step is ended with the mask member 231 being left behind. FIGS. 23A and 23B are sectional views corresponding to those of FIGS. 20A and 20B. As shown in the figures, variations in the surface by the CMP method cause the film thickness of the remaining mask member 231 to vary with the position.

In this state, when the mask member 231 is etched away, the depth of the formed holes, that is, the depth of the surface of the first conductive layer 216a from the surface of the element isolation insulating film 213 varies from position to position.

Figure 24A:
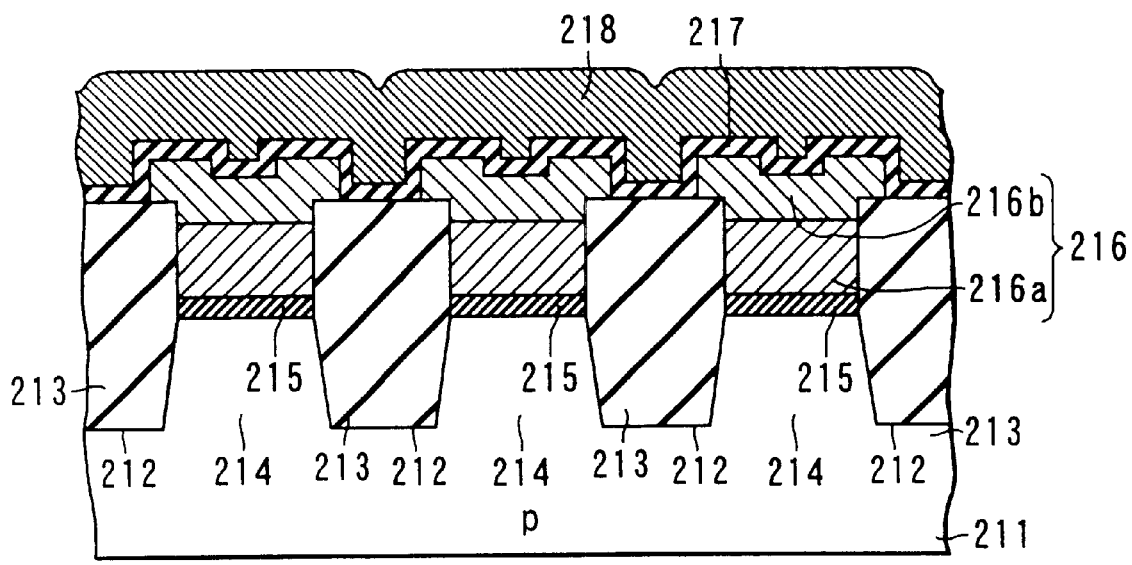
FIGS. 24A and 24B are sectional views showing the formation of control gates in the manufacturing steps in the comparable example so as to respectively correspond to FIGS. 23A and 23B.
Figure 24B:
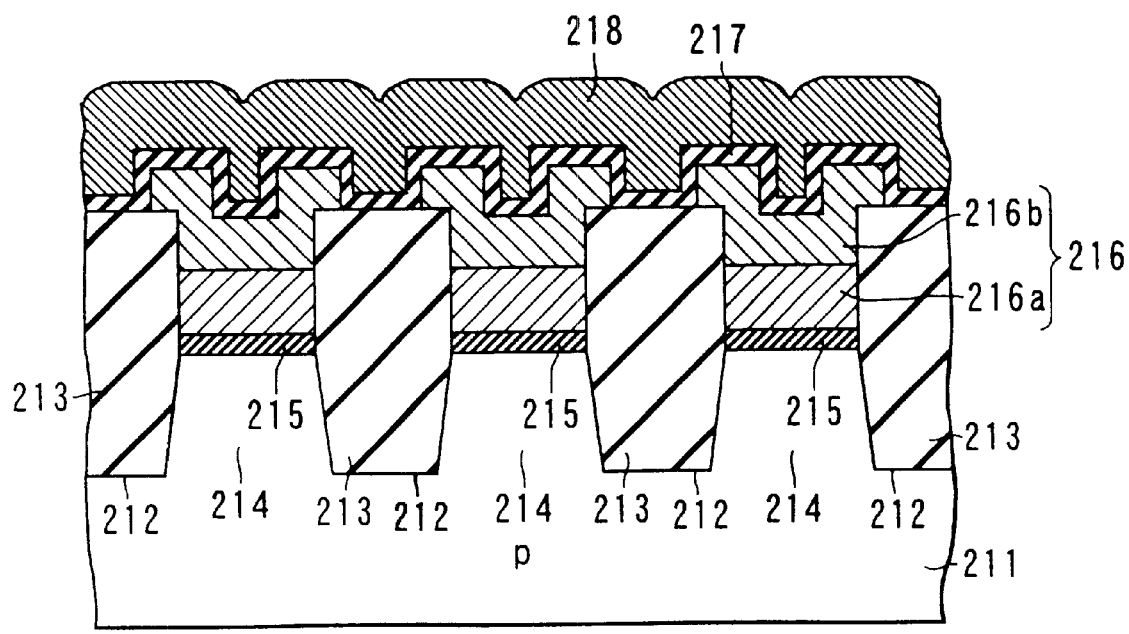

Thereafter, the control gates 218 are formed in the same processes as those in the second embodiment. FIGS. 24A and 24B are sectional views corresponding to those of FIGS. 23A and 23B, respectively. The steps (unevenness) at the surface of the second conductive layer 216b vary from position to position. Consequently, the coupling capacitance between the floating gate 216 and control gate 218 varies within the memory cell array.

When steps are present at the surface of the floating gate 216, use of, for example, a polycide film by a spattering method with a poor step coverage as a third conductive layer on the floating gate can contribute to cracks in the steps or an increase in the resistance. In the third embodiment, the flat surfaces of the floating gates 216 prevent such problems.

In the third embodiment, the first conductive layer 216a is forced to be in the same plane as that of the element isolation insulating film 213 in the CMP process and, in this state, the next process is started. The surfaces of the element isolation insulating films 213 may be recessed by wet etching before the next process is started.

Figure 25A:
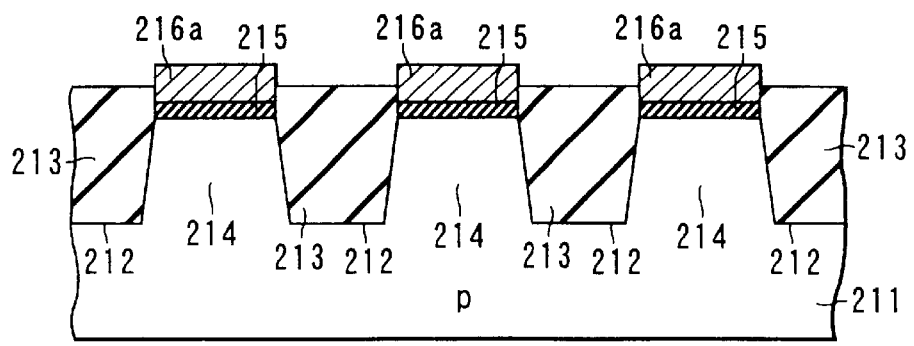
FIGS. 25A and 25B are sectional views, respectively corresponding to FIGS. 20A and 20B, in the modification of the third embodiment.
Figure 25B:
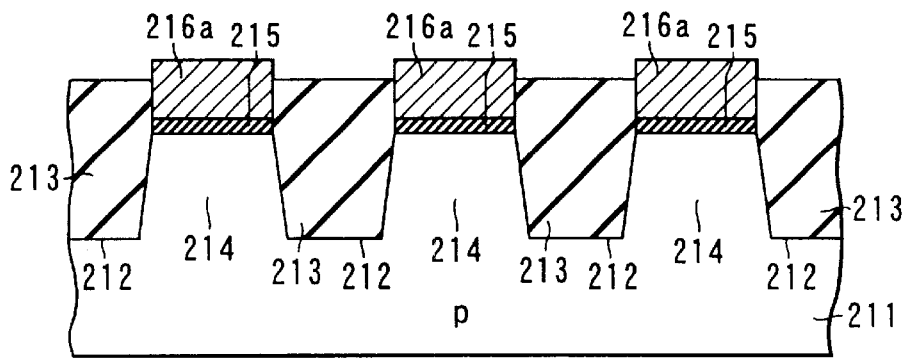

FIGS. 25A and 25B are sectional views corresponding to those of FIGS. 20A and 20B, respectively. The positions of the surfaces of the element isolation insulating films 213 recessed by wet etching hardly vary, which allows the difference in height between the surface of the first conductive layer 216a and that of the element isolation insulating film 213 to be kept constant in the memory cell array.

Consequently, when control gates are then formed via the ONO film, the coupling capacitance between the floating gate and the control gate does not vary in the plane as in the second embodiment.

In the third embodiment, even when variations in the surface have taken place in the CMP process for filling element isolation insulating films, the facing area between the floating gate and control gate in the two-layer conductive layer structure is made constant by etching back the silicon nitride film used as the mask member until it is removed completely.

In the following embodiment, however, forming an etching-back stopper beforehand in a substrate suppresses variations in the surface in the CMP process, which achieves similar effect.

(Fourth Embodiment)

Hereinafter, a fourth embodiment of the present invention will be explained. The parts corresponding to those in the third embodiment will be indicated by the same reference symbols and detailed explanation of them will not be given.

Figure 26:
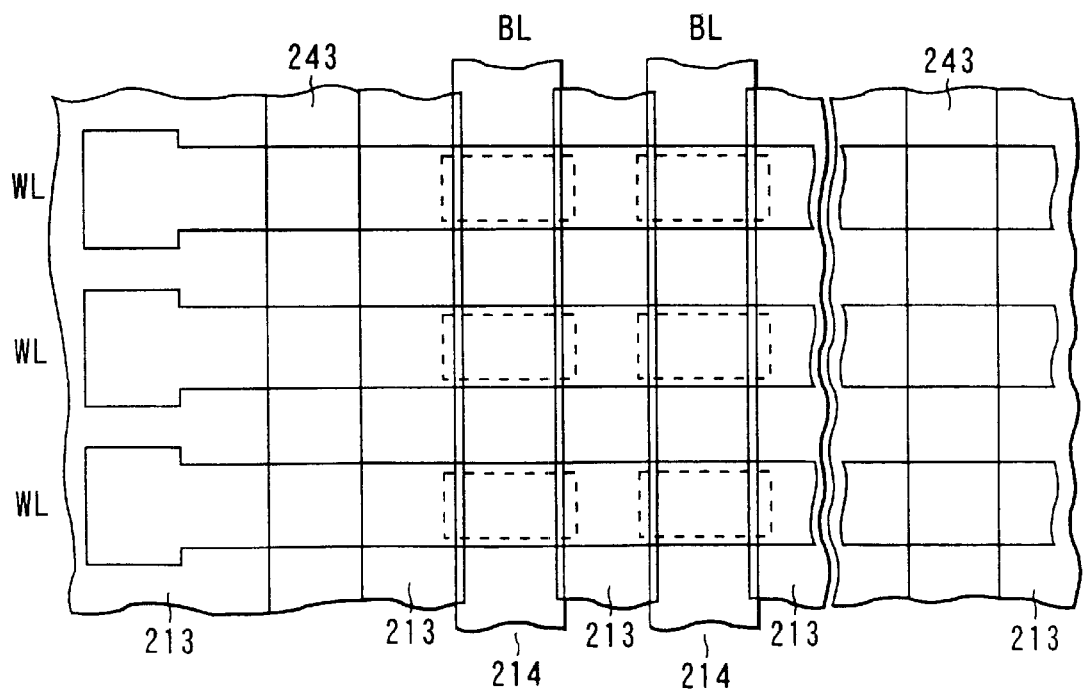
FIG. 26 is a schematic plan view of a NAND EEPROM memory cell array region according to a fourth embodiment of the present invention.

In FIG. 26, dummy element regions 243 are arranged at both ends of word lines of a NAND EEPROM memory cell array. As explained above, element isolation insulating films 213 mark off element regions 214 in a memory cell array area. At both ends of the word lines of the memory cell array, dummy element regions 243 in which any element is not actually formed are generally provided to assure the uniformity of the finish of the memory cell array. In the fourth embodiment, an etching-back stopper member is formed in the dummy element regions 243 by patterning beforehand.

Figure 27:
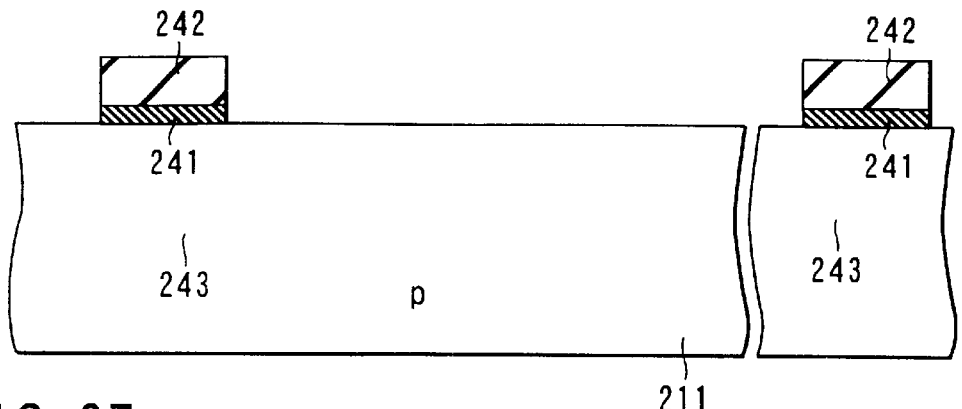
FIG. 27 is a sectional view to help explain the step of forming a stopper member in the manufacturing steps according to the fourth embodiment.

FIGS. 27 to 33 are sectional views taken along a certain word line WL of FIG. 26 to help explain the manufacturing steps. As shown in FIG. 27, on a p-type silicon substrate 211, a stopper member 242 is formed by patterning via a silicon oxide film 241 in such a manner that it covers the dummy element regions 243 of FIG. 26.

The stopper member 242 may be an insulating material or conductive material whose etching back rate is lower than that of the element isolation insulating is film 213 or a first conductive layer 216a to be part of a floating gate. For example, the stopper member may be made of not only such an insulating film as a silicon nitride film, a silicon carbide (SiC) film, or an alumina (Al$_2$O$_3$) film but also such a conductive material as a refractory metal, refractory metal silicide or polycide obtained by laminating refractory metal silicide to polysilicon. In the fourth embodiment, the mask member 242 is a silicon nitride film. The film thickness of the stopper material 242 is determined to be a film thickness to which a first conductive layer 216a formed later is required to be left.

Figure 28:
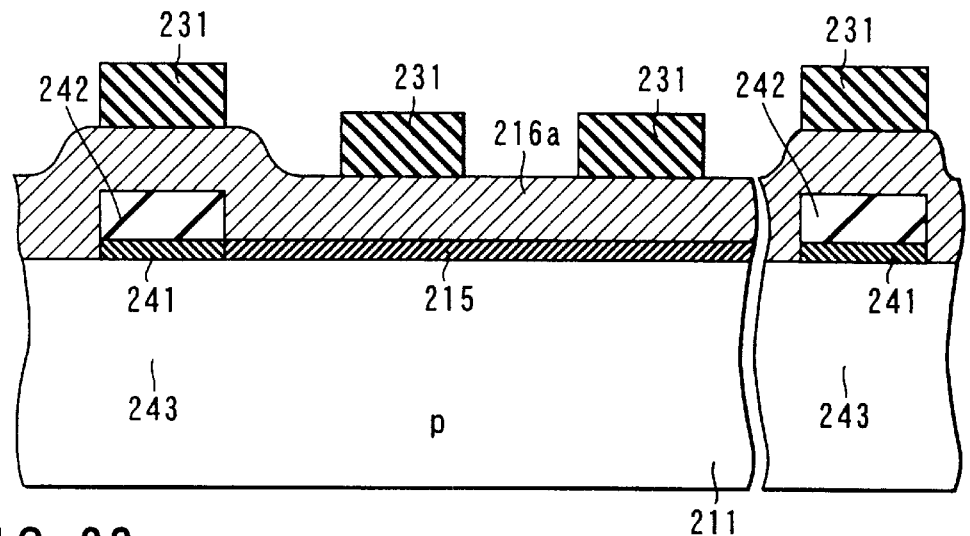
FIG. 28 is a sectional view showing the patterning of a silicon nitride film mask member in the manufacturing steps according to the fourth embodiment.
Figure 29:
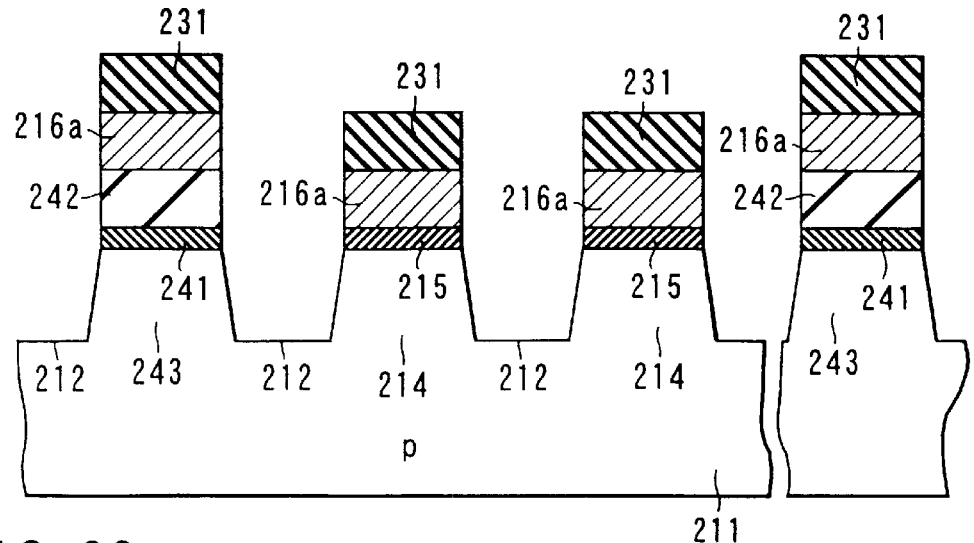
FIG. 29 is a sectional view showing the formation of element isolating grooves in the manufacturing steps according to the fourth embodiment.
Figure 30:
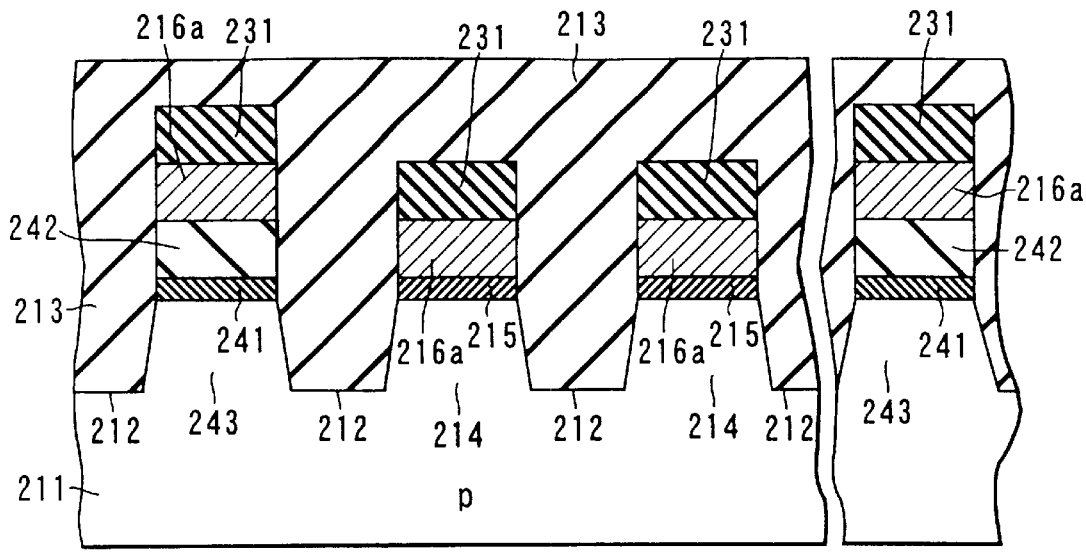
FIG. 30 is a sectional view showing the deposition of an element isolation insulating film in the manufacturing steps according to the fourth embodiment.

Thereafter, as in the third embodiment, a tunnel oxide film 215 and a first conductive layer 216a are formed. On the first conductive layer, a mask member 231 is formed by patterning (FIG. 28). Then, the first conductive layer 216a is patterned to form element isolating grooves 212 (FIG. 29). Thereafter, an element isolation insulating film 213 is deposited (FIG. 30).

Figure 31:
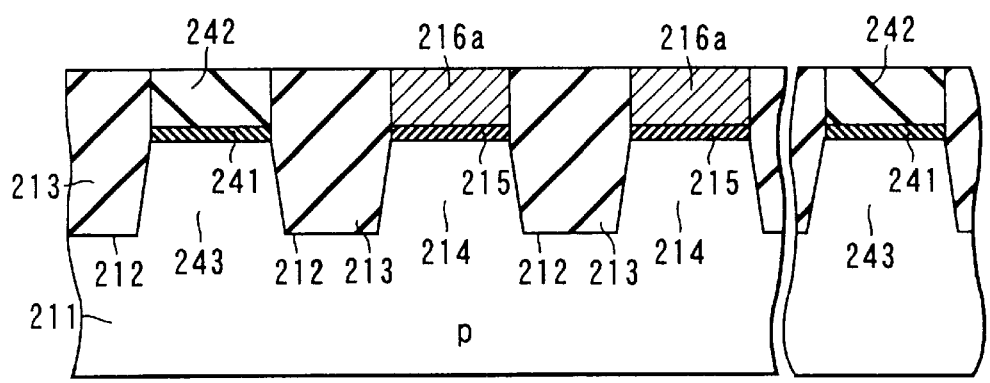
FIG. 31 is a sectional view showing the filling of an element isolation insulating film in the manufacturing steps according to the fourth embodiment.

Next, the mask member 231 is removed and a CMP process is continued until the stopper member 242 has been exposed (FIG. 31). The presence of the stopper materials 242 provided on both ends of word lines assures the uniformity of the etching back of the memory cell array. The first conductive layer 216a is formed to have almost the same film thickness as that of the stopper member 242 and is in the same plane as that of the element isolation insulating film 213.

Figure 32:
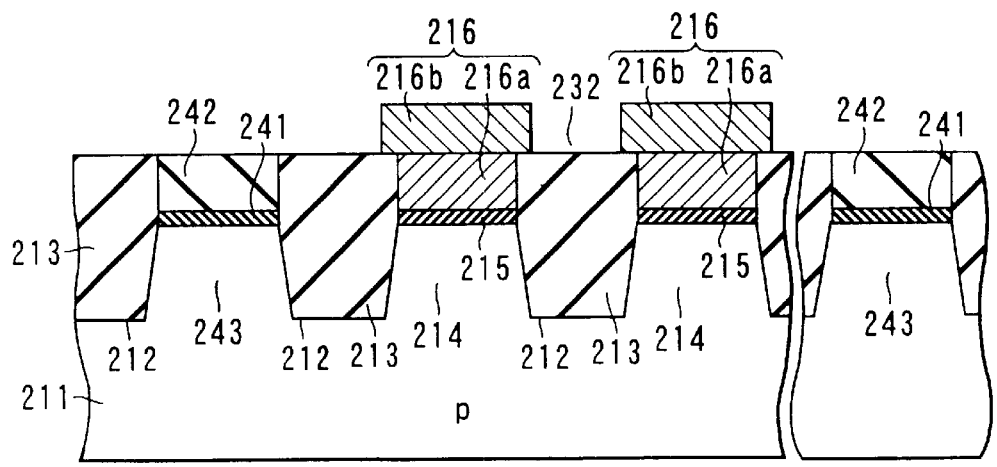
FIG. 32 is a sectional view showing the slit processing of floating gates in the manufacturing steps according to the fourth embodiment.
Figure 33:
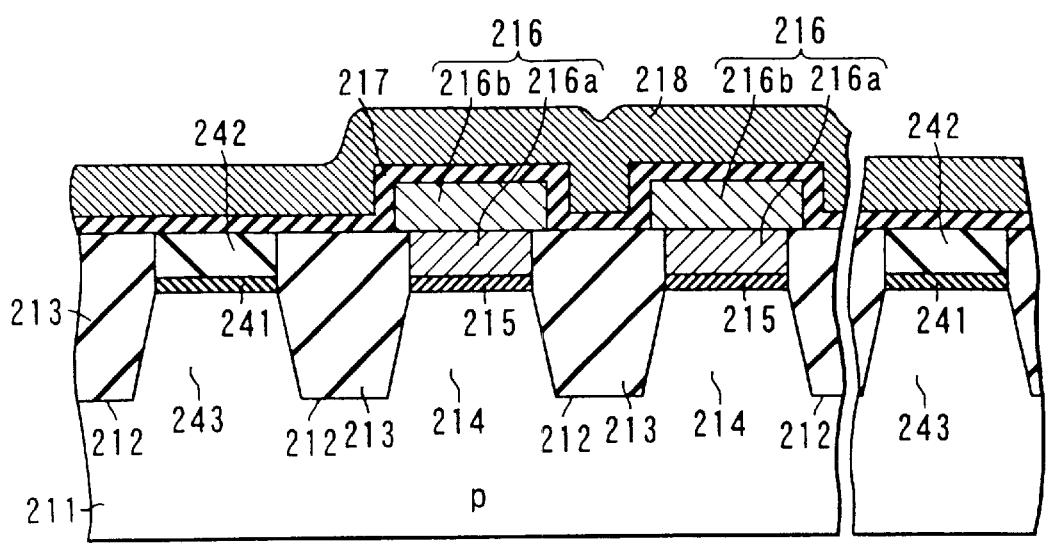
FIG. 33 is a sectional view showing the formation of the control gates in the manufacturing steps according to the fourth embodiment.

Thereafter, as in the third embodiment, after a second conductive layer 216b has been formed, slits 232 are made (FIG. 32). Then, after an ONO film 217 has been formed, control gates 218 are formed from a third conductive layer (FIG. 33). The stopper member 242 is preferably left as a sacrificed pattern to keep the flatness of the dummy element region 243. The stopper member may be removed.

Figure 34:
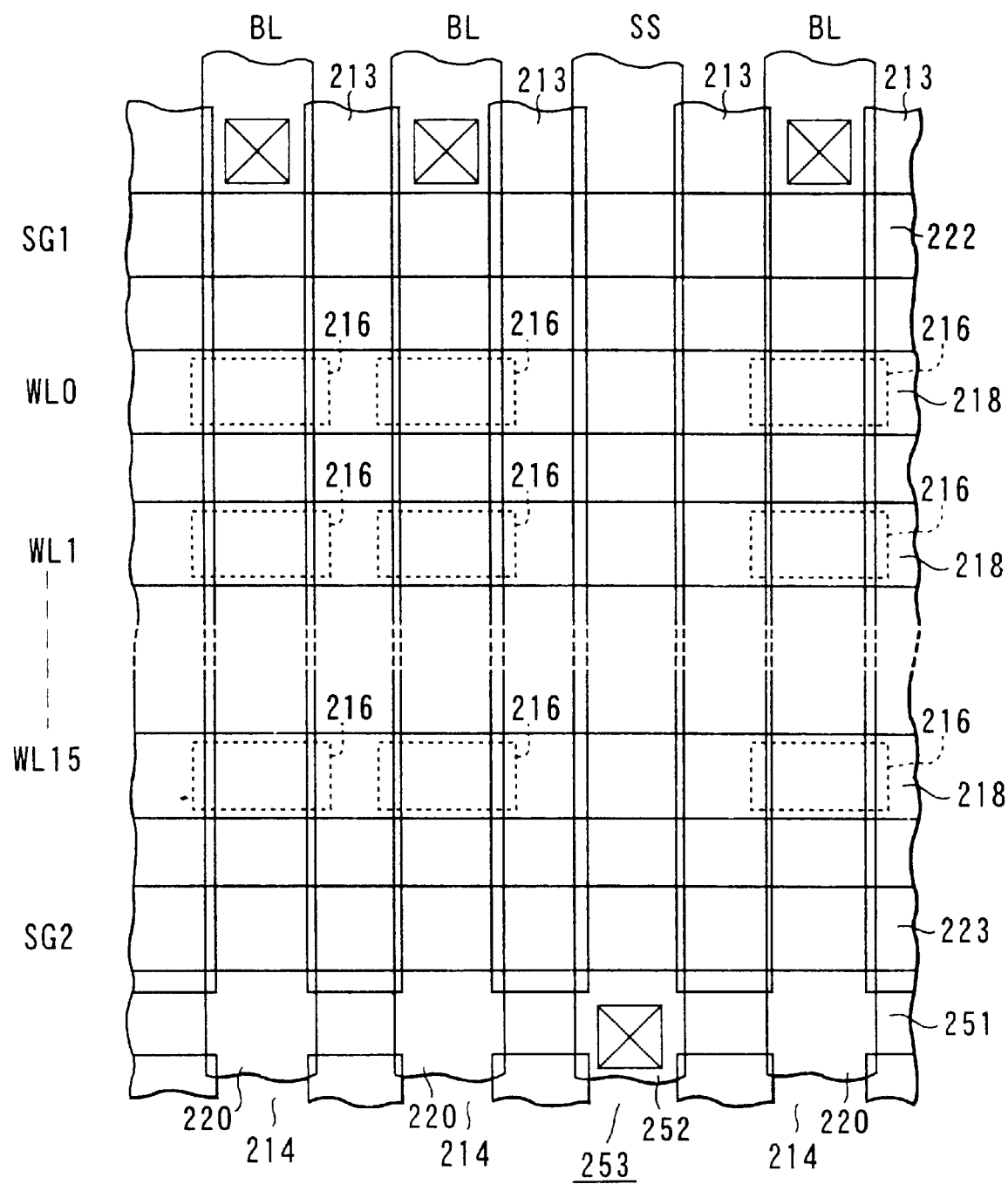
FIG. 34 is a schematic plan view of a NAND EEPROM memory cell array region according to another modification of the fourth embodiment.

The desirable place in which the pattern of the stopper member 242 is placed is not limited to the dummy element regions. As shown in FIG. 34, in the NAND EEPROM memory cell array area, a common source line (SS) 252 is provided every a certain number of bit lines 220. The stopper member 242 may be formed in the common source line region.

Each common source line 252 is an interconnection that connects to the common source region 251 of a NAND block containing NAND cells. Although the wiring region of the common source line 252 is formed inside the element region, it just serves as a transit wiring region 253 in which no memory cell is not to be formed under the interconnection. When the stopper member 242 is formed by patterning beforehand in the transit wiring region 253 as in the third embodiment, this helps improve the uniformity of the surface in the CMP process.

Using a silicon nitride film for both the stopper member 242 and the mask member 231 eliminates the selectivity of etching between them. Accordingly, for example, when a silicon nitride film is used as the stopper member 242, another material, such as a silicon oxide film, may be used as the mask member 231. The element isolation insulating film is made of a silicon oxide film.

It is preferable that the stopper member 242 includes the dummy element region 243 and transit wiring region 253 and is distributed uniformly in the memory cell array area, which provides a higher uniformity in the CMP process.

The stopper member 242 may be provided not only in the memory cell array area but also in a peripheral circuit region formed around the memory cell array. In this case, one of the aforementioned conductive materials may be used as a gate electrode material for the MOS transistor and further as a stopper member.

Figure 35:
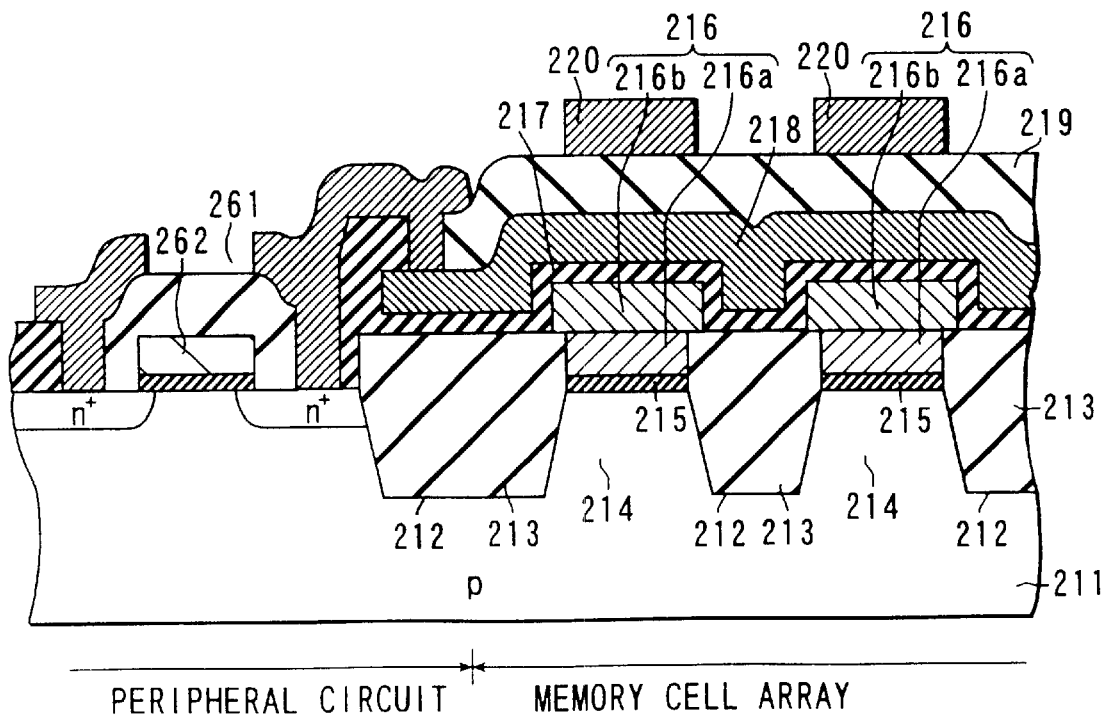
FIG. 35 is a sectional view of a NAND EEPROM memory cell array region and peripheral circuit according to another modification of the fourth embodiment.

FIG. 35 shows a modification of the fourth embodiment where the gate electrodes 262 of the MOS transistors 261 in the word-line driving circuit connected to the control gates 218 acting as the word lines WL is used as a stopper member.

The word-line driving MOS transistors 261 are arranged in such a manner that they correspond to the word line ends in the memory cell array. Therefore, using the gate electrodes 262 as the etching-back stopper member increases the uniformity of the CMP etching back of the memory cell array.

Use of many of the gate electrodes of the MOS transistors in the peripheral circuit as well as the word-line driving circuit produces a greater effect.

In the fourth embodiment, the width of a slit 232 is set to the minimum processing dimension in the process of making slits 232 for isolating the floating gates 216 in FIG. 21. With this setting, to make slits 232 in such a manner that the second conductive layer 216b is so left that it has a larger width than that of the first conductive layer 216a, the width of the element isolating groove 212 has to be made larger than the minimum processing dimension, which imposes a limitation on the miniaturization in the direction of the word line.

In contrast, if the minimum processing dimension in the direction of the word line is set to the width of the element area 214 and the pitch is fixed, the width of the element isolating groove 212 will be determined accordingly. For example, if the width of the element region 214 is 0.4 μm and the pitch is 1.0 μm, the element isolation width will be 0.6 μm. If the slit is 0.4 μm in width and the misalignment in exposure techniques is 0.1 μm at maximum, the minimum element isolation width needed to form a slit on an element isolating region will be 0.6 μm. Accordingly, if the width of the element isolating width is set to the minimum processing dimension, a slit cannot be made on the element isolating region by a conventional method.

An embodiment of the present invention that solves the above problem and miniaturizes the memory cell array will be explained below.

(Fifth Embodiment)

Figure 36:
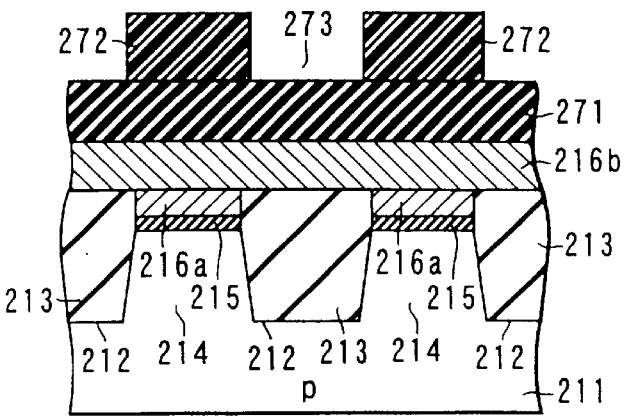
FIG. 36 is a sectional view to help explain the slit processing step of floating gates according to a fifth embodiment of the present invention.
Figure 37:
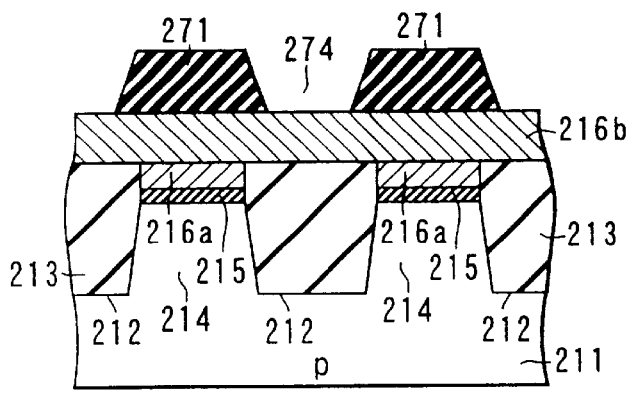
FIG. 37 is a sectional view to help explain the mask member patterning step in the manufacturing steps, according to the fifth embodiment.
Figure 38:
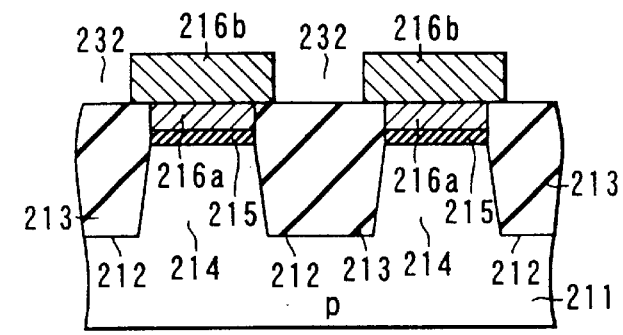
FIG. 38 is a sectional view showing the slit processing of floating gates in the manufacturing steps according to the fifth embodiment.

FIGS. 36 and 37 show the process of pattering a second conductive layer 216b according to a fifth embodiment of the present invention. By similar steps to those in the fourth embodiment, after the second conductive layer 216b has been deposited, for example, a silicon nitride film is formed as an etching mask member 271 as shown in FIG. 36. Then, a photoresist 272 is applied onto the silicon nitride film. In an exposure process, a slit width opening 273 with the minimum dimension is formed by patterning. Thereafter, as shown in FIG. 37, the mask member 271 is tapered by dry etching, such as RIE techniques under taper etching conditions. As a result, the bottom of the opening 274 transferred to the mask member 271 has a smaller width than that of the opening 273 in the resist 272. With the tapered mask material as an etching mask, the second conductive layer 216b is dry-etched to peel the mask member 271, which ends the process of making slits in the second conductive layer 216b as shown FIG. 38.

Figure 39:
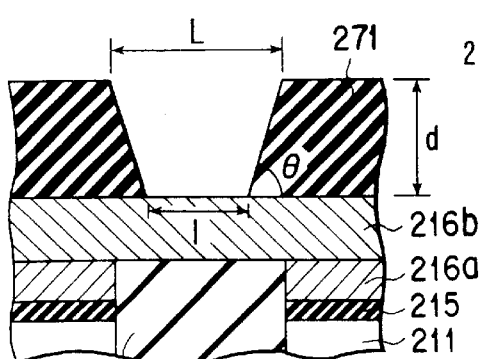
FIG. 39 is a sectional view showing control parameters in the manufacturing steps according to the fifth embodiment.

In the fifth embodiment, the important parameters to obtain the desired slit width are the film thickness d of the mask member 271 and the taper angle θ as shown in FIG. 39. The relationship between the bottom opening width l (i.e., the slit width) and top opening width L of the mask member 271 is expressed as:

$l = L - 2d/\tan\theta$

That is, to control the slit width accurately, it is necessary to control the parameters d and θ.

Another method of obtaining a slit width equal to or smaller than the minimum processing dimension is to form a mask member twice. Specifically, a first mask material is patterned by an ordinary process. Then, a second mask member is deposited. By leaving the second mask member on the sidewalls of the first mask member, openings for producing a small slit width are made.

This method has the disadvantages that it requires the mask member forming process twice and variations in the slit dimensions are difficult to control in the technique for leaving the mask material on the sidewalls. To stop etching completely at the surface of the underlying conductive layer in etching the first mask member, the etching selectivity of the mask member to the underlying conductive layer has to be sufficiently large. Ordinary etching has the disadvantage that a step is formed in the conductive layer. Use of the above-described taper etching eliminates such a disadvantage.

In the process of etching the second conductive layer 216b in the state of FIG. 37, when the etching selectivity of the mask material 271 to the second conductive layer 216b is set small to cause the opening end of the mask member 271 to be recessed as etching is effected, the opening of the slit made in the second conductive layer 216b is tapered.

Figure 40:
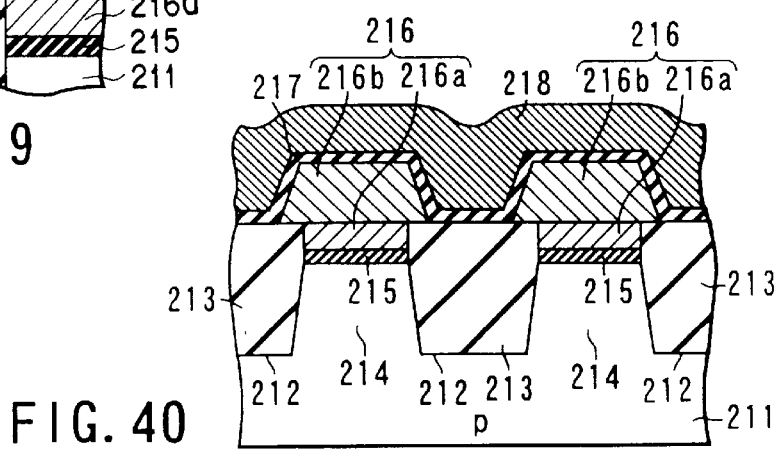
FIG. 40 is a sectional view showing the formation of control gates in a modification of the manufacturing process according to the fifth embodiment.

FIG. 40 shows an example where the second conductive layer 216b is tapered as described above and a control gate 218 is formed on the tapered second conductive layer via an ONO film 217. Tapering the isolating slit of the floating gate 216 decreases the effective film thickness of the ONO film 217 on the sidewalls, as compared with that on the vertical sidewalls of the floating gate 216. This means that when the stacked structure of the control gate 218, ONO film 217, and floating gate 216 is patterned, the amount of overetching for complete removal of the ONO film 217 can be made smaller and therefore a decrease in the film thickness of the element isolation insulating film 213 is suppressed in the etching process.

While in the fifth embodiment, the explanation has been given using a NAND EEPROM, the present invention is not limited to this. For instance, the invention may be applied to a NOR EEPROM where individual memory cells have to be isolated from each other.

As described above, with the present invention, it is possible to provide an EEPROM capable of increasing the coupling capacitance between the floating gate and the control gate by an improved self-alignment trench isolating method and of decreasing variations in the memory cell characteristics due to variations in the surface in the process of etching back the element isolation insulating film by the self-alignment trench isolating method. It is also possible to provide a method of manufacturing such EEPROMs.

(Sixth Embodiment)

Hereinafter, a sixth embodiment of the present invention will be explained. The parts as those in the first embodiment are indicated by the same reference symbols.

The objective of the sixth embodiment is to form memory cell transistors and select gate transistors while giving a sufficient processing margin to the STI regions in a memory cell array. Specifically, when the select gate transistors are formed, a decrease in the film thickness occurring near the select gate lines extending in the direction in which the word lines in the STI regions 2 extend is suppressed.

Figure 41A:
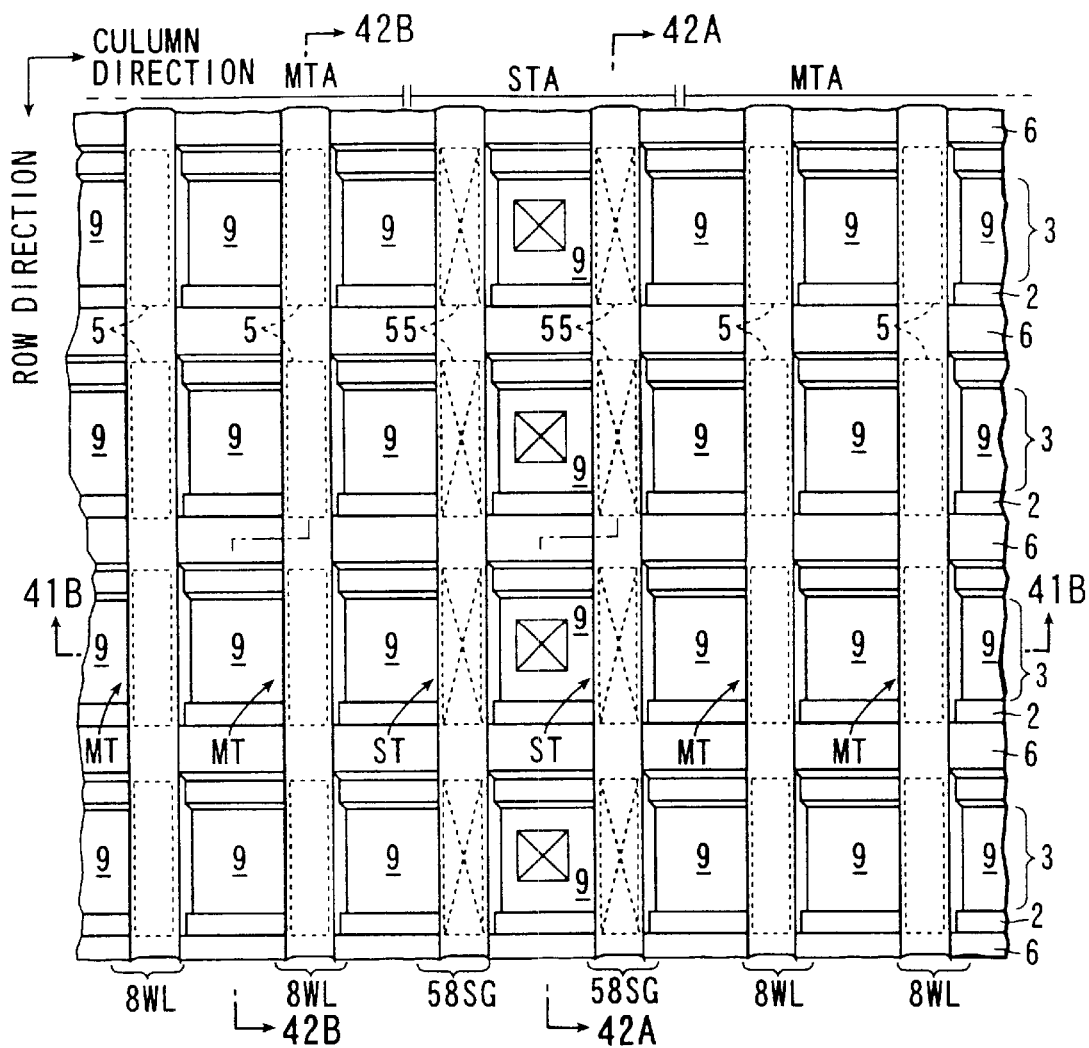
FIG. 41A is a schematic plan view of a NAND EEPROM memory cell array according to a sixth embodiment of the present invention.
Figure 41B:
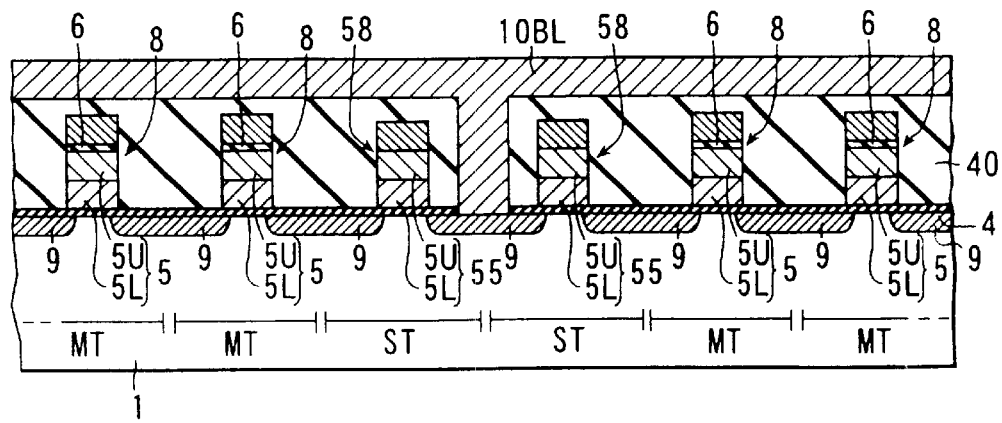
FIG. 41B is a sectional view taken along a line 41B—41B of FIG. 41A.
Figure 42A:
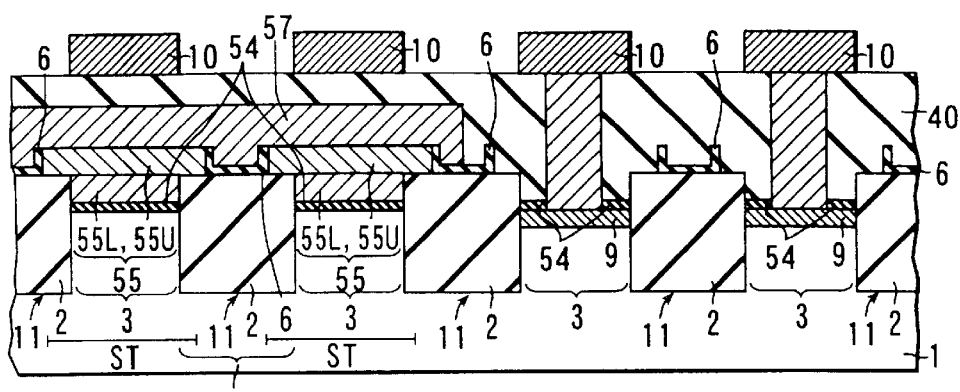
FIG. 42A is a sectional view taken along a line 42A—42A of FIG. 41A.
Figure 42B:
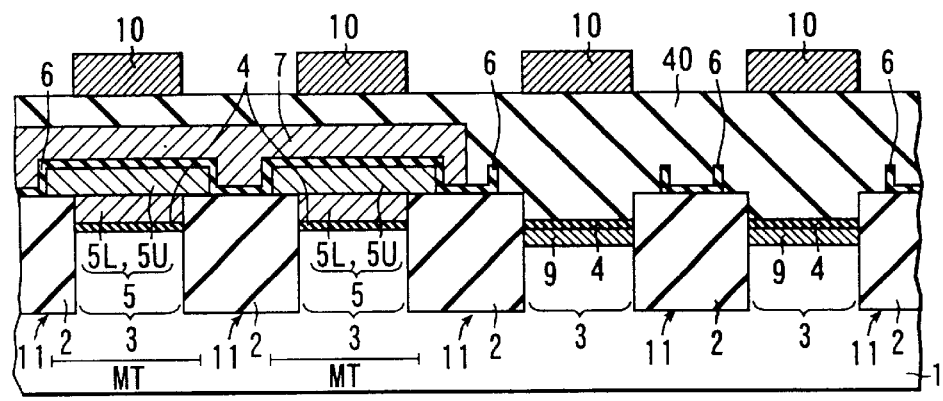
FIG. 42B is a sectional view taken along a line 42B—42B of FIG. 41A.

FIG. 41A is a schematic plan view of a NAND EEPROM memory cell array according to the sixth embodiment of the present invention. FIG. 41B is a sectional view taken along a line 41B—41B of FIG. 41A. FIG. 42A is a sectional view taken along a line 42A—42A of FIG. 41A. FIG. 42B is a sectional view taken along a line 42B—42B of FIG. 41A. In FIG. 41A, bit lines (BL) are not shown.

As shown in FIGS. 41A, 41B, 42A, and 42B, each memory cell transistor MT has a similar structure to that in the first embodiment. Each select transistor ST has a structure similar to that of the transistor MT. Specifically, the transistor ST is constructed of a stacked structure of a gate member 55 isolated for each transistor ST and a select gate line 57 electrically connected to the gate member 55.

Like the floating gate 5, the gate member 55 has a two-layer structure of an upper layer section 55U and a lower layer section 55L and is formed on an active region 3 via a gate oxide film 54. An ONO film 6 is removed particularly at the top portion of the gate member 55. The gate member 55 is electrically connected to the select gate line 57 on the active region 3. The select gate line 57 is made of the same conductive film as that of the word line 7. The select gate lines 57 are formed in parallel with the word lines 7. Hereinafter, the stacked structure of the select gate line 57 and the isolated gate member 55 is referred to as a stacked gate 58.

Furthermore, on the STI regions 2, the ONO film 6 is left along a slit 21 (see FIG. 44) for cutting off the floating gates 5 and gate members 55. The ONO film 6 on the STI region 2 suppresses a decrease in the film thickness of the STI region 2 during the formation of the staked gates 8 and 58.

On the STI region 2 between the gate members 55 indicated by reference numeral 52 in FIG. 42A, the ONO film 6 is left behind. The ONO film 6 between the gate members 55 suppresses a decrease in the film thickness of the STI region 2 when the ONO film 6 is removed from the select transistor formation are STA and when the stacked gate are formed. Its detailed explanation will be given later. Reference symbol "MTA" indicates the memory cell transistor formation region.

The effect of the NAND EEPROM according to the sixth embodiment will be described by reference to a second comparable example and a basic structure of the sixth embodiment.

In the second comparable example and the basic structure of the sixth embodiment, memory cell transistors similar to those in the first embodiment are used. Namely, the second comparable example and the basic structure of the sixth embodiment correspond to modifications of the first embodiment, where the structure of the select transistor has been disclosed. Like the first to sixth embodiments, the second comparable example is related to a NAND EEPRM of the present invention, though it is referred as "comparable" for convenience sake.

Figure 43:
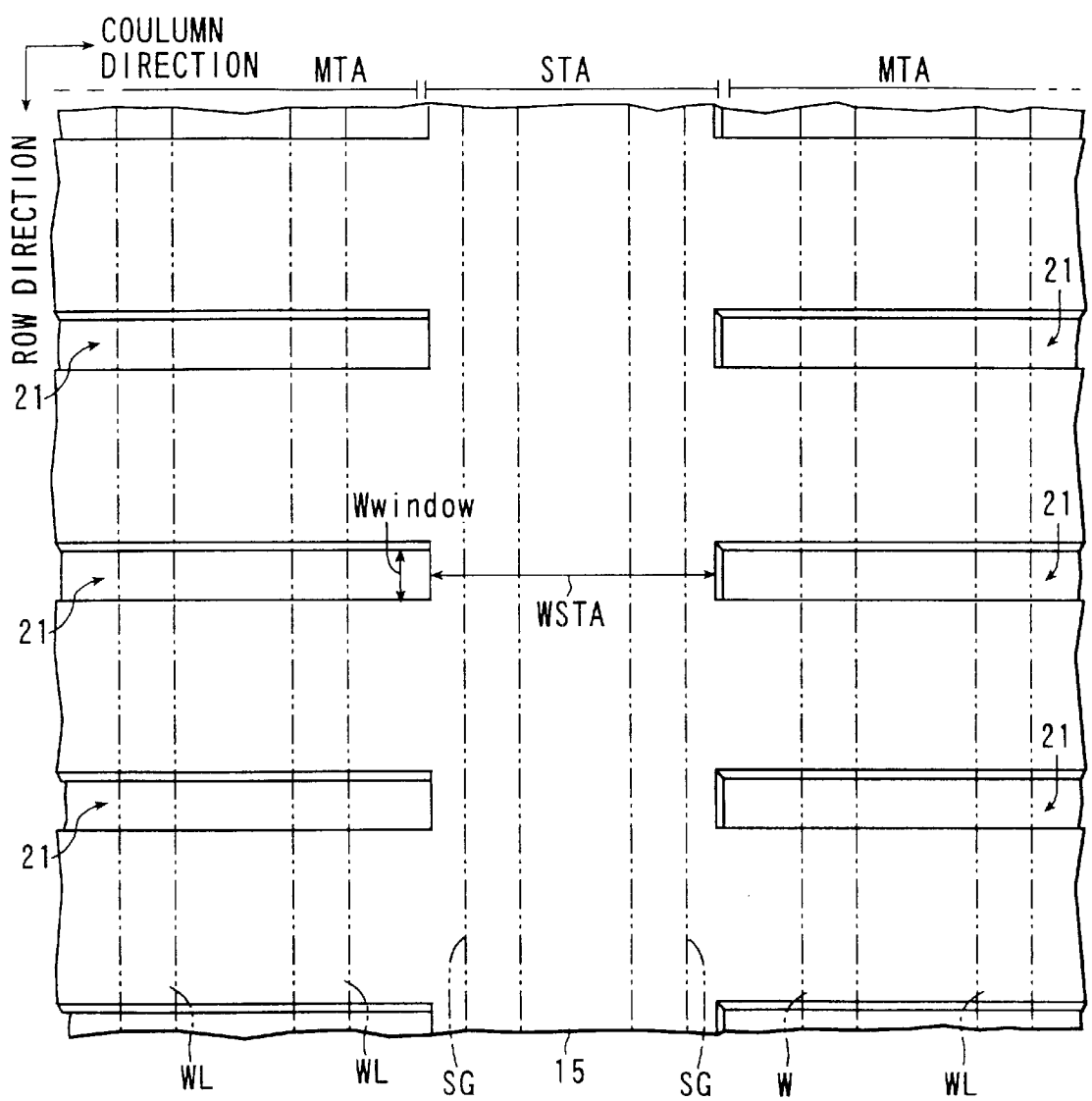
FIG. 43 is a schematic plan view of a NAND EEPROM in slit processing according to a second comparable example of the present invention.

FIG. 43 is a schematic plan view of a NAND EEPROM according to the second comparable example during the formation of slits.

As shown in FIG. 43, in the second comparable example, the slits 21 are not made in the regions "STA" but formed consecutively later of a polysilicon film 15 in the direction of the row. This eliminates the necessity of electrically connecting the polysilicon film 15 to the polysilicon film formed in parallel with the word lines (not shown) for each select gate transistor ST. The polysilicon film 15 has only to be connected to the polysilicon formed in parallel with the word lines via contacts in a memory cell array.

With the structure of the second comparable example, as the memory cell array is miniaturized further, more complex lithography is needed in forming the slits 21. Specifically, slits distributed in a matrix are more difficult to form in a photoresist in the memory cell array.

When the slits 21 are made, a line pattern is repeated in area STA and a line pattern and a space pattern are repeated in area MTA (hereinafter, referred to as a line & space pattern). In such a complex pattern, the column direction dimension conversion difference often differs from the row direction dimension conversion difference in lithography or etching. This results in a decrease in the dimension control margin. The control of the dimensions of the polysilicon film 15 to be left in area STA is particularly more difficult.

In the second comparison example, it is necessary to connect the polysilicon film 15 via contact holes to the polysilicon film formed in parallel with the word lines (not shown) to form select gate lines. In this case, the wiring resistance of the select gate lines depends on the number of contacts per select gate line. The reason for this is that the polysilicon film 15 is a material constituting the floating gates and has a higher sheet resistance than that of the polysilicon film 17 (FIG. 9G).

The large wiring resistance of the select gate lines increases the delay of the signal in a write or read operation, making a high-speed operation more difficult. For this reason, in the second comparable example, it is not practical to reduce the number of contact holes in the polysilicon film 15. Naturally, the contact holes in the memory cell array prevents the memory cell array from being miniaturized more.

It is a basic structure of the sixth embodiment that can solve such a problem.

Figure 44:
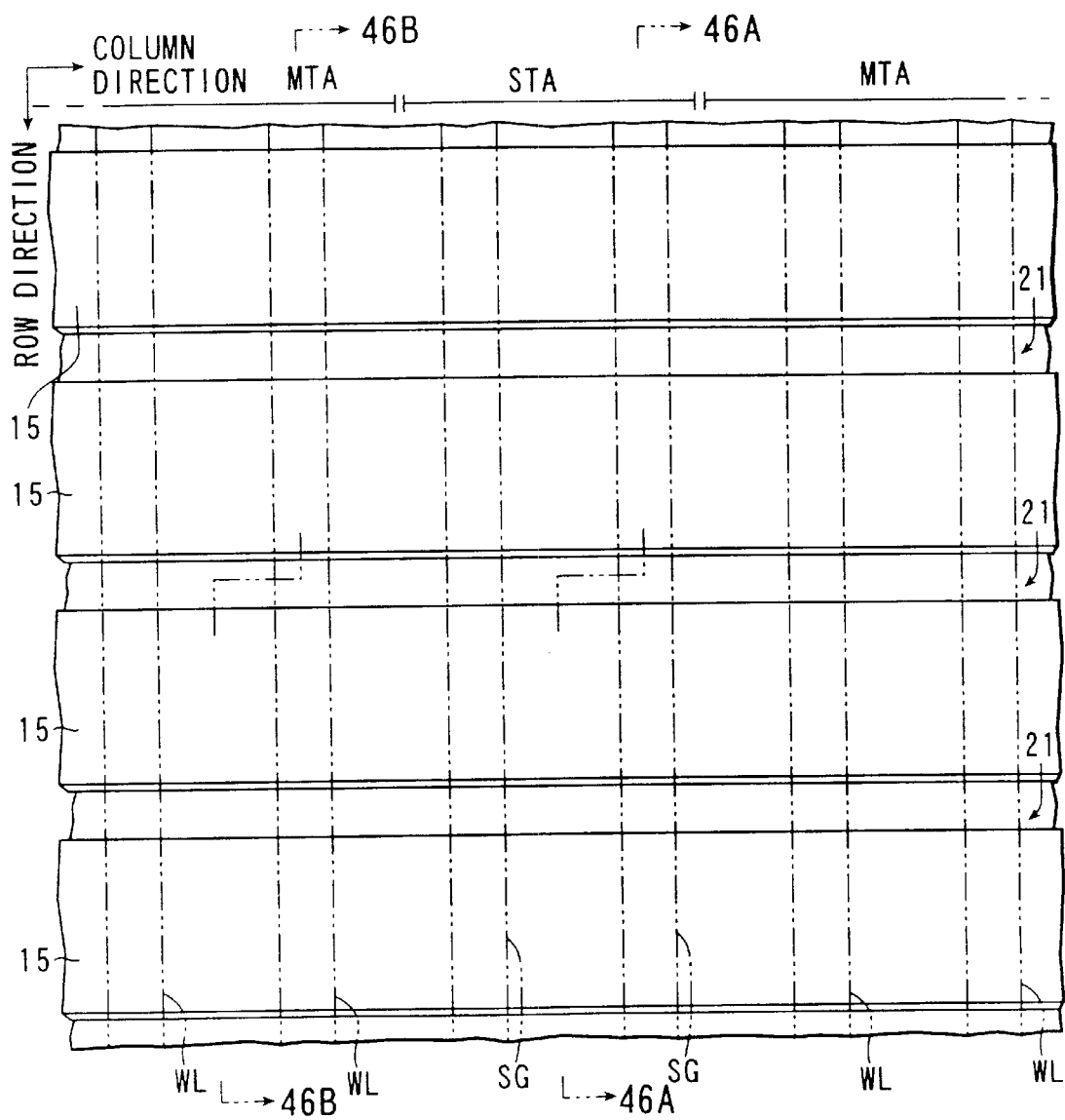
FIG. 44 is a schematic plan view of a NAND EEPROM in slit processing according to a basic structure of the sixth embodiment.

FIG. 44 is a schematic plan view of a NAND EEPROM according to the basic structure of the sixth embodiment in forming slits.

As shown in FIG. 44, in the basic structure, the polysilicon film 15 is cut off by slits 21 even in area STA.

In the basic structure, the slits 21 serves as a line & space pattern both in area STA and in area MTA, which simplifies the resolution pattern in lithography. Consequently, the basic structure facilitates the control of dimensions and is suitable for miniaturization.

The contacts that connect the polysilicon film 15 to the select gate lines formed in parallel with the word lines are formed by removing the ONO film 6 on the polysilicon film 15. As a result, contact holes are not needed.

However, when the stacked gates are processed to remove the ONO film 6 on the polysilicon film 15, the film thicknesses of the STI regions 2 reduce heavily.

Figure 45A:
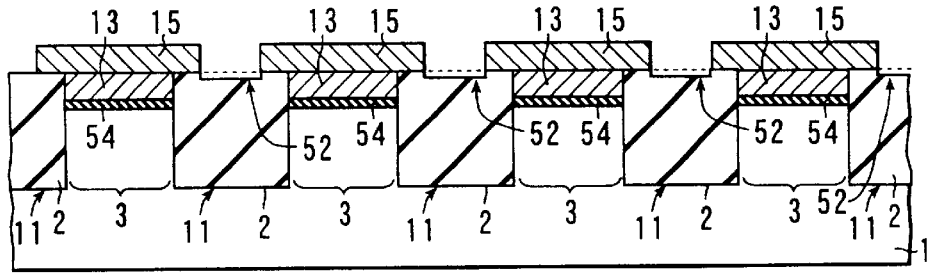
Figure 45B:
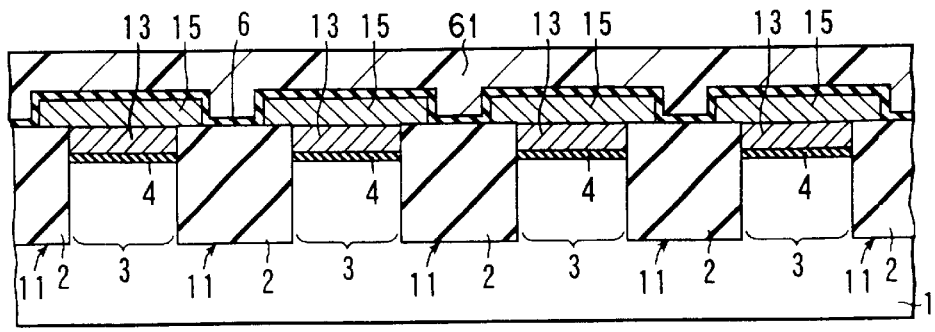
Figure 46A:
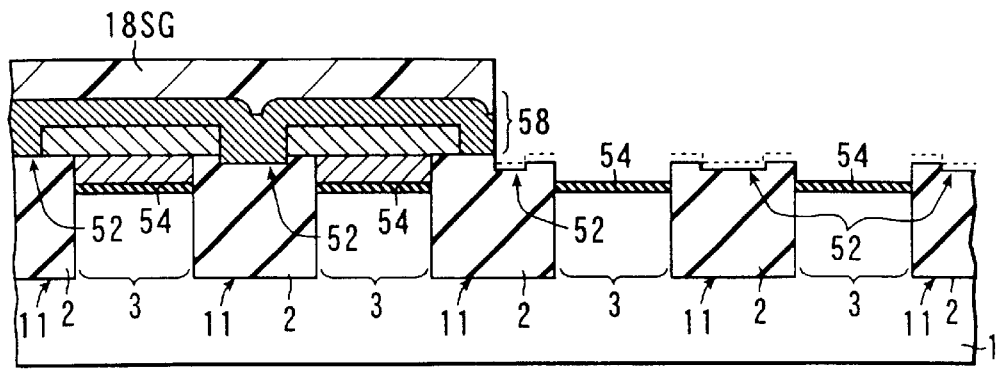
Figure 46B:
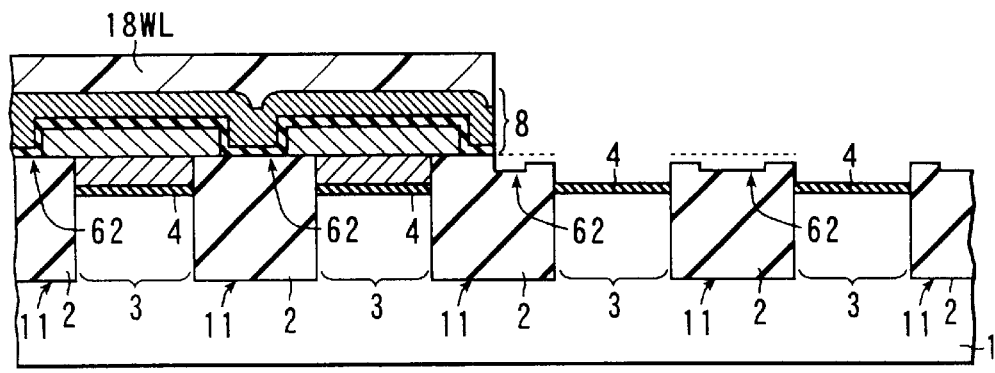

FIGS. 45A and 45B are sectional views to help explain the process of removing the ONO film 6 in the NAND EEPROM related to the basic structure. FIGS. 46A and 46B are sectional views to help explain the process of forming stacked gates in the NAND EEPROM. FIGS. 45A and 46A are sectional views taken along a line A—A of FIG. 44. FIGS. 45B and 46B are sectional views taken along a line B—B of FIG. 44.

As shown in FIGS. 45A and 45B, area MTA is covered with a photoresist film 61. Then, using the photoresist film 61 as a mask, the ONO film 6 is removed from area STA. The ONO film 6 contains silicon dioxide, which is the main constituent of the STI regions 2. Accordingly, while the ONO film 6 is being etched, the film thickness of the STI region 2 decreases in the region 52 between the polysilicon films 15.

As shown in FIGS. 46A and 46B, the ONO film 6 is absent in area STA. As a result, in forming the stacked gates, the amount of decrease in the film thickness of the STI region 2 in area STA is larger than that in area MTA in which the ONO film 6 is left. Particularly in the region 52, the film thickness of the STI region 2 in area STA is still smaller than that in the region 62 between the polysilicon films 15 in area MTA.

With the NAND EEPROM of the sixth embodiment, because the ONO film 6 is left on the region between the polysilicon films 15 in the STI region 2, that is, on the region in which a slit 21 is made, the film thickness of the STI region 2, particularly of the region 52 does not decrease. Furthermore, in forming the stacked gates, the amount of decrease in the film thicknesses of the STI regions 2 in area STA is suppressed more than the basic structure, because the ONO film 6 is present. Therefore, as described above, when the ONO film 6 is removed and when the stacked gates are formed, a decrease in the film thickness of the STI film 2 is suppressed, which alleviates the film thicknesses of the STI regions 2 in area STA.

Next, a method of manufacturing NAND EEPROMs according to the sixth embodiment will be explained.

FIGS. 47A and 47B to FIGS. 51A and 51B are sectional views to help explain the process of manufacturing NAND EEPROMs of the sixth embodiment step by step. FIGS. 47A to 51A are sectional views taken along a line 42A—42A of FIG. 41A. FIGS. 47B to 51B are sectional views taken along a line 42B—42B of FIG. 41A.

Figure 47A:
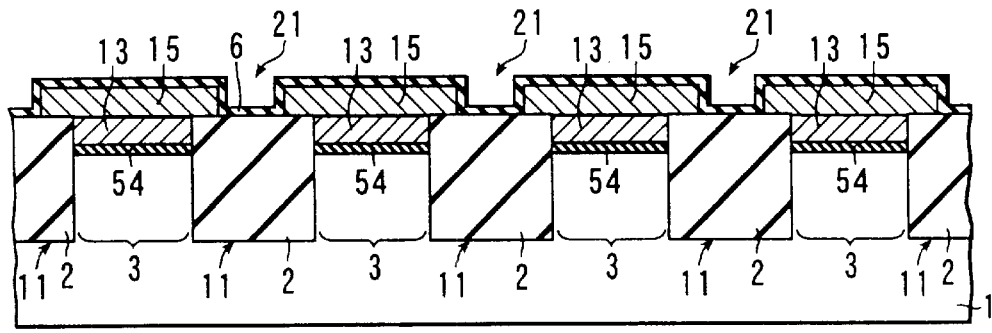
FIGS. 47A, 47B, 48A, 48B, 49A, 49B, 50A, 50B, 51A and 51B are sectional views to help explain the steps of manufacturing a NAND EEPROM according to the sixth embodiment of the present invention, wherein the figures with the suffix A are sectional views taken along the line A—A of FIG. 44 and the figures with the suffix B are sectional views taken along the line B—B of FIG. 44.
Figure 47B:
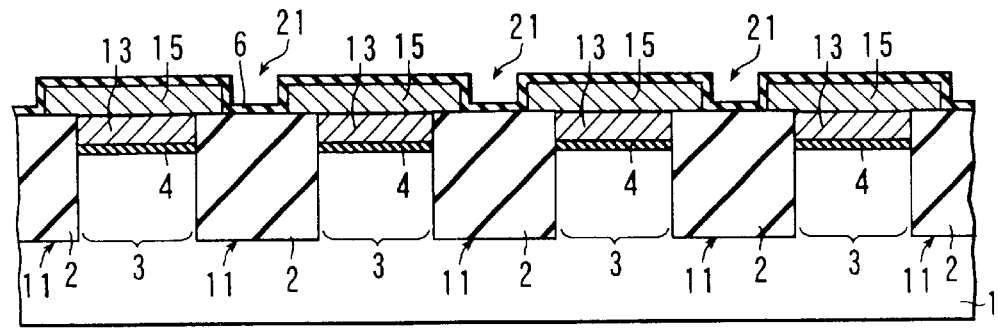

As shown in FIGS. 47A and 47B, after slits 21 have been made in the conductive polysilicon film 15, an ONO film is formed on the entire surface as in the steps of FIGS. 9A to 9F.

Figure 48A:
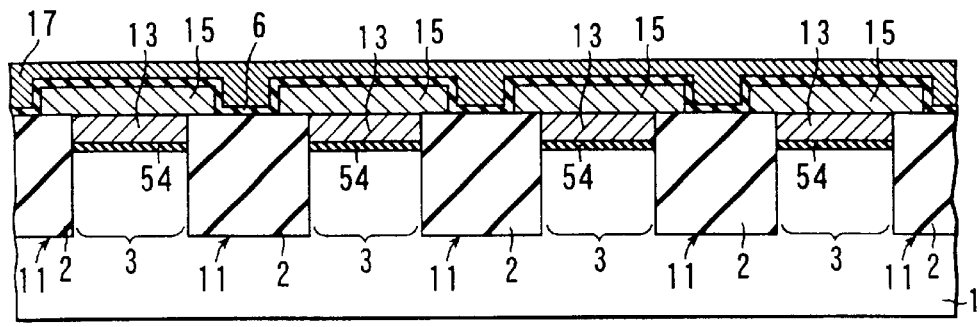
Figure 48B:
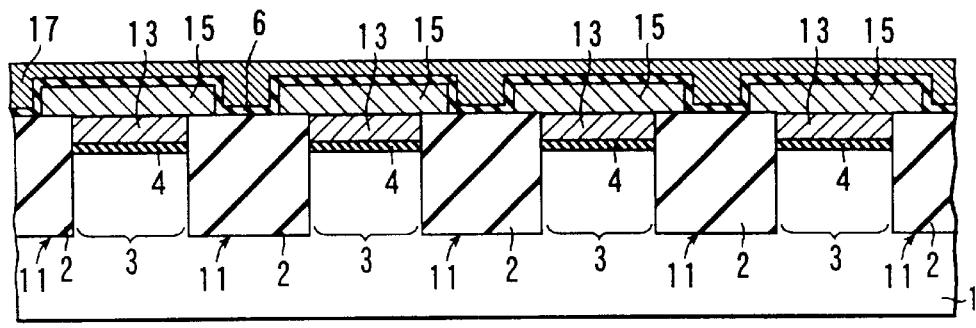

Then, as shown in FIGS. 48A and 48B, on the ONO film 6, a conductive polysilicon film 17 is formed. Thereafter, the surface of the polysilicon film 17 is preferably flattened by, for example, CMP techniques.

Figure 49A:
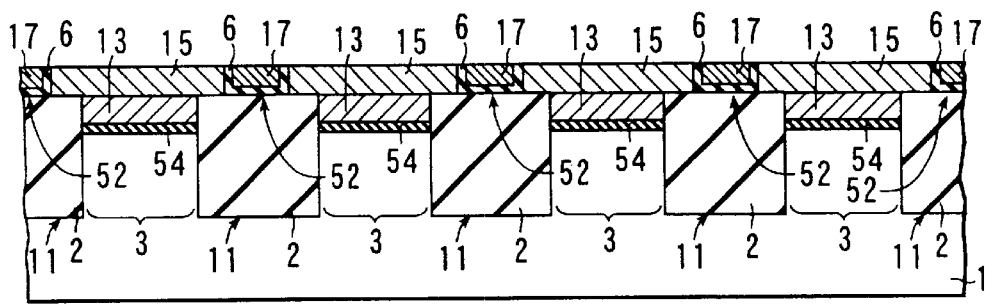
Figure 49B:
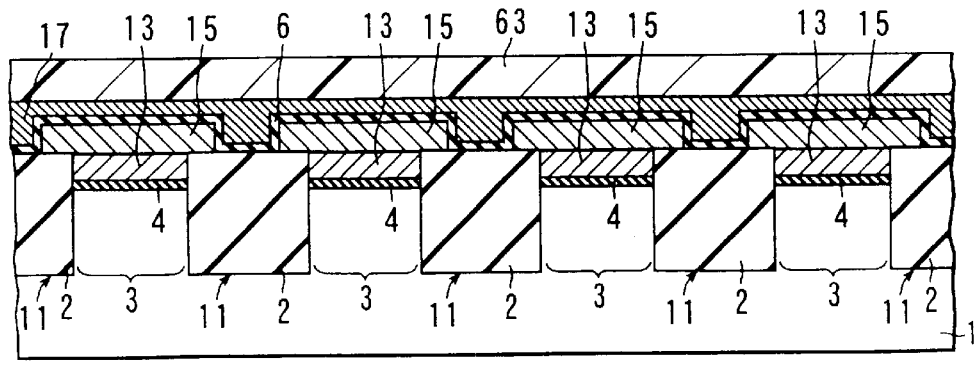

Then, as shown in FIGS. 49A and 49B, area MTA is covered with a photoresist 63. Then, using the photoresist 63 as a mask, the polysilicon film 17 and ONO film 6 are removed from area STA to expose the top surface of the polysilicon film 15. At that time, the ONO film 6 and polysilicon film 17 are left on the regions 52.

Figure 50A:
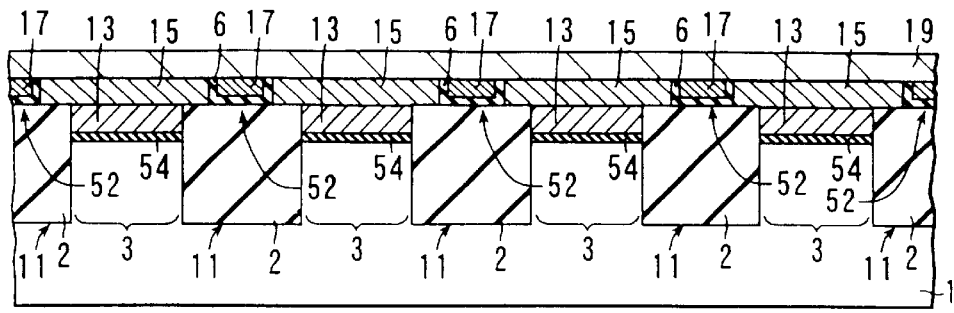
Figure 50B:
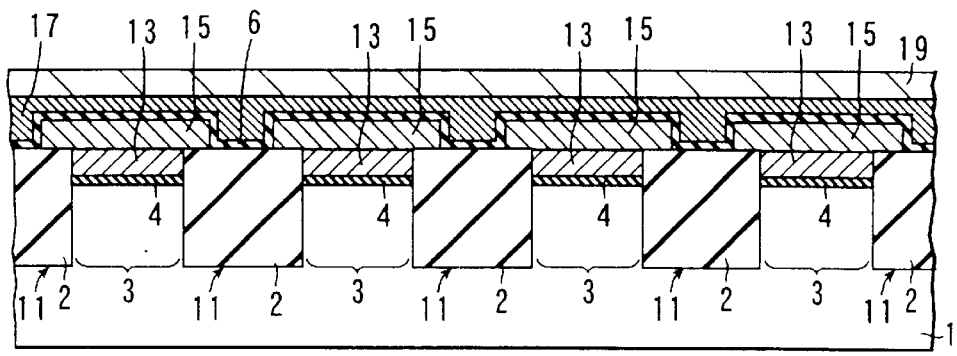

Then, after the photoresist 63 has been removed, a conductive polysilicon film 19 is formed on the entire surface as shown in FIGS. 50A and 50B. The conductive polysilicon film 19 may be made of a lower-resistance refractory metal or a refractory metal silicide obtained by combining a refractory metal with silicon. Use of such a refractory metal or silicide gives the word lines 7 or select gate lines 57 a polycide structure or a polymetal structure, which achieves lower resistance.

Figure 51A:
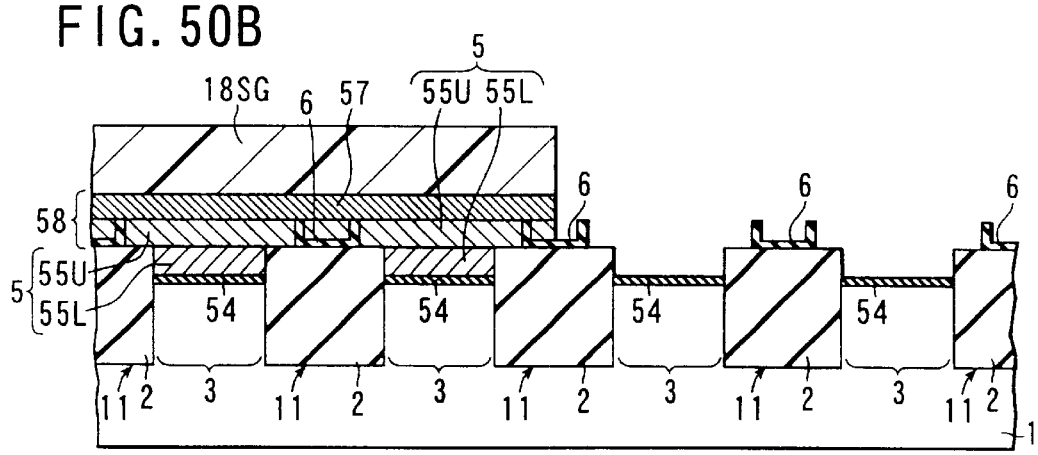
Figure 51B:
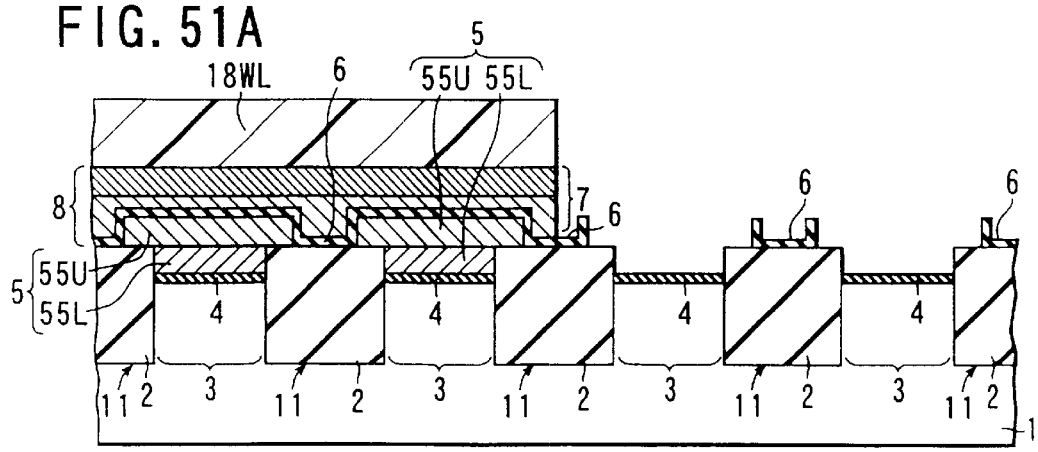

Then, as shown in FIGS. 51A and 51B, on the conductive polysilicon film 19, a photoresist film 18 with a pattern corresponding to the pattern for forming the word lines 7 and a photoresist film 18SG with a pattern corresponding to the pattern for forming the select gate lines 57 are formed.

Then, using the photoresist films 18WL and 18SG as a mask, the polysilicon film 19, polysilicon film 17, ONO film 6, conductive polysilicon film 15, and conductive polysilicon film 13 are etched to form a stacked gate 8 including a word line 7 and a floating gate 5 with a two-layer structure of a lower layer section 5L and an upper layer section 5U and a stacked gate 58 including a select gate line 57 and an isolated gate member 55 with a two-layer structure of an upper layer section 55U connected to the select gate line and a lower layer section 55L. In forming these stacked gates 8 and 58, the ONO film 6 is left on the STI regions 2, which suppresses a decrease in the film thicknesses of the STI regions 2.

It is preferable that the method of forming the stacked gates should be carried out in the following three stages. Using an etchant that easily etches silicon but hardly etches silicon dioxide or silicon nitride, the polysilicon film 19 is etched in such a manner that the polysilicon film 17 is left on the STI regions 2 and the ONO film 6 on the polysilicon film 15 is exposed. It this case, the polysilicon film 17 may be left only on the STI region 2 of area MTA, depending on the film thickness difference of the polysilicon film 17 between on area MTA and on area STA. This means that the ONO film 6 is finally left only on the STI region of area MTA. However, the thickness decrease of the STI region 2 is suppressed at least in removing the ONO film 6 in a larger amount than in the case of the basic structure of the sixth embodiment, so that the effect of the thickness decrease suppression is expected with respect to the STI region 2.

Then, using an etchant that easily etches silicon dioxide or silicon nitride but hardly etches silicon, the exposed ONO film 6 is etched in such a manner that the polysilicon film 15 is exposed.

Then, using an etchant that easily etches silicon but hardly etches silicon dioxide or silicon nitride, the polysilicon 17, polysilicon 15, and polysilicon 13 are etched until the stacked gate 8 and stacked gate 58 are isolated from each other.

Thereafter, according to a known manufacturing method (not shown), source/drain regions 9, an interlayer insulating film, such contact holes as bit-line contact holes, and such wiring layers as bit lines are formed. This completes a NAND EEPROM according to the sixth embodiment.

(Seventh Embodiment)

Hereinafter, a seventh embodiment of the present invention will be explained. The parts as those in the first embodiment are indicated by the same reference symbols.

In the first to sixth embodiments, the facing area between the word line 7 and floating gate 5 in a self-alignment trench element isolation EEPROM is increased by providing the upper layer section 5U extending over the STI region 2.

In the seventh embodiment and an eighth embodiment of the present invention which follow, the facing area between the word line 7 and floating gate 5 in a self-alignment trench element isolation EEPROM is increased by projecting part of the floating gate 5 from the surface of the STI region 2.

In an EEPROM where part of the floating gate 5 are forced to project from the surface of the STI region 2, it is necessary to recess the top surface of the STI region 2 or thicken the floating gate 5. This causes a problem: a processing margin for the STI region 2 decreases or the amount of etching during the formation of stacked gates increases. Especially when select gate transistors are present, the problem of decreasing the film thickness of the STI region 2 is more serious in area STA.

Therefore, the objectives of the seventh and eighth embodiments are to suppress a decrease in the film thickness of the STI region particularly in area STA of an EEPROM where part of the floating gate 5 are caused to project from the surface of the STI region 2.

Figure 52A:
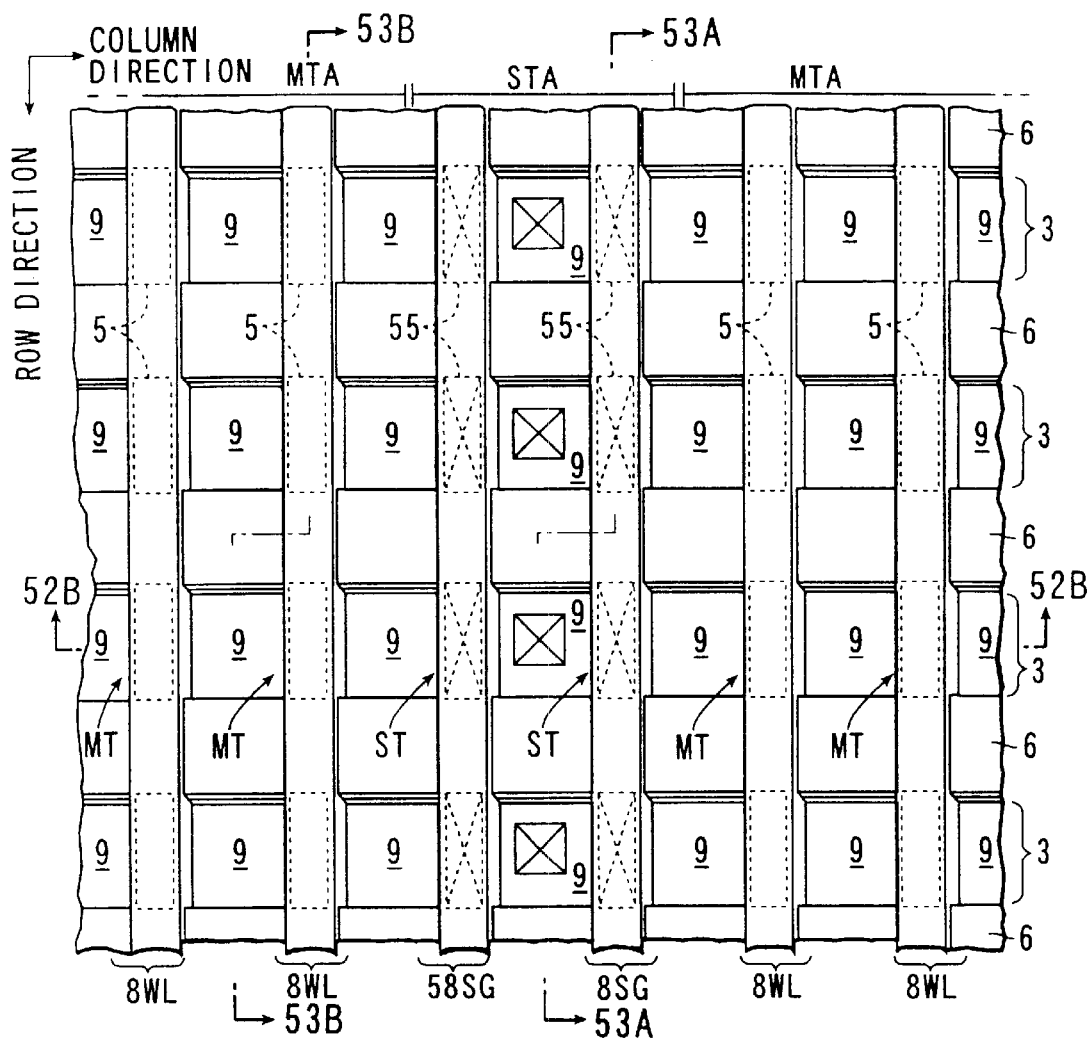
FIG. 52A is a schematic plan view of a NAND EEPROM memory cell array according to a seventh embodiment of the present invention.
Figure 52B:
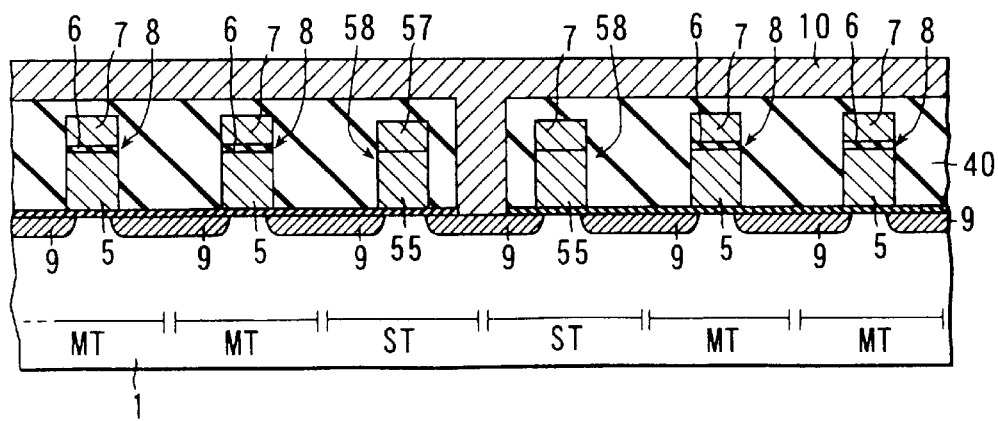
FIG. 52B is a sectional view taken along a line 52B—52B of FIG. 52A.
Figure 53A:
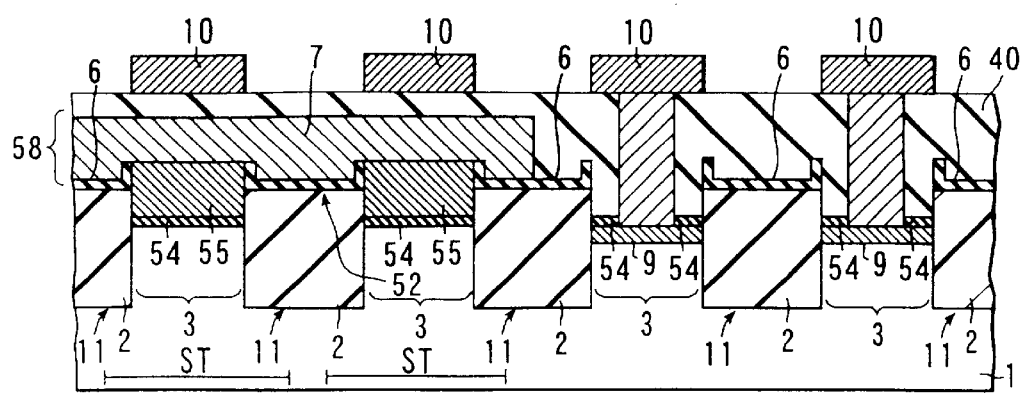
FIG. 53A is a sectional view taken along a line 53A—53A of FIG. 52A.
Figure 53B:
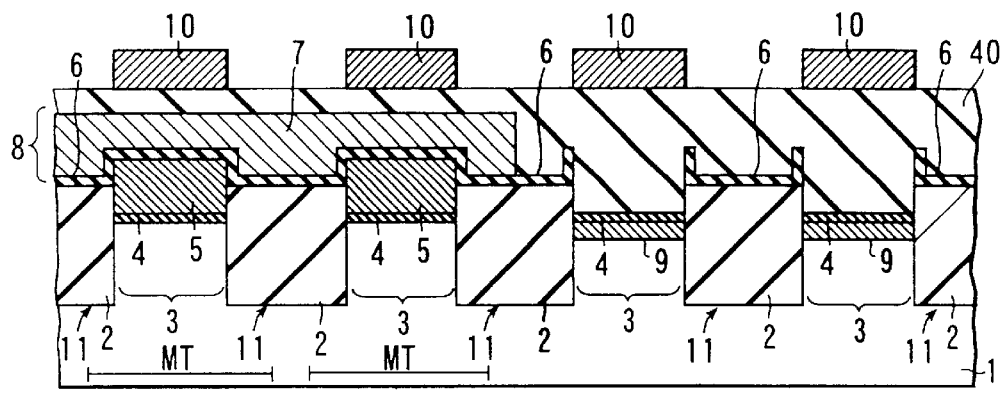
FIG. 53B is a sectional view taken along a line 53B—53B of FIG. 52A.

FIG. 52A is a schematic plan view of a NAND EEPROM according to the seventh embodiment of the present invention. FIG. 52B is a sectional view taken along a line 52B—52B of FIG. 52A. FIG. 53A is a sectional view taken along a line 53A—53A of FIG. 52A. FIG. 53B is a sectional view taken along a line 53B—53B of FIG. 52A. In FIG. 52A, bit lines (BL) are not shown.

As shown in FIGS. 52A, 52B, 53A, and 53B, in the seventh embodiment, the sidewalls of the floating gate 5 in a memory cell transistor MT self-align with the side ends of the STI region 2 and partially project from the top surface of the STI region 2. The structure of a select transistor ST is similar to that of a transistor MT. The select transistor ST has an isolated gate member 55 whose sidewalls self-align with the side ends of the STI region 2 and partially project from the top surface of the STI region 2. The ONO film 6 has been removed particularly from the top surface of the isolated gate member 55, which is electrically connected to the select gate line 57 above the active region 3.

On the entire surface of the STI region 2, the ONO film 6 is left behind. The ONO film 6 on the STI region 2 suppresses a decrease in the film thickness of the STI region 2 particularly during the formation of the stacked gates 8 and 58. Even on the region between the isolated gate members 55 in the STI region 2 indicated by reference numeral 52 in FIG. 53A, the ONO film 6 has been left. As in the sixth embodiment, the ONO film 6 left between the gate members 55 suppresses a decrease in the film thickness of the STI region 2 in removing the ONO film 6 from the select transistor formation area STA and in forming the stacked gates.

Next, a method of manufacturing NAND EEPROMs according to the seventh embodiment will be explained.

FIGS. 54A and 54B to FIGS. 59A and 59B are sectional views to help explain step by step the process of manufacturing NAND EEPROMs of the seventh embodiment. FIGS. 54A to 59A are sectional views taken along a line 53A—53A of FIG. 52A. FIGS. 54B to 59B are sectional views taken along a line 53B—53B of FIG. 52A.

Figure 54A:
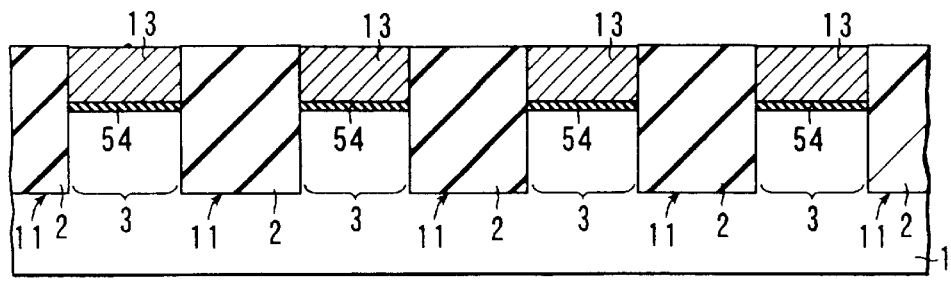
FIGS. 54A, 54B, 55A, 55B, 56A, 56B, 57A, 57B, 58A, 58B, 59A and 59B are sectional views to help explain the steps of manufacturing a NAND EEPROM according to the seventh embodiment, wherein the figures with the suffix A are sectional views taken along the line 53A—53A of FIG. 52A and the figures with the suffix B are sectional views taken along the line 53B—53B of FIG. 52A.
Figure 54B:
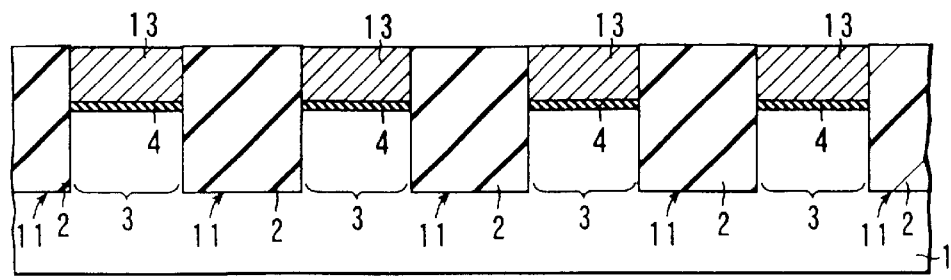

First, as shown in FIGS. 54A and 54B, the trenches 11 are filled with silicon dioxide by the manufacturing method shown in FIGS. 9A to 9C, thereby forming STI regions 2.

Figure 55A:
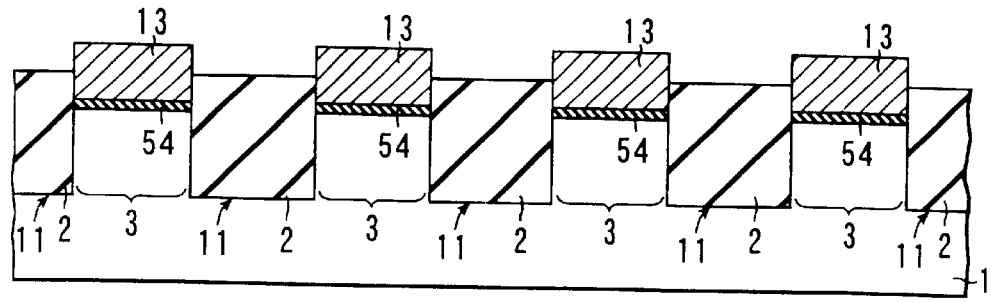
Figure 55B:
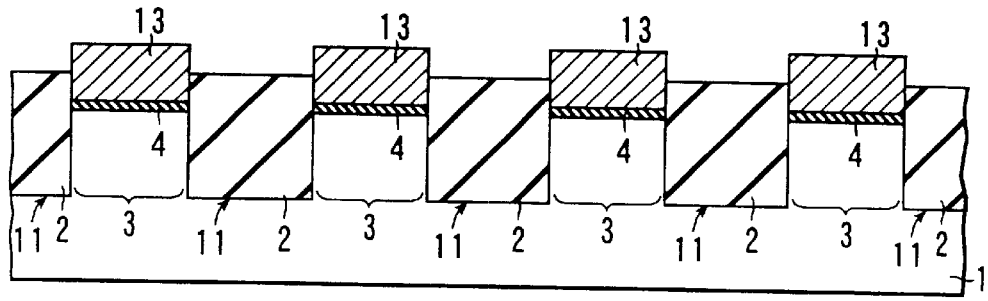

Then, as shown in FIGS. 55A and 55B, the top surfaces of the STI regions 2 are recessed and the top sides of each polysilicon film 13 are exposed above the top of each STI region 2. The top surfaces of the STI regions 2 are recessed by dry etching or wet etching. The amount of exposure of the sides of the polysilicon film is determined by the desired capacitance C between the word line and the floating gate.

Figure 56A:
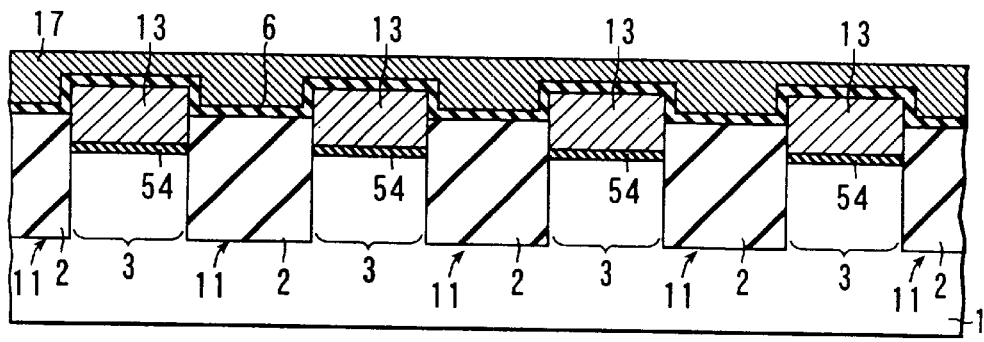
Figure 56B:
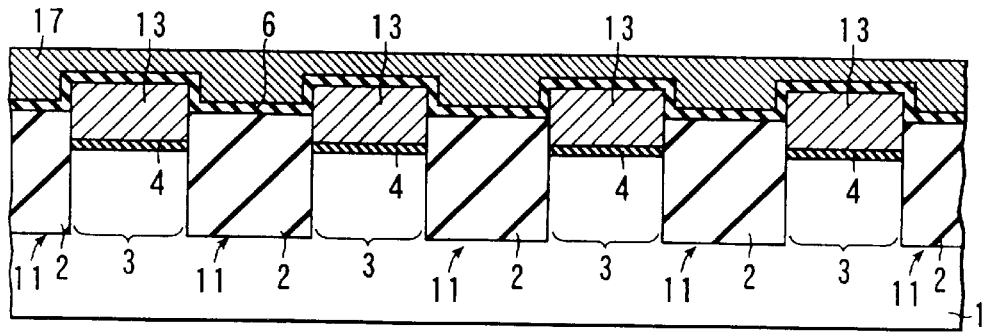

Next, as shown in FIGS. 56A and 56B, an ONO film 6 and a conductive polysilicon film 17 are formed in that order on the structures shown in FIGS. 55A and 55B. It is preferable that the surface of the conductive polysilicon film 17 should be flattened by, for example, CMP techniques as shown in FIGS. 56A and 56B.

Figure 57A:
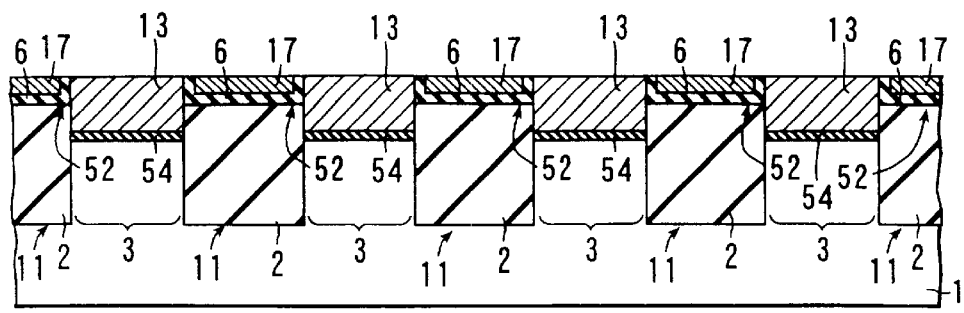
Figure 57B:
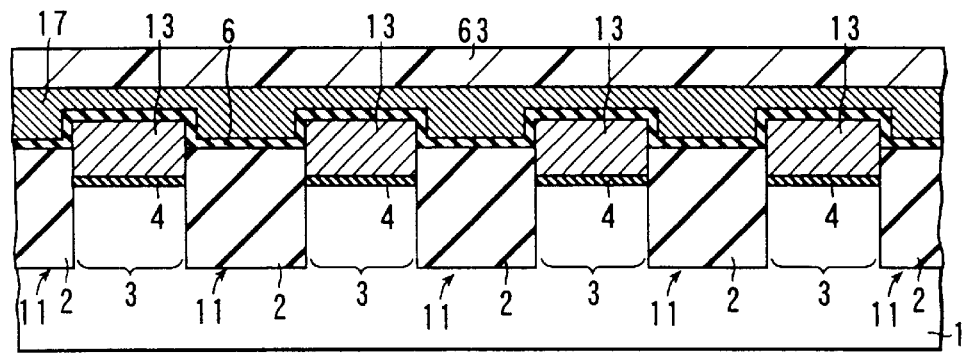

Then, as shown in FIGS. 57A and 57B, area MTA is covered with a photoresist 63. Then, using the photoresist 63 as a mask, the polysilicon film 17 and ONO film 6 are removed from area STA to expose the top surface of the polysilicon film 13 in area STA. At that time, the ONO film 6 and polysilicon film 17 are left on each region 52.

Figure 58A:
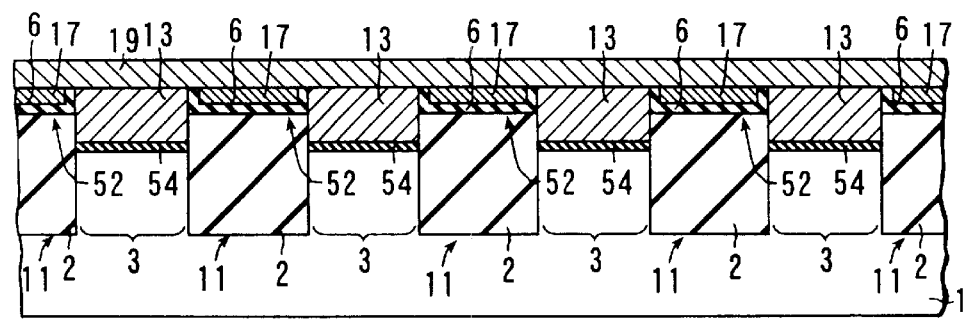
Figure 58B:
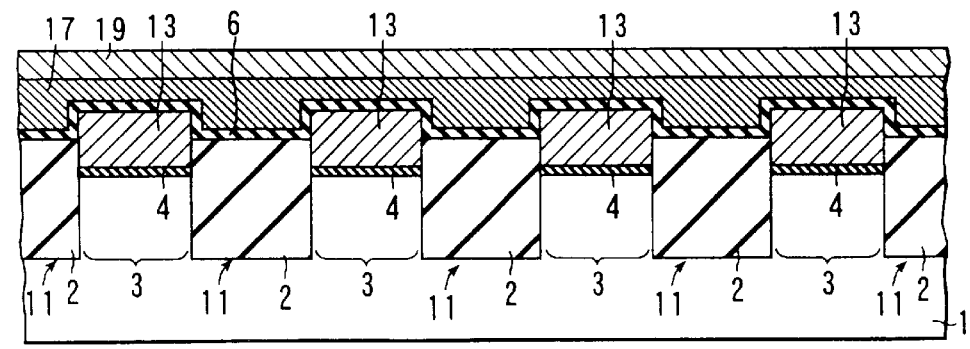

Then, after the photoresist 63 has been removed, a conductive polysilicon film 19 is formed on the entire surface as shown in FIGS. 58A and 58B. The conductive polysilicon film 19 may be made of a lower-resistance refractory metal or a refractory metal silicide obtained by combining a refractory metal with silicon. Use of such a refractory metal or silicide gives the word lines 7 or select gate lines 57 a polycide structure or a polymetal structure, which achieves lower resistance.

Figure 59A:
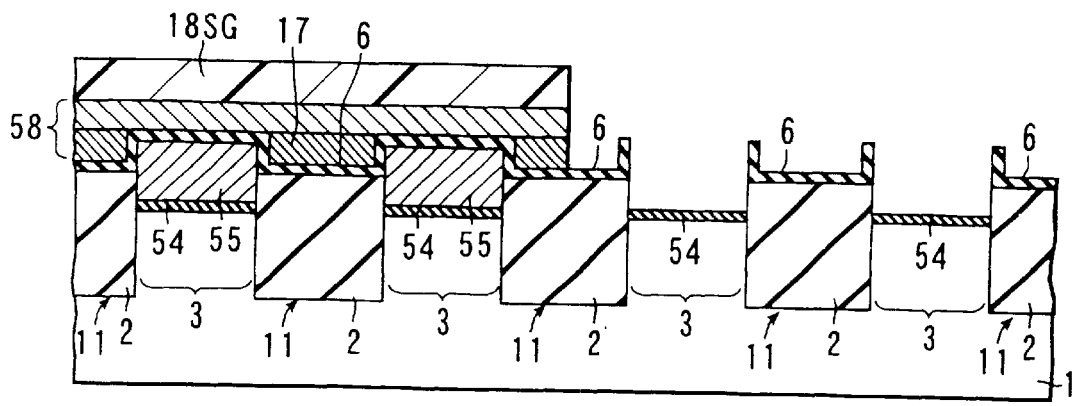
Figure 59B:
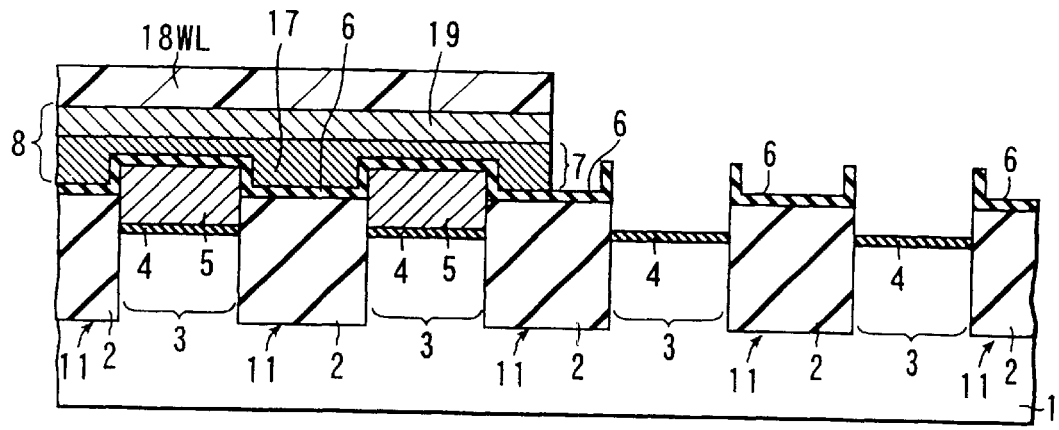

Then, as shown in FIGS. 59A and 59B, on the conductive polysilicon film 19, a photoresist film 18 with a pattern corresponding to the pattern for forming the word lines 7 and a photoresist film 18SG with a pattern corresponding to the pattern for forming the select gate lines 57 are formed.

Then, using the photoresist films 18WL and 18SG as a mask, the polysilicon film 19, polysilicon film 17, ONO film 6, and conductive polysilicon film 13 are etched to form a stacked gate 8 including a word line 7 and a floating gate 5 and a stacked gate 58 including a select gate line 57 and an isolated gate member 55 connected to the select gate line. In forming these stacked gates 8 and 58, the ONO film 6 on the STI region 2 suppresses a decrease in the film thickness of the STI region 2 as in the sixth embodiment.

It is preferable that the method of forming the stacked gates should be carried out in the following three stages as in the sixth embodiment. In this case, the polysilicon film 17 may be left only on the STI region 2 of area MTA, similarly to the sixth embodiment.

Using an etchant that easily etches silicon but hardly etches silicon dioxide or silicon nitride, the polysilicon film 19 is etched in such a manner that the polysilicon film 17 is left on the STI region 2 and the ONO film 6 on the polysilicon film 13 is exposed.

Then, using an etchant that easily etches silicon dioxide or silicon nitride but hardly etches silicon, the exposed ONO film 6 is etched in such a manner that the polysilicon film 13 is exposed.

Then, using an etchant that easily etches silicon but hardly etches silicon dioxide or silicon nitride, the polysilicon 17 and polysilicon 13 are etched until the stacked gate 8 and stacked gate 58 are isolated from each other.

Thereafter, according to a known manufacturing method (not shown), source/drain regions 9, an interlayer insulating film, such contact holes as bit-line contact holes, and such wiring layers as bit lines are formed. This completes a NAND EEPROM according to the seventh embodiment.

(Eighth Embodiment)

Hereinafter, an eighth embodiment of the present invention will be explained.

Figure 60:
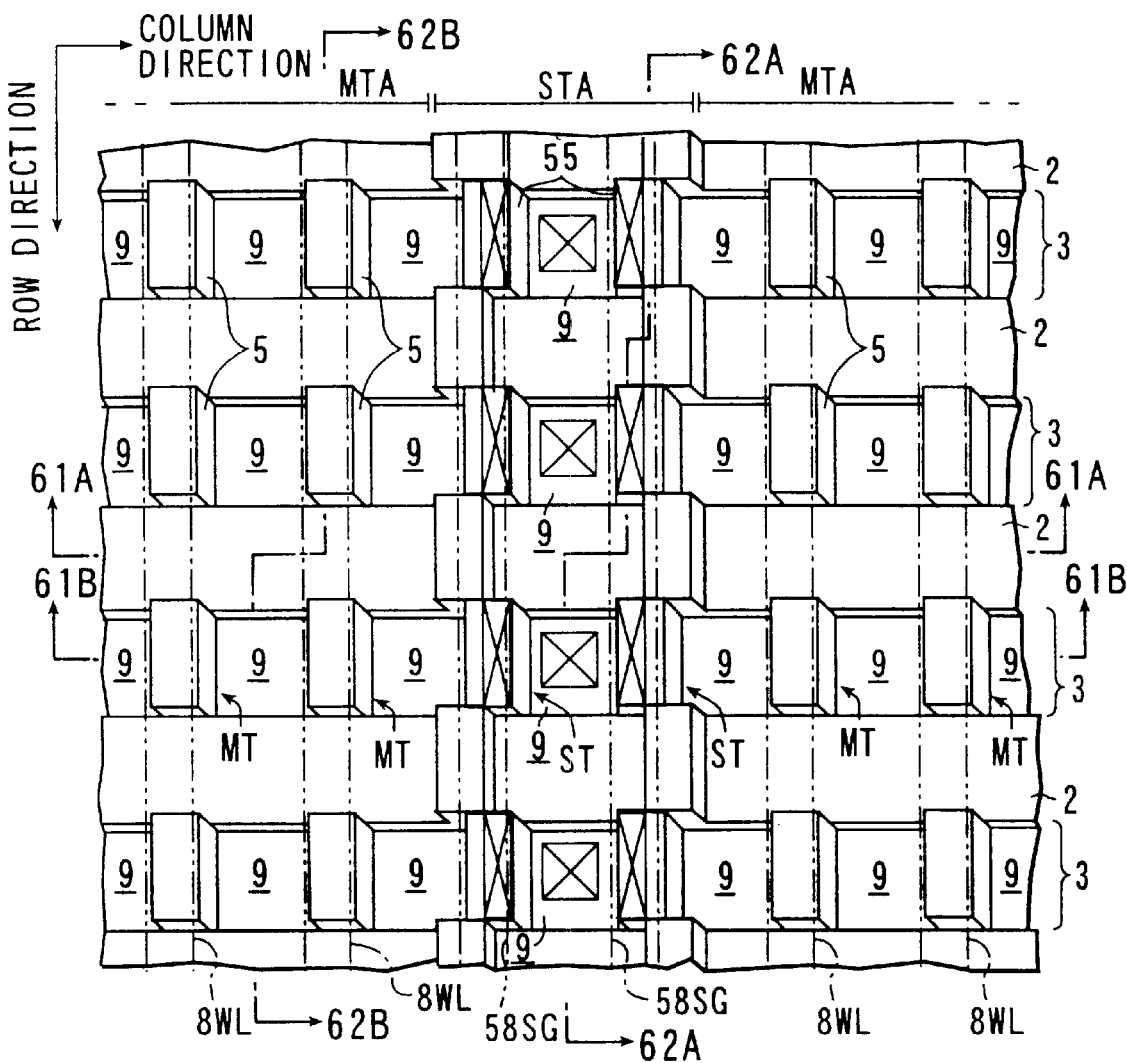
FIG. 60 is a schematic plan view of a NAND EEPROM memory cell array according to an eighth embodiment of the present invention.

FIG. 60 is a schematic plan view of a NAND EEPROM according to the eighth embodiment of the present invention.

Figure 61A:
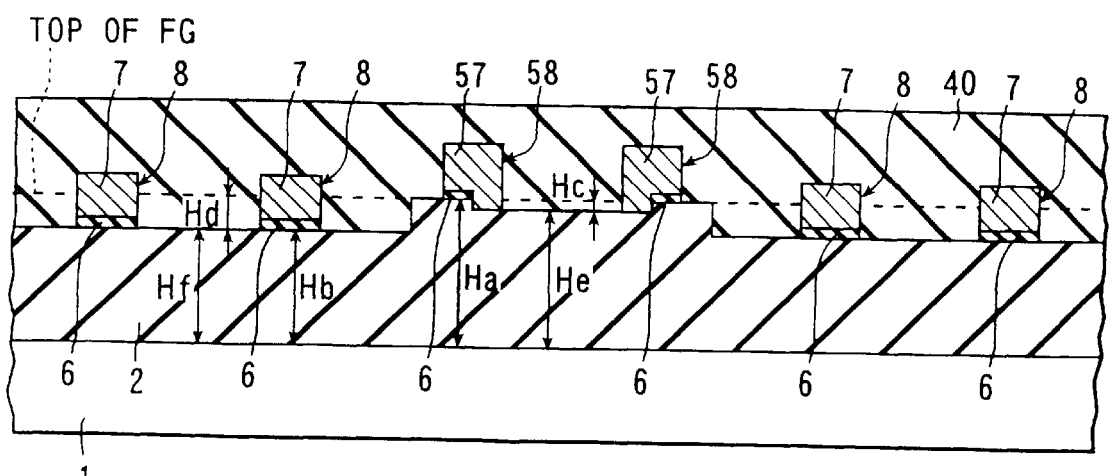
FIG. 61A is a sectional view taken along a line 61A—61A of FIG. 60.
Figure 61B:
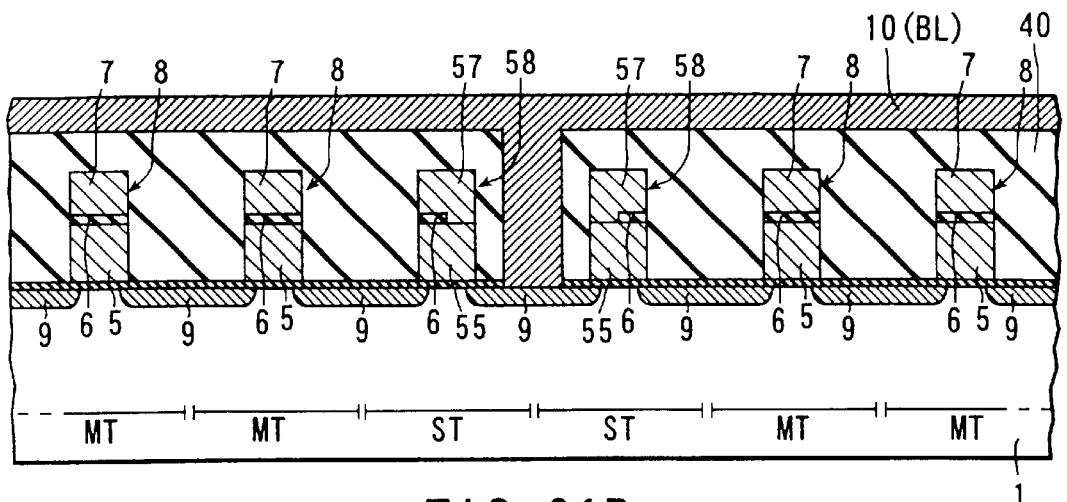
FIG. 61B is a sectional view taken along a line 61B—61B of FIG. 60.
Figure 62A:
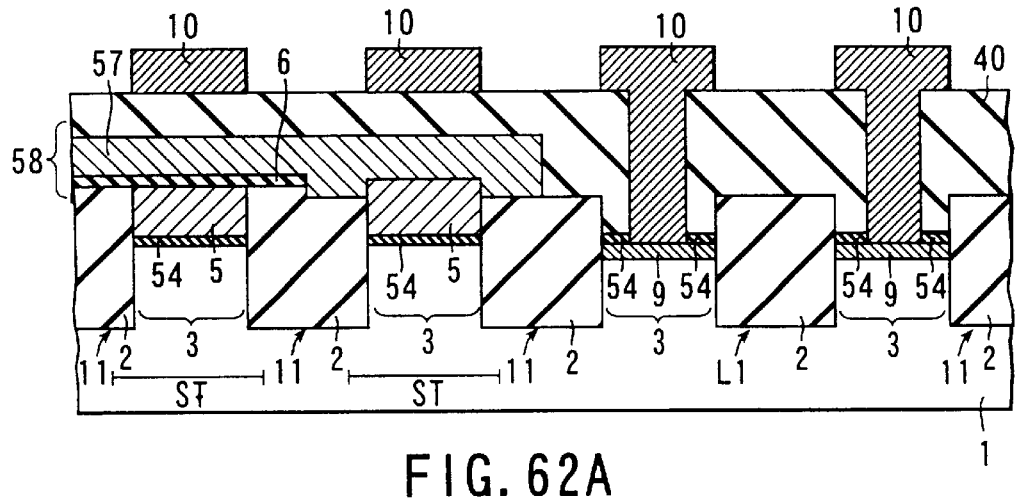
FIG. 62A is a sectional view taken along a line 62A—62A of FIG. 60.
Figure 62B:
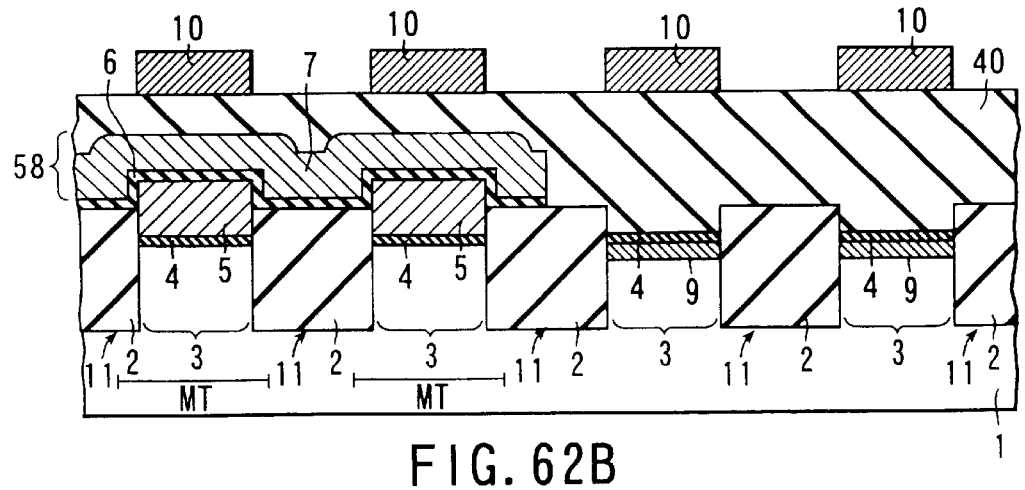
FIG. 62B is a sectional view taken along a line 62B—62B of FIG. 60.
Figure 63A:
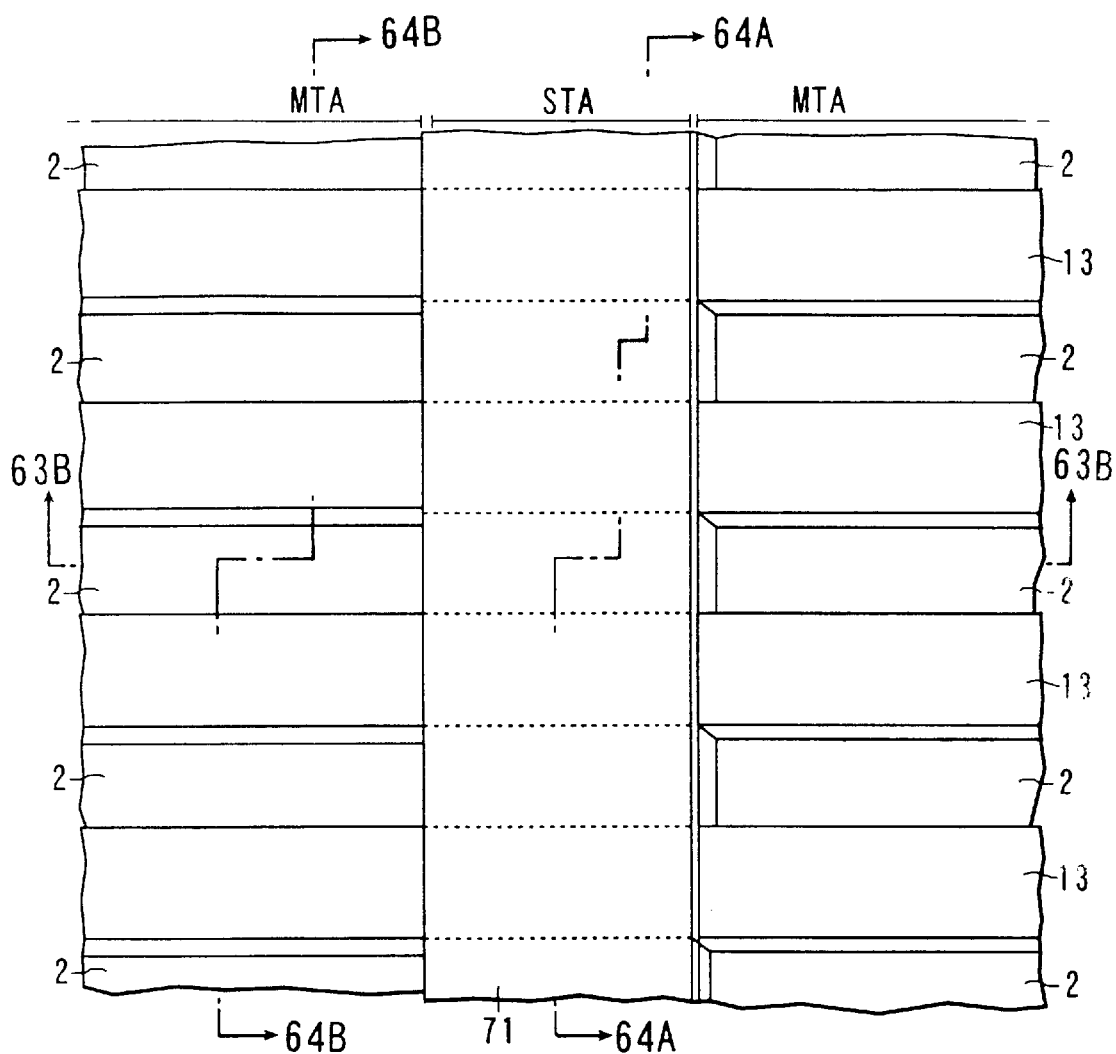
FIG. 63A is a schematic plan view to help explain one step in the manufacturing processes of a NAND EEPROM according to the eighth embodiment.
Figure 63B:
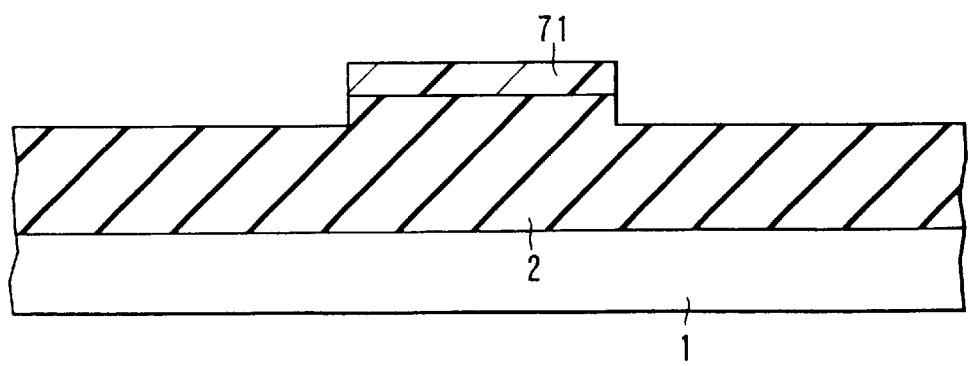
FIG. 63B is a sectional view taken along a line 63B—63B of FIG. 63.
Figure 64A:
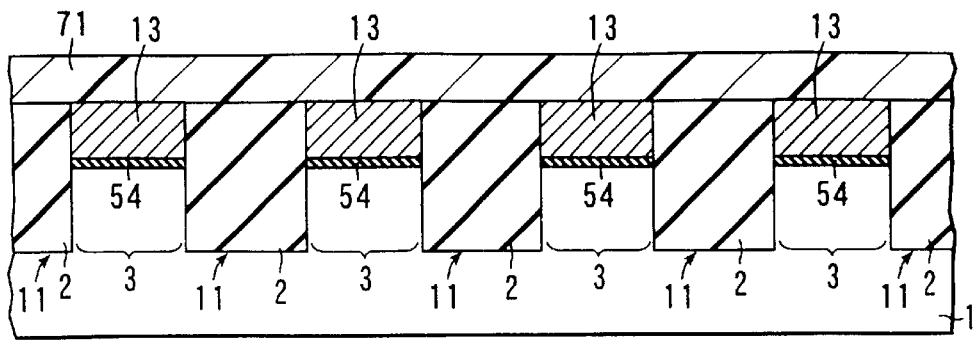
FIG. 64A is a sectional view taken along a line 64A—64A of FIG. 63A.
Figure 64B:
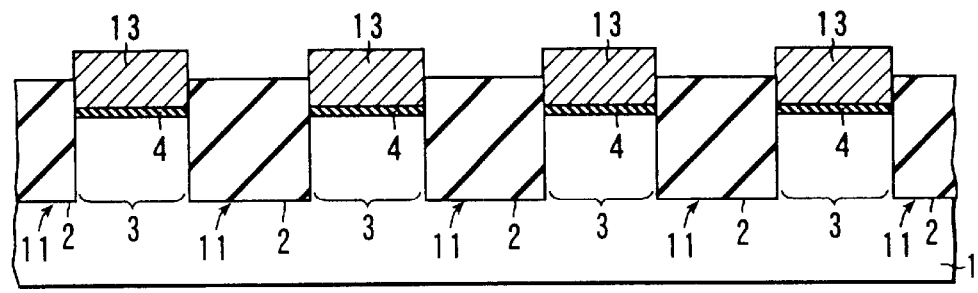
FIG. 64B is a sectional view taken along a line 64B—64B of FIG. 63A.
Figure 66A:
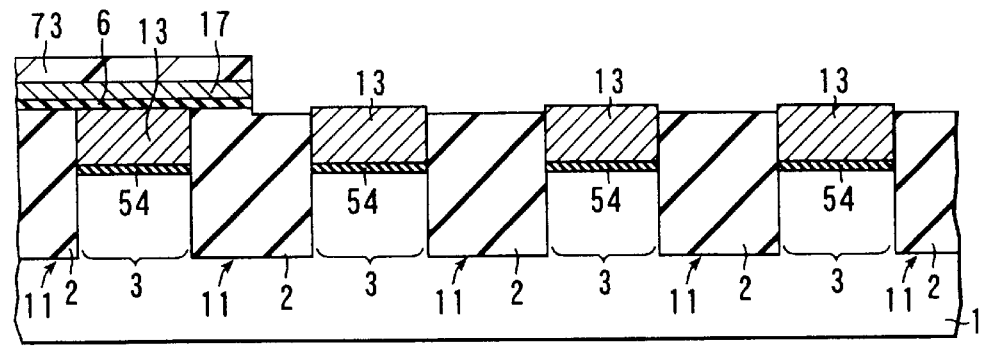
FIG. 66A is a sectional view taken along a line 66A—66A of FIG. 65A.
Figure 66B:
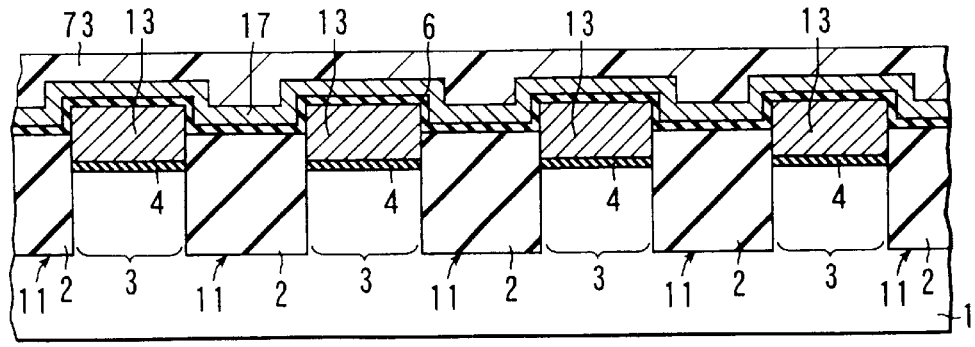
FIG. 66B is a sectional view taken along a line 66B—66B of FIG. 65A.
Figure 65A:
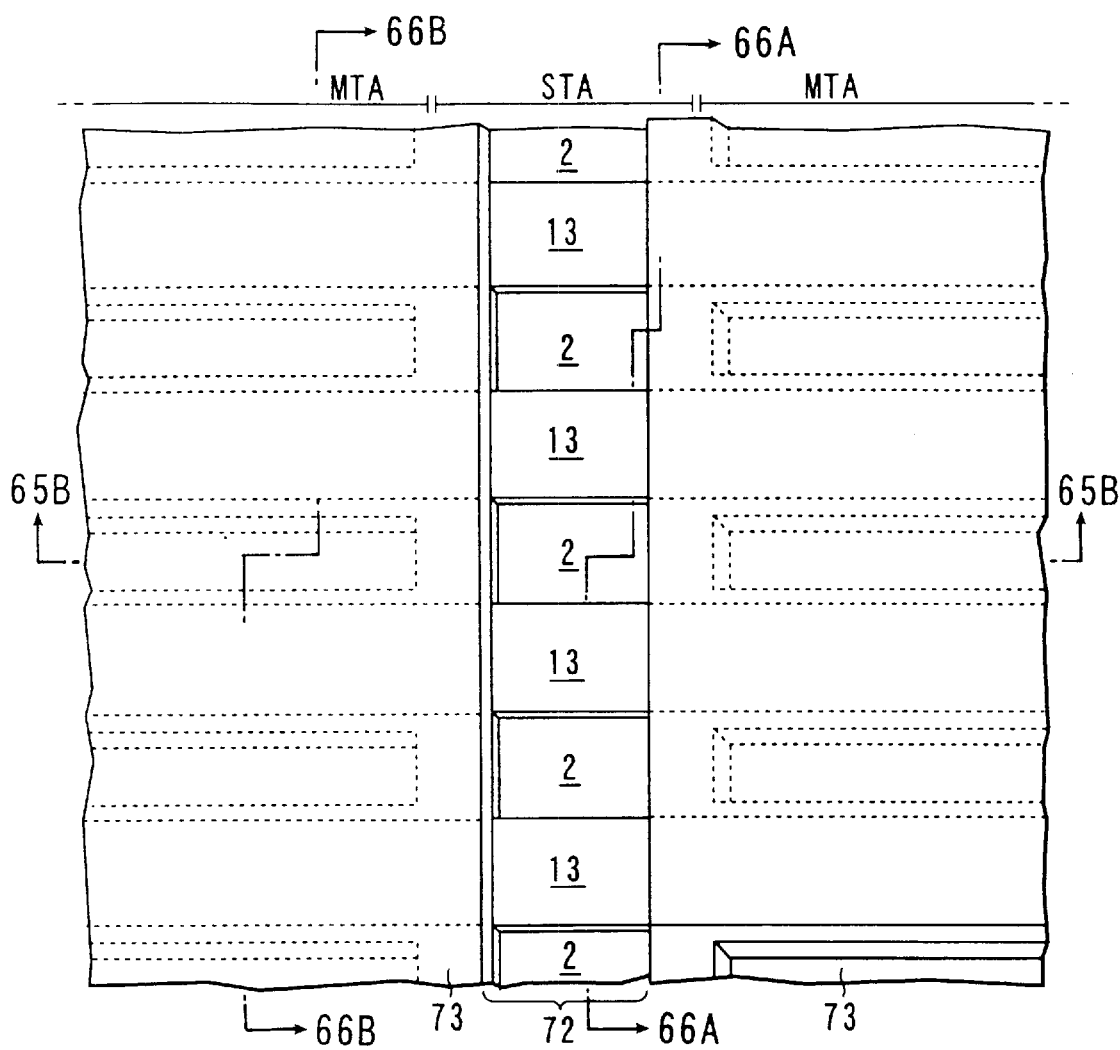
FIG. 65A is a schematic plan view to help explain another step in the manufacturing processes of a NAND EEPROM according to the eighth embodiment.
Figure 65B:
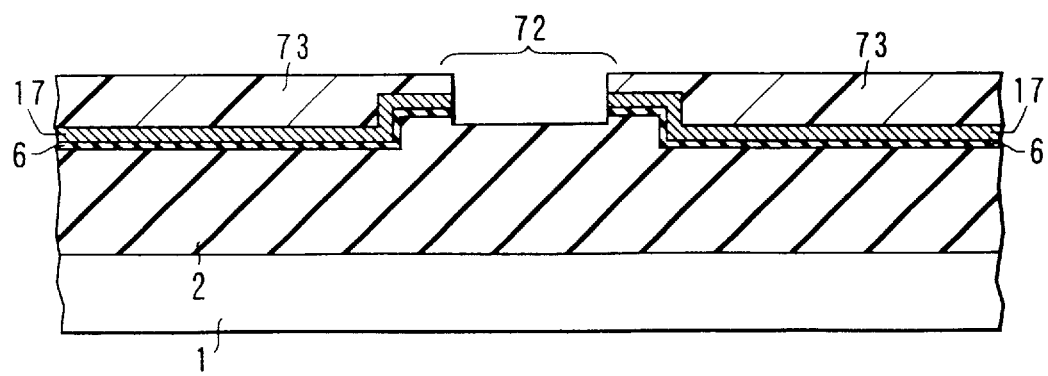
FIG. 65B is a sectional view taken along a line 65B—65B of FIG. 65A.
Figure 67A:
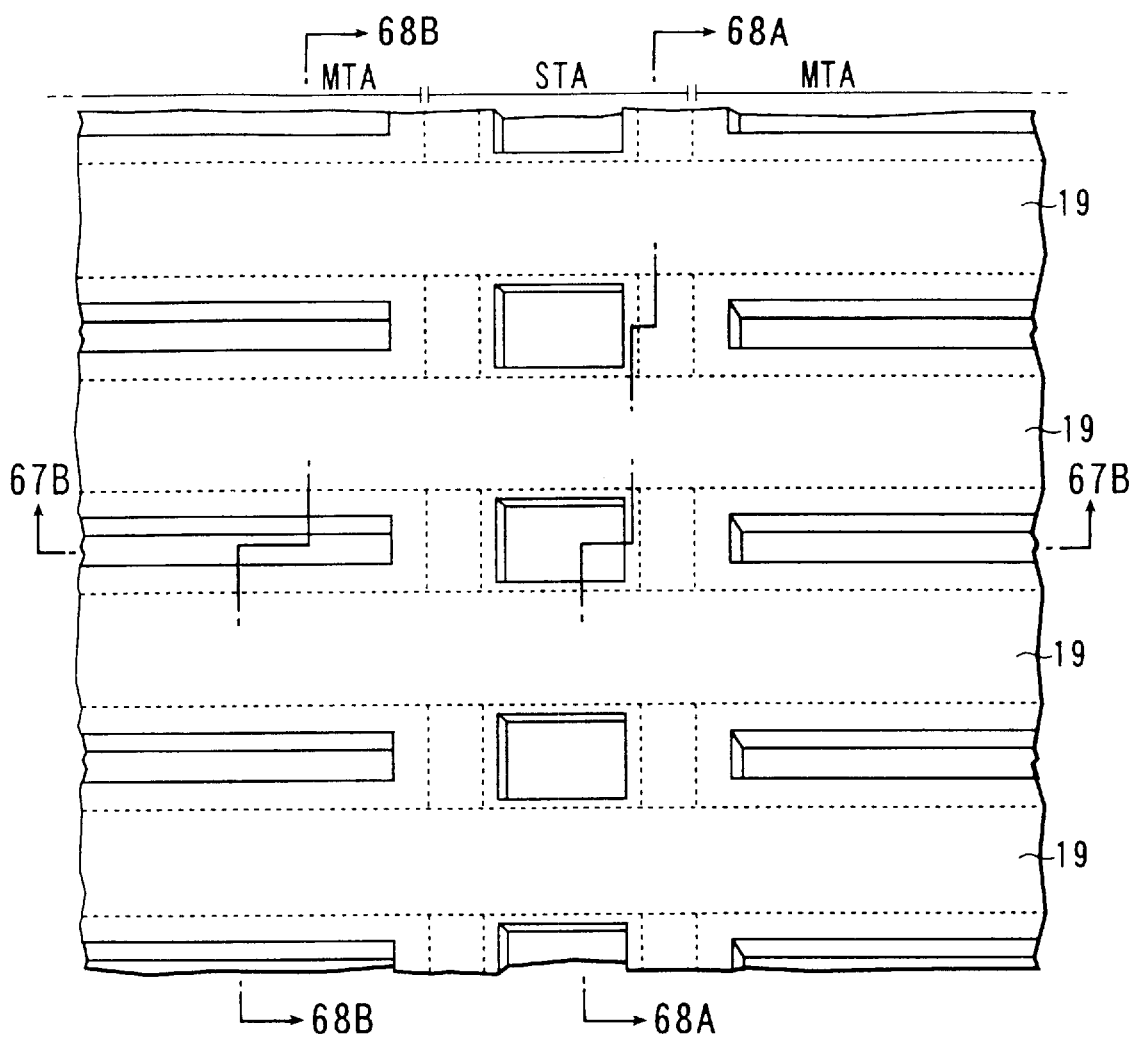
FIG. 67A is a schematic plan view to help explain still another step in the manufacturing processes of a NAND EEPROM according to the eighth embodiment.
Figure 67B:
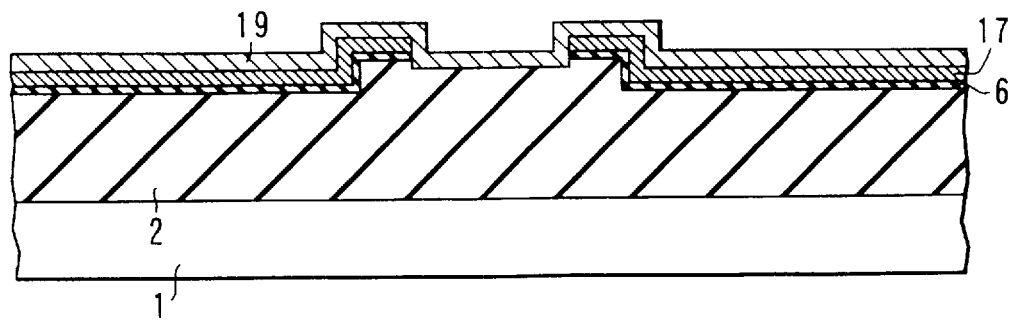
FIG. 67B is a sectional view taken along a line 67B—67B of FIG. 67A.
Figure 68A:
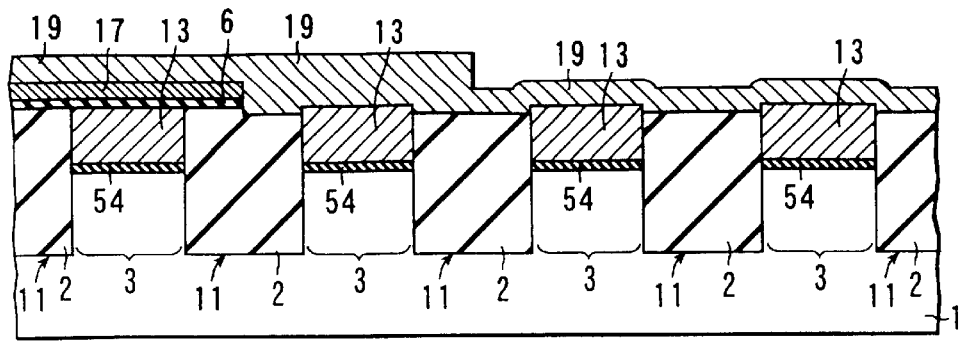
FIG. 68A is a sectional view taken along a line 68A—68A of FIG. 67A.
Figure 68B:
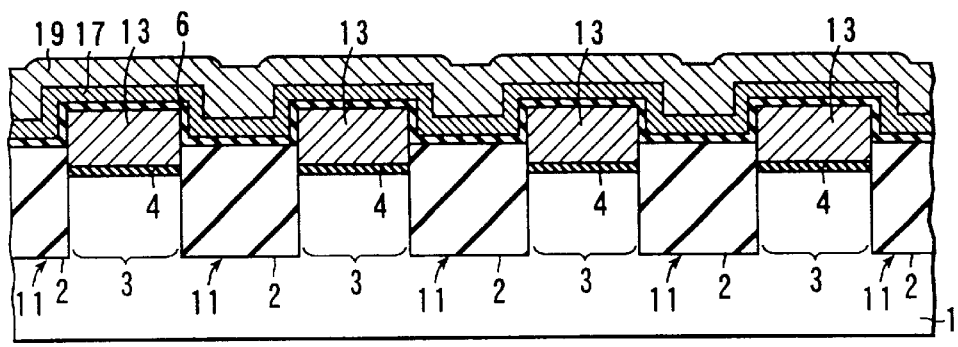
FIG. 68B is a sectional view taken along a line 68B—68B of FIG. 67A.
Figure 70A:
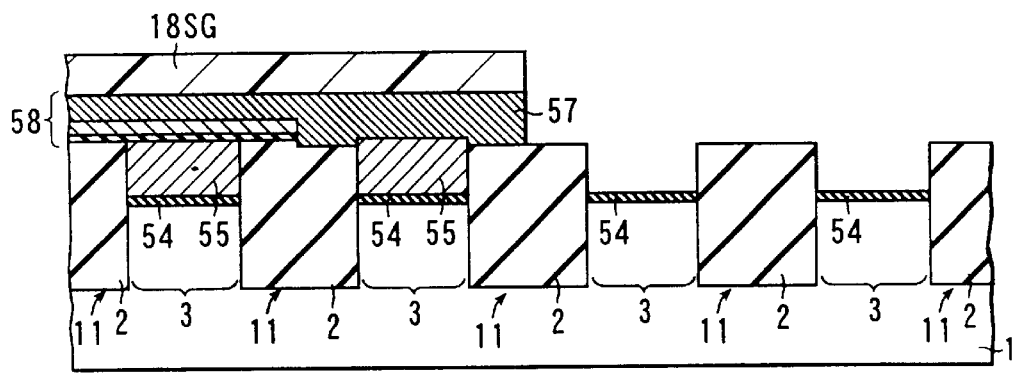
FIG. 70A is a sectional view taken along a line 70A—70A of FIG. 69A.
Figure 70B:
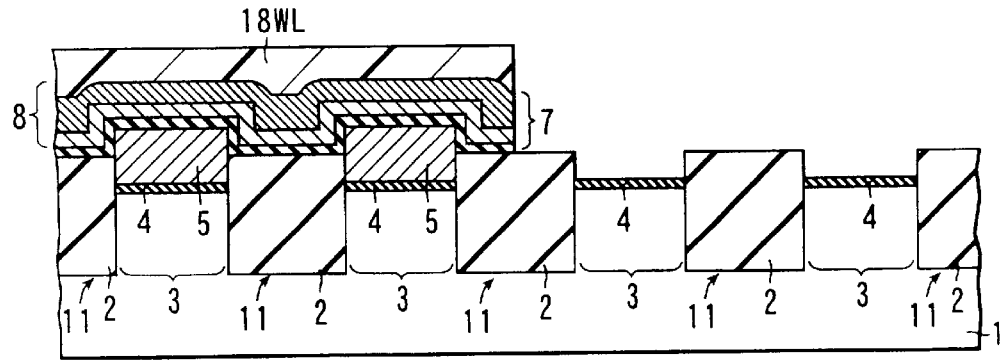
FIG. 70B is a sectional view taken along a line 70B—70B of FIG. 69A.
Figure 69A:
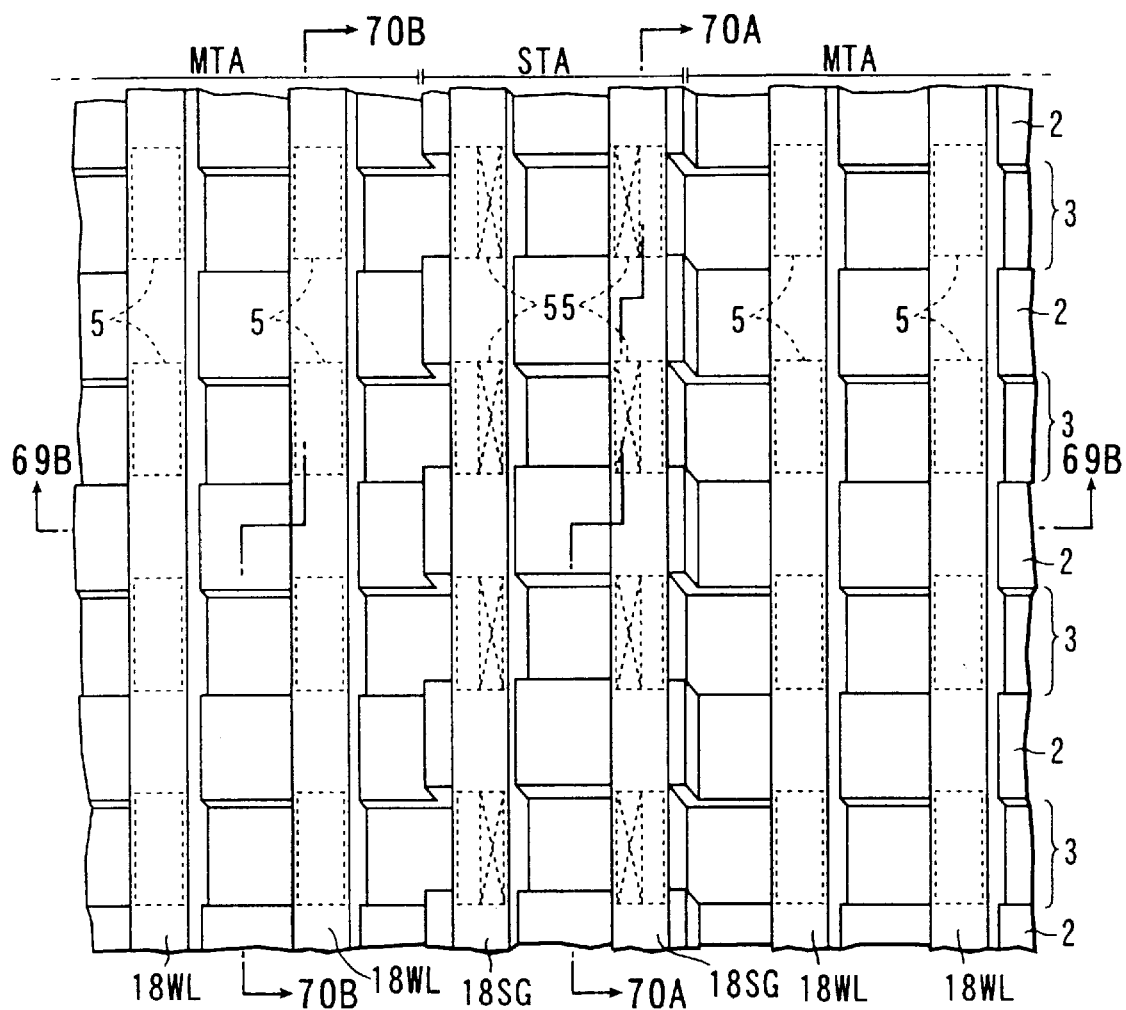
FIG. 69A is a schematic plan view to help explain still another step in the manufacturing processes of a NAND EEPROM according to the eighth embodiment.
Figure 69B:
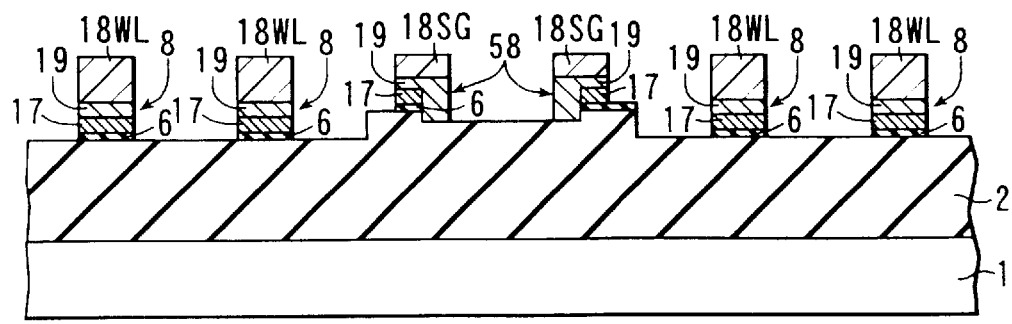
FIG. 69B is a sectional view taken along a line 69B—69B of FIG. 69A.

FIG. 61A is a sectional view taken along a line 61A—61A of FIG. 60. FIG. 61B is a sectional view taken along a line 61B—61B of FIG. 60. FIG. 62A is a sectional view taken along a line 62A—62A of FIG. 60. FIG. 62B is a sectional view taken along a line 62B—62B of FIG. 60. In FIG. 60, bit lines (BL) are not shown.

As shown in FIGS. 60, 61A, 61B, 62A, and 62B, in the eighth embodiment, the STI regions 2 in area MTA is made thicker than the STI regions 2 in area STA. As a result, a processing margin for a decrease in the film thickness of the STI region 2 is larger in area STA during the removal of the ONO film 6 and the formation of the stacked gates.

The relationship in thickness between STI regions 2 in the eighth embodiment will be explained with reference to FIG. 61A.

As shown in FIG. 61A, the film thickness Ha under a stacked gate 58 including a select gate 57 in the STI region 2 is not smaller than the film thickness Hb under a stacked gate 8 including a word line 7.

In the eighth embodiment, there are provided devices to prevent the thinner film thickness Hb of the STI region 2 from decreasing unnecessarily during the removal of the ONO film 6.

The chief device is to form a mask for protecting area MTA from etching during the removal of the ONO film 6 not only on area MTA but also on area STA. This permits the removal of the ONO film 6 only on the thicker portion Ha of the STI region 2, even if the mask has shifted a little. As a result, the STI region 2 which is under the area between two adjacent select gate lines 57 in area STA has a portion whose film thickness He is smaller than the film thickness Ha.

The pattern of the memory cell array shown in FIG. 60 is a pattern obtained by folding the pattern ranging from the bit-line contact section to the source-line formation section (or the source-line contact section) (not shown) axial-symmetrically with respect to the bit-line contact section. With the pattern, windows are made in the mask in such a manner that they are arranged in a line along the bit-line contact section, producing a simple pattern, which improves the workability at a microscopic level.

In this case, the portion with the film thickness "He" of the STI region 2 ranges from the portion under the select gate line 57 to the portion that isolates the portion in which a bit-line contact is formed from the source source/drain region 9. The film thickness "He" is larger than that of the portion Hf that isolates the source/drain region 9 in area MTA. Specifically, the distance Hc from the top surface of the isolated gate 55 to the top surface of the portion isolating the drain region 9 of the transistor ST is not longer than the distance Hd from the top surface of the floating gate 5 to the top surface of the portion isolating the source/drain region 9 of the transistor MT.

As a result, a sufficient processing margin is given to area STA during the formation of the stacked gates 8 and 58. In FIG. 61A, the positions of the top surfaces of the floating gate 5 and isolated gate 55 are indicated by "TOP OF FG."

In the STI region 2, a step is present in the portion that isolates the source/drain region 9 connecting the transistor "MT" to the transistor "ST." This structure suppresses the formation of such an undesirable structure as prevents the sidewalls of the floating gate 5 from being exposed and allows the facing area between the word line 7 and the floating gate 5 to vary.

The ONO film 6 may be removed from the entire bottom of the select gate line 57. In the eighth embodiment, the ONO film 6 is removed from only the side of the source/drain region 9 to which a bit line is contacted under the select gate lines 57 in parallel with each other, with the source/drain region 9 between them. This structure prevents the etching of the ONO film 6 from reaching the portion with the film thickness "Hb" of the STI region 2 and suppresses the film thickness of the STI film 2 from getting smaller than the film thickness "Hb."

In any STI regions 2, the height of the portion contacting the side of the isolated gate 55 is never smaller than the height of the portion contacting the side of the floating gate 5. The film thickness of the conductive polysilicon film 13 constituting the floating gate 5 can be selected from a wider range than in the prior art. The film thickness of the conductive polysilicon film 13 is determined, taking into account how much the side of the floating gate is exposed and how much the STI region 2 is recessed.

Because there is a margin for the recession of the STI region 2, the film thickness of the conductive polysilicon film 13 can be selected from the range of smaller values than in a conventional manufacturing method. A thinner conductive polysilicon film 13, or a less height of the floating gate 5, eases the aspect ratio of a bit-line contact hole, which improves the controllability of etching in making bit-line contact holes.

Next, referring to FIGS. 63A and 63B to 70A and 70B, the manufacturing method will be explained.

First, as shown in FIGS. 63A, 63B, 64A, and 64B, a photoresist film 71 is formed on area "STA." Then, using the photoresist film 71 as a mask, the top surfaces of the STI regions 2 in area "MTA" are recessed.

Then, after the photoresist film 71 has been removed, an ONO film 6 and a polysilicon film 17 are formed on the entire surface. Next, a photoresist film 73 having slit-like windows 72 in area "STA" is formed. Then, using the photoresist 73 as a mask, the ONO film 6 and polysilicon film 17 are removed. As a result, the polysilicon film 13 is exposed in area "STA." At that time, arranging the windows 72 only in area "STA" prevents the polysilicon film 13 from being exposed in area "MTA."

Then, after the photoresist 73 has been removed, a conductive polysilicon film 19 is formed on the entire surface as shown in FIGS. 67A, 67B, 68A, and 68B. The conductive polysilicon film 19 may be made of a lower-resistance refractory metal or a refractory metal silicide obtained by combining a refractory metal with silicon. Use of such a refractory metal or silicide gives the word lines 7 or select gate lines 57 a polycide structure or a polymetal structure, which achieves lower resistance.

Then, as shown in FIGS. 69A and 69B and FIGS. 70A and 70B, on the conductive polysilicon film 19, a photoresist film 18WL with a pattern corresponding to the pattern for forming the word lines 7 and a photoresist film 18SG with a pattern corresponding to the pattern for forming the select gate lines 57 are formed.

Then, using each of the photoresist films 18WL and 18SG as a mask, the polysilicon film 19, polysilicon film 17, ONO film 6, and conductive polysilicon film 13 are etched to form a stacked gate 8 including a word line 7 and a floating gate 5 and a stacked gate 58 including a select gate line 57 and an isolated gate member 55 connected to the select gate line.

In forming these stacked gates 8 and 58, the larger film thicknesses "Ha" and "He" than the film thicknesses "Hb" and "Hf" of the STI region 2 in area "MTA" are left in the STI region 2 in area "STA." This provides a sufficient processing margin even when the ONO film 6 is absent in area "STA" during the formation of the stacked gates 8 and 58.

It is preferable that the method of forming the stacked gate 8 should be carried out in the following three stages as in the sixth embodiment.

Using an etchant that easily etches silicon but hardly etches silicon dioxide or silicon nitride, the polysilicon film 13 is etched in such a manner that the polysilicon film 17 is left on the STI region 2 and the ONO film 6 on the polysilicon film 13 is exposed.

Then, using an etchant that easily etches silicon dioxide or silicon nitride but hardly etches silicon, the exposed ONO film 6 is etched in such a manner that the polysilicon film 13 is exposed.

Then, using an etchant that easily etches silicon but hardly etches silicon dioxide or silicon nitride, the polysilicon 17 and polysilicon 13 are etched until the stacked gate 8 and stacked gate 58 are isolated from each other.

Thereafter, according to a known manufacturing method (not shown), source/drain regions 9, an interlayer insulating film, such contact holes as bit-line contact holes, and such wiring layers as bit lines are formed. This completes a NAND EEPROM according to the eighth embodiment.

Although the first to eighth embodiments have been explained separately, they may be combined in various ways.

For instance, the structure of the peripheral circuit transistor "PT" explained in the second embodiment may be made equal to that of the select transistor "ST" explained in the sixth, seventh, or eighth embodiment.

With the structure, all the transistors in a chip have a stacked structure similar to that of the select gate transistor, which reduces the number of manufacturing steps or decreases variations in the film thickness from one transistor to another at the surface of the chip or the wafer.

A decrease in the variation of the film thickness among the individual transistors improves the flatness of the interlayer insulating film 40. This makes it possible to form metal wiring lines, such as bit lines, on the flatter interlayer insulating film 40, which improves the workability of metal wiring lines at a microscopic level.

Furthermore, with the present invention, the recessed portions formed at the top surfaces of the STI regions 2 during the formation of stacked gates are made smaller, which improves the flatness of the STI regions 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a nonvolatile semiconductor memory device comprising the steps of:

forming a first conductive layer on a semiconductor substrate with a first insulating layer interposed therebetween;

forming a first mask layer having a predetermined first pattern on said first conductive layer;

forming a plurality of trenches in said substrate through said first conductive layer and said first insulating layer by etching with use of said first mask layer as a mask;

forming a second insulating layer in said plurality of trenches such that said insulating layer is formed up to an upper surface of said first mask layer;

exposing said first conductive layer by etching said first mask layer;

forming a second conductive layer on an upper surface of said first conductive layer and on an upper surface of said second insulating layer;

removing parts of said second conductive layer located on said second insulating layer to expose parts of said upper surface of said second insulating layer;

forming a third insulating film on said second conductive layer and said second insulating layer exposed; and forming a third conductive layer on said third insulating layer.

2. The method according to claim 1, wherein said step of forming a second insulating layer in said plurality of trenches includes the steps of:

depositing said second insulating layer on an entire surface of said semiconductor substrate so as to fill said plurality of trenches with said second insulating layer; and forming a plurality of isolation regions made of said second insulating layer by etching back said second insulating layer to expose an upper surface of said first mask layer.

3. The method according to claim 1, wherein said step of forming a second conductive layer on an upper surface of said first conductive layer and on an upper surface of said second insulating layer includes a step of forming said second conductive layer on an entire surface of said semiconductor substrate, after the step of exposing said first conductive layer.

4. The method according to claim 1, further comprising the steps of:

forming a second mask layer having a predetermined second pattern on said third conductive layer; and etching said third conductive layer, said third insulating layer, said second conductive layer and said first conductive layer using said second mask layer as a mask.

5. The method according to claim 4, wherein said first mask layer has a plurality of stripe-form first openings substantially in parallel with each other, and said second mask layer has a plurality of stripe-form second openings intersecting said plurality of first openings.

6. The method according to claim 4, wherein said step of forming said plurality of trenches includes a step of forming said plurality of trenches into stripe forms each having a first width, respectively, said step of removing parts of said second conductive layer located on said second insulating layer includes a step of forming a plurality of stripe-form isolation regions each having a second width to remove said parts of said second conductive layer on said second insulating layer, respectively, and said second width is smaller than said first width.

7. The method according to claim 1, wherein said second insulating layer is made of silicon oxide and said first mask layer is made of silicon nitride.

8. A method for manufacturing a non-volatile semiconductor memory device comprising the steps of:

forming a first conductive layer on a semiconductor substrate with a first insulating layer interposed therebetween;

forming a first mask layer having a predetermined first pattern on said first conductive layer;

forming a plurality of trenches in said substrate through said first conductive layer and said first insulating layer by etching with use of said first mask layer as a mask;

forming a second insulating layer in said plurality of trenches;

forming a second conductive layer on an upper surface of said first conductive layer and on an upper surface of said second insulating layer;

removing parts of said second conductive layer located on said second insulating layer to expose parts of said upper surface of said second insulating layer;

forming a third insulating layer on said second conductive layer and said second insulating layer exposed; and forming a third conductive layer on the third insulating layer.

forming a plurality of trenches in said substrate through said first conductive layer and said first insulating layer by etching with use of said first mask layer as a mask;

forming a second insulating layer in said plurality of trenches such that said insulating layer is formed up to an upper surface of said first conducting layer;

forming a second conductive layer on an upper surface of said first conductive layer and on an upper surface of said second insulating layer;

removing parts of said second conductive layer located on said second insulating layer to expose parts of said upper surface of said second insulating layer;

forming a third insulating layer on said second conductive layer and said second insulating layer exposed; and forming a third conductive layer on said third insulating layer.

9. The method according to claim 8, wherein said step of forming a second insulating layer in said plurality of trenches includes the steps of:

depositing said second insulating layer on an entire surface of said semiconductor substrate so as to fill said plurality of trenches with said second insulating layer; and forming a plurality of isolation regions made of said second insulating layer by etching back said second insulating layer to expose an upper surface of said first conductive layer.

10. The method according to claim 8, wherein said step of forming a second conductive layer on an upper surface of said first conductive layer and on an upper surface of said second insulating layer includes a step of forming said second conductive layer on an entire surface of said semiconductor substrate.

11. The method according to claim 8, further comprising the steps of:

forming a second mask layer having a predetermined second pattern on said third conductive layer; and etching said third conductive layer, said third insulating layer, said second conductive layer and said first conductive layer using said second mask layer as a mask.

12. The method according to claim 11, wherein said first mask layer has a plurality of stripe-form first openings substantially in parallel with each other, and said second mask layer has a plurality of stripe-form second openings intersecting said plurality of first openings.

13. The method according to claim 11, wherein said step of forming said plurality of trenches includes a step of forming said plurality of trenches into stripe forms each having a first width, respectively, said step of removing parts of said second conductive layer includes a step of forming a plurality of stripe-form openings each having a second width on said plurality of stripe-form isolation regions to remove said parts of said second conductive layer, respectively, and said second width is smaller than said first width.

14. The method according to claim 8, wherein said second insulating layer is made of silicon oxide and said first mask layer is made of silicon nitride.

15. A method for manufacturing a nonvolatile semiconductor memory device comprising the steps of:

forming a first conductive layer on a semiconductor substrate with a first gate insulating layer interposed therebetween;

forming a first mask layer having a predetermined first pattern on said first conductive layer;

forming two trenches adjacent to and spaced apart with each oter in said substrate through said first conductive layer and said first gate insulating layer by etching with use of said first mask layer as a mask;

forming a first insulating layer in said two trenches;

forming a second conductive layer on an upper surface of said first conductive layer and said second insulating layer;

making said second conductive layer to terminate on said two isolation regions by etching such that said second said conductive layer bridges said two isolation regions, respectively;

forming a second gate insulating layer on said semiconductor substrate, after the steo of making said second conductive layer to terminate; and forming a second conductive layer on said second gate insulating layer.

16. The method according to claim 15, wherein said step of forming a first insulating layer in said two trenches includes the steps of:

depositing said first insulating layer on an entire surface of said semiconductor substrate so as to fill said two trenches with said first insulating layer; and forming to isolation regions made of said first insulating layer by etching back said first insulating layer to expose an upper surface of said first conductive layer.

17. The method according to claim 15, further comprising the steps of:

forming a second mask layer having a predetermined second pattern on said third conductive layer; and etching said third conductive layer, said third insulating layer, said second conductive layer and said first conductive layer using said second mask layer as a mask.

18. The method according to claim 15, wherein said step of forming a first insulating layer in said two trenches includes a step of etching back said first insulating layer to an upper surface of said first mask layer, followed by etching said first mask layer without etching said first insulating layer.

19. The method according to claim 17, wherein said step of etching said third conductive layer, said third insulating layer, said second conductive layer and said first conductive layer using said second mask layer as a mask includes a step of exposing said second layer and said second gate insulating layer.

20. The method according to claim 18, after the step of exposing said second conductive layer, further comprising the steps of:

forming a second insulating layer on said semiconductor substrate;

selectively forming a contact hole in said second insulating layer to expose said second conductive layer; and forming a via conductor by embedding a forth conductive layer into said contact hole.

21. The method according to claim 15, wherein said first insulating layer is made of silicon oxide and said first mask layer is made of silicon nitride.

* * * * *

UNITED STATES PATENT AND TRADEMARK OFFICE
CERTIFICATE OF CORRECTION

PATENT NO. : 6,340,611
DATED : January 22, 2002
INVENTOR(S) : Kazuhiro Shimizu et al.

It is certified that error appears in the above-identified patent and that said Letters Patent is hereby corrected as shown below:

Title page,
Item [56], References Cited, OTHER PUBLICATIONS: "A/.67" has been replaced with -- A 0.67 --.

Column 36,
Line 20, "the" in between the words "on" and "third" has been replaced with -- said --.

Lines 22-37:
"forming a plurality of trenches in said substrate through said first conductive layer and said first insulating layer by etching with use of said first mask layer as a mask; forming a second insulating layer in said plurality of trenches such that said insulating layer is formed up to an upper surface of said first conducting layer; forming a second conductive layer on an upper surface of said first conductive layer and on an upper surface of said second insulating layer;
removing parts of said second conductive layer located on said second insulating layer to expose parts of said upper surface of said second insulating layer;
forming a third insulating layer on said second conductive layer and said second insulating layer exposed; and
forming a third conductive layer on said third insulating layer." has been deleted.

Column 37,
Line 32, "said" before the word "conductive" has been deleted.
Line 35, "steo" has been replaced with -- step --.
Line 37, "second" before the word "conductive" has been replaced with -- third --.

Column 38,
Line 4, "to" has been replaced with -- two --.

UNITED STATES PATENT AND TRADEMARK OFFICE
CERTIFICATE OF CORRECTION

PATENT NO. : 6,340,611
DATED : January 22, 2002
INVENTOR(S) : Kazuhiro Shimizu et al.

It is certified that error appears in the above-identified patent and that said Letters Patent is hereby corrected as shown below:

<u>Column 38, cont'd,</u>
Lines 21-26, claim 19 has been deleted:

19. The method according to claim 17, wherein said step of etching said third conductive layer, said third insulating layer, said second conductive layer and said first conductive layer using said second mask layer as a mask includes a step of exposing said second layer and said second gate insulating layer."

Signed and Sealed this

Seventh Day of May, 2002

Attest:

Attesting Officer

JAMES E. ROGAN
Director of the United States Patent and Trademark Office